United States Patent
Kim et al.

(10) Patent No.: US 12,002,816 B2
(45) Date of Patent: Jun. 4, 2024

(54) DISPLAY DEVICE AND TILED DISPLAY DEVICE INCLUDING THE SAME

(71) Applicant: Samsung Display Co., Ltd., Yongin-Si (KR)

(72) Inventors: Ji Hyun Kim, Hwaseong-si (KR); Tae Wook Kang, Seongnam-si (KR); Chul Min Bae, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 273 days.

(21) Appl. No.: 17/389,109

(22) Filed: Jul. 29, 2021

(65) Prior Publication Data

US 2022/0052078 A1 Feb. 17, 2022

(30) Foreign Application Priority Data

Aug. 12, 2020 (KR) .................. 10-2020-0101155

(51) Int. Cl.
*H01L 27/12* (2006.01)
*H01L 25/16* (2023.01)
*H10K 59/131* (2023.01)
*H10K 59/18* (2023.01)

(52) U.S. Cl.
CPC .......... *H01L 27/124* (2013.01); *H01L 25/162* (2013.01); *H01L 25/167* (2013.01); *H01L 27/1262* (2013.01); *H10K 59/131* (2023.02); *H10K 59/18* (2023.02)

(58) Field of Classification Search
CPC . H01L 27/124; H01L 27/1218; H10K 59/131; H10K 59/18
See application file for complete search history.

(56) References Cited

U.S. PATENT DOCUMENTS

| 5,302,468 | A | * | 4/1994 | Namiki ................. H10K 59/18 428/690 |
| 10,573,632 | B2 | | 2/2020 | Yeon et al. |
| 2013/0342779 | A1 | * | 12/2013 | Jung ................. G02F 1/136286 349/43 |

(Continued)

FOREIGN PATENT DOCUMENTS

| CN | 110998847 A | 4/2020 |
| CN | 110047899 B | 10/2021 |

(Continued)

OTHER PUBLICATIONS

Extended European Search Report, Application No. 21190381.0, dated Jan. 18, 2022, 8 pages.

*Primary Examiner* — Peter M Albrecht
(74) *Attorney, Agent, or Firm* — Innovation Counsel LLP

(57) ABSTRACT

Provided is a display device. The display device comprises a first substrate, wherein a first contact hole is defined in the first substrate, a barrier layer on the first substrate, wherein a second contact hole is defined in the barrier layer and connected to the first contact hole, a first connection line on the barrier layer and inserted into the second contact hole, a second substrate covering the first connection line and the barrier layer, and a thin-film transistor layer on the second substrate and including at least one thin-film transistor. The thin-film transistor layer further includes a second connection line connected between the first connection line and the at least one thin-film transistor.

24 Claims, 41 Drawing Sheets

(56) References Cited

U.S. PATENT DOCUMENTS

| | | | |
|---|---|---|---|
| 2018/0012949 A1* | 1/2018 | Takeya | H01L 25/167 |
| 2018/0138260 A1 | 5/2018 | Kajiyama | |
| 2019/0371779 A1 | 12/2019 | Yeon et al. | |
| 2020/0194417 A1 | 6/2020 | Yeon et al. | |
| 2021/0118968 A1* | 4/2021 | Lee | H01L 27/124 |
| 2021/0265453 A1 | 8/2021 | Wang et al. | |

FOREIGN PATENT DOCUMENTS

| | | |
|---|---|---|
| JP | 2018-081197 A | 5/2018 |
| KR | 10-2017-0130286 A | 11/2017 |
| KR | 10-2019-0048642 A | 5/2019 |

\* cited by examiner

DISPLAY DEVICE AND TILED DISPLAY DEVICE INCLUDING THE SAME

CROSS-REFERENCE TO RELATED APPLICATION

This application claims the benefit of Korean Patent Application No. 10-2020-0101155 filed on Aug. 12, 2020, in the Korean Intellectual Property Office, the disclosure of which is incorporated herein by reference in its entirety.

BACKGROUND

1. Field

The present disclosure relates to a display device and a tiled display device including the same. More particularly, the present disclosure relates to a tiled display device to improve the degree of immersion in images by preventing a boundary part or a non-display area disposed between the display devices from being recognized.

2. Description of the Related Art

As the information society develops, the demand for display devices for displaying various types of images is increasing in various forms. For example, display devices are being applied to various electronic devices such as smartphones, digital cameras, notebook computers, navigation devices, and smart televisions. The display devices may be flat panel display devices such as liquid crystal display devices, field emission display devices, and organic light emitting display devices. Of the flat panel display devices, a light emitting display device includes a light emitting element that enables each pixel of a display panel to emit light by itself. Thus, the light emitting display device can display an image without a backlight unit that provides light to the display panel.

When a display device is manufactured to have a large size, a defect rate of light emitting elements may increase due to an increase in the number of pixels, and productivity or reliability may be reduced. To solve these problems, a tiled display device may be implemented to provide a large screen by connecting a plurality of relatively small display devices. The tiled display device may include a boundary part called a seam between the display devices due to a non-display area or a bezel area of each of the display devices adjacent to each other. When one image is displayed on the entire screen, the boundary part between the display devices gives a sense of separation to the entire screen, thereby reducing the degree of immersion in the image.

SUMMARY

Aspects of the present disclosure provide a tiled display device which can eliminate a sense of separation between a plurality of display devices and improve the degree of immersion in images by preventing a boundary part or a non-display area disposed between the display devices from being recognized.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment of the present disclosure, a display device comprises: a first substrate comprising a first contact hole, a barrier layer on the first substrate and comprising a second contact hole connected to the first contact hole, a first connection line on the barrier layer and inserted into the second contact hole, a second substrate covering the first connection line and the barrier layer, and a thin-film transistor layer on the second substrate and comprising at least one thin-film transistor. The thin-film transistor layer further comprises a second connection line connected between the first connection line and the at least one thin-film transistor.

The thin-film transistor layer may further comprise: a gate insulating layer on the second substrate, and an interlayer insulating film on the gate insulating layer. The second connection line may be disposed on the interlayer insulating film and may be connected to the first connection line through a third contact hole passing through the interlayer insulating film, the gate insulating layer, and the second substrate.

The first and second substrates may comprise polyimide, and the barrier layer may comprise an inorganic material.

The display device may further comprise: a pad part on a lower surface of the first substrate and connected to the first connection line through the first contact hole, a flexible film on the lower surface of the first substrate and connected to the pad part, and a source driver on the flexible film and supplying a source voltage to the first connection line.

Each of the first and second substrates may comprise a plurality of light emitting areas and a plurality of light blocking areas surrounding the light emitting areas. The display device may further comprise: a light emitting element layer on the thin-film transistor layer and comprising a light emitting element connected to the at least one thin-film transistor, a wavelength conversion layer on the light emitting element layer and comprising wavelength converting parts corresponding to some of the light emitting areas and light transmitting parts corresponding to the other ones of the light emitting areas, and a color filter layer on the wavelength conversion layer and comprising a plurality of color filters corresponding to the light emitting areas, respectively.

According to an embodiment of the present disclosure, a display device comprises: a barrier layer comprising a first contact hole and made of an inorganic material, a first connection line on the barrier layer and inserted into the first contact hole, a substrate covering the first connection line and the barrier layer, and a thin-film transistor layer on the substrate and comprising at least one thin-film transistor. The thin-film transistor layer further comprises a second connection line connected between the first connection line and the at least one thin-film transistor.

The thin-film transistor layer may further comprise: a gate insulating layer on the substrate, and an interlayer insulating film on the gate insulating layer. The second connection line may be disposed on the interlayer insulating film and may be connected to the first connection line through a second contact hole passing through the interlayer insulating film, the gate insulating layer, and the substrate.

According to an embodiment of the present disclosure, a display device comprises: a first substrate comprising a first contact hole provided in one surface thereof, a barrier layer on the one surface of the first substrate and through which the first contact hole passes, a first connection line on a surface of the barrier layer and connected to a pad part on the other surface opposite the one surface of the first substrate, a second substrate covering the first connection line and the barrier layer, and a thin-film transistor layer on a surface of the second substrate and comprising at least one thin-film transistor. The thin-film transistor layer may further comprise a second connection line connected between the first connection line and the at least one thin-film transistor.

The thin-film transistor layer may further comprise: a gate insulating layer on the surface of the second substrate, and an interlayer insulating film on a surface of the gate insulating layer. The second connection line may be disposed on a surface of the interlayer insulating film and may be connected to the first connection line through a second contact hole passing through the interlayer insulating film, the gate insulating layer, and the second substrate.

The first substrate may further comprise a third contact hole provided in the other surface of the first substrate and connected to the first contact hole, and the pad part may be connected to the first connection line through the third contact hole.

The first connection line may be exposed on the other surface of the first substrate through the first contact hole and may be connected to the pad part.

According to an embodiment of the present disclosure, a display device comprises: a first substrate comprising a first contact hole, a first barrier layer on the first substrate and comprising a second contact hole connected to the first contact hole, a first connection line on the first barrier layer and inserted into the second contact hole, a second barrier layer covering the first connection line and the first barrier layer, and a thin-film transistor layer on the second barrier layer and comprising at least one thin-film transistor. The thin-film transistor layer may further comprise a second connection line connected between the first connection line and the at least one thin-film transistor.

The thin-film transistor layer may further comprise: a gate insulating layer on the second barrier layer, and an interlayer insulating film on the gate insulating layer. The second connection line may be disposed on the interlayer insulating film and may be connected to the first connection line through a third contact hole passing through the interlayer insulating film, the gate insulating layer, and the second barrier layer.

The first substrate may comprise polyimide, and the first and second barrier layers may comprise an inorganic material.

The display device may further comprise: a pad part on a lower surface of the first substrate and connected to the first connection line through the first contact hole, a flexible film on the lower surface of the first substrate and connected to the pad part, and a source driver on the flexible film and supplying a source voltage to the first connection line.

According to an embodiment of the present disclosure, a display device comprises: a first barrier layer comprising a first contact hole and made of an inorganic material, a first connection line on the first barrier layer and inserted into the first contact hole, a second barrier layer covering the first connection line and the first barrier layer, and a thin-film transistor layer on the second barrier layer and comprising at least one thin-film transistor. The thin-film transistor layer may further comprise a second connection line connected between the first connection line and the at least one thin-film transistor.

The thin-film transistor layer may further comprise: a gate insulating layer on the second barrier layer, and an interlayer insulating film on the gate insulating layer. The second connection line may be disposed on the interlayer insulating film and may be connected to the first connection line through a second contact hole passing through the interlayer insulating film, the gate insulating layer, and the second barrier layer.

According to an embodiment of the present disclosure, a display device comprises: a first substrate comprising a first contact hole, a first connection line on the first substrate, a barrier layer covering the first connection line and the first substrate, a second substrate on the barrier layer and planarizing the top of the barrier layer, and a thin-film transistor layer on the second substrate and comprising at least one thin-film transistor. The thin-film transistor layer may further comprise a second connection line connected between the first connection line and the at least one thin-film transistor.

The thin-film transistor layer may further comprise: a gate insulating layer on the second substrate, and an interlayer insulating film on the gate insulating layer. The second connection line may be disposed on the interlayer insulating film and may be connected to the first connection line through a second contact hole passing through the interlayer insulating film, the gate insulating layer, the second substrate, and the barrier layer.

The display device may further comprise: a pad part on a lower surface of the first substrate and connected to the first connection line through the first contact hole, a flexible film on the lower surface of the first substrate and connected to the pad part, and a source driver on the flexible film and supplying a source voltage to the first connection line.

According to an embodiment of the present disclosure, a display device comprises: a first substrate comprising a first contact hole, a first barrier layer on the first substrate and comprising a second contact hole connected to the first contact hole, a first connection line on the first barrier layer and inserted into the second contact hole, a second barrier layer covering the first connection line and the first barrier layer, a second substrate on the second barrier layer and planarizing the top of the second barrier layer, and a thin-film transistor layer on the second substrate and comprising at least one thin-film transistor. The thin-film transistor layer may further comprise a second connection line connected between the first connection line and the at least one thin-film transistor.

The thin-film transistor layer may further comprise: a gate insulating layer on the second substrate, and an interlayer insulating film on the gate insulating layer. The second connection line may be disposed on the interlayer insulating film and may be connected to the first connection line through a third contact hole passing through the interlayer insulating film, the gate insulating layer, the second substrate, and the second barrier layer.

The display device may further comprise: a pad part on a lower surface of the first substrate and connected to the first connection line through the first contact hole, a flexible film on the lower surface of the first substrate and connected to the pad part, and a source driver on the flexible film and supplying a source voltage to the first connection line.

According to an embodiment of the present disclosure, a tiled display device comprises: a plurality of display devices, each comprising a display area having a plurality of pixels and a non-display area surrounding the display area, and a coupling member coupling the display devices together. Each of the display devices comprises: a first substrate comprising a first contact hole, a barrier layer on the first substrate and comprising a second contact hole connected to the first contact hole, a first connection line on the barrier layer and inserted into the second contact hole, a second substrate covering the first connection line and the barrier layer, and a thin-film transistor layer on the second substrate and comprising at least one thin-film transistor. The thin-film transistor layer may further comprise a second connection line connected between the first connection line and the at least one thin-film transistor.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
FIG. 1 is a plan view of a tiled display device according to an embodiment.

In the following description, for the purposes of explanation, numerous specific details are set forth in order to provide a thorough understanding of various embodiments or implementations of the present disclosure. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a tiled display device TD according to an embodiment.

Referring to FIG. 1, the tiled display device TD may include a plurality of display devices 10. The display devices 10 may be arranged in a lattice shape, but the present disclosure is not limited thereto. The display devices 10 may be connected to each other in a first direction (X-axis direction) and a second direction (Y-axis direction), and the tiled display device TD may have a specific shape. For example, the display devices 10 may have the same size, but the present disclosure is not limited thereto. For another example, the display devices 10 may have different sizes.

Each of the display devices 10 may be shaped like a rectangle including long sides and short sides. The long sides or short sides of the display devices 10 may be connected to each other. Some of the display devices 10 may be disposed at an edge of the tiled display device TD to form a side of the tiled display device TD. Some other ones of the display devices 10 may be disposed at corners of the tiled display device TD and may form two adjacent sides of the tiled display device TD. The other ones of the display devices 10 may be disposed inside the tiled display device TD and surrounded by other display devices 10.

Each of the display devices 10 may include a display area DA and a non-display area NDA. The display area DA may include a plurality of pixels to display an image. The non-display area NDA may be disposed around the display area DA to surround the display area DA and may not display an image.

The overall shape of the tiled display device TD may be a planar shape, but the present disclosure is not limited thereto. The tiled display device TD may also have a three-dimensional (3D) shape to provide a 3D effect to a user. For example, when the tiled display device TD has a 3D shape, at least some of the display devices 10 may have a curved shape. For another example, the display devices 10 may each have a planar shape but may be connected to each other at a predetermined angle so that the tiled display device TD can have a 3D shape.

The tiled display device TD may be formed by connecting each of the non-display areas NDA of adjacent display devices 10. The display devices 10 may be connected to each other through a coupling member or an adhesive member. Therefore, the non-display area NDA between the display devices 10 may be surrounded by adjacent display areas DA.

A distance between the respective display areas DA of the display devices 10 may be small enough to make the non-display area NDA between the display devices 10 or a boundary part between the display devices 10 unrecognizable by a user. In addition, external light reflectance of the display area DA of each of the display devices 10 and external light reflectance of the non-display area NDA between the display devices 10 may be substantially equal. Therefore, the tiled display device TD may eliminate a sense of separation between the display devices 10 and improve the degree of immersion in images by preventing the non-display area NDA or the boundary part between the display devices 10 from being recognized.

Figure 2:
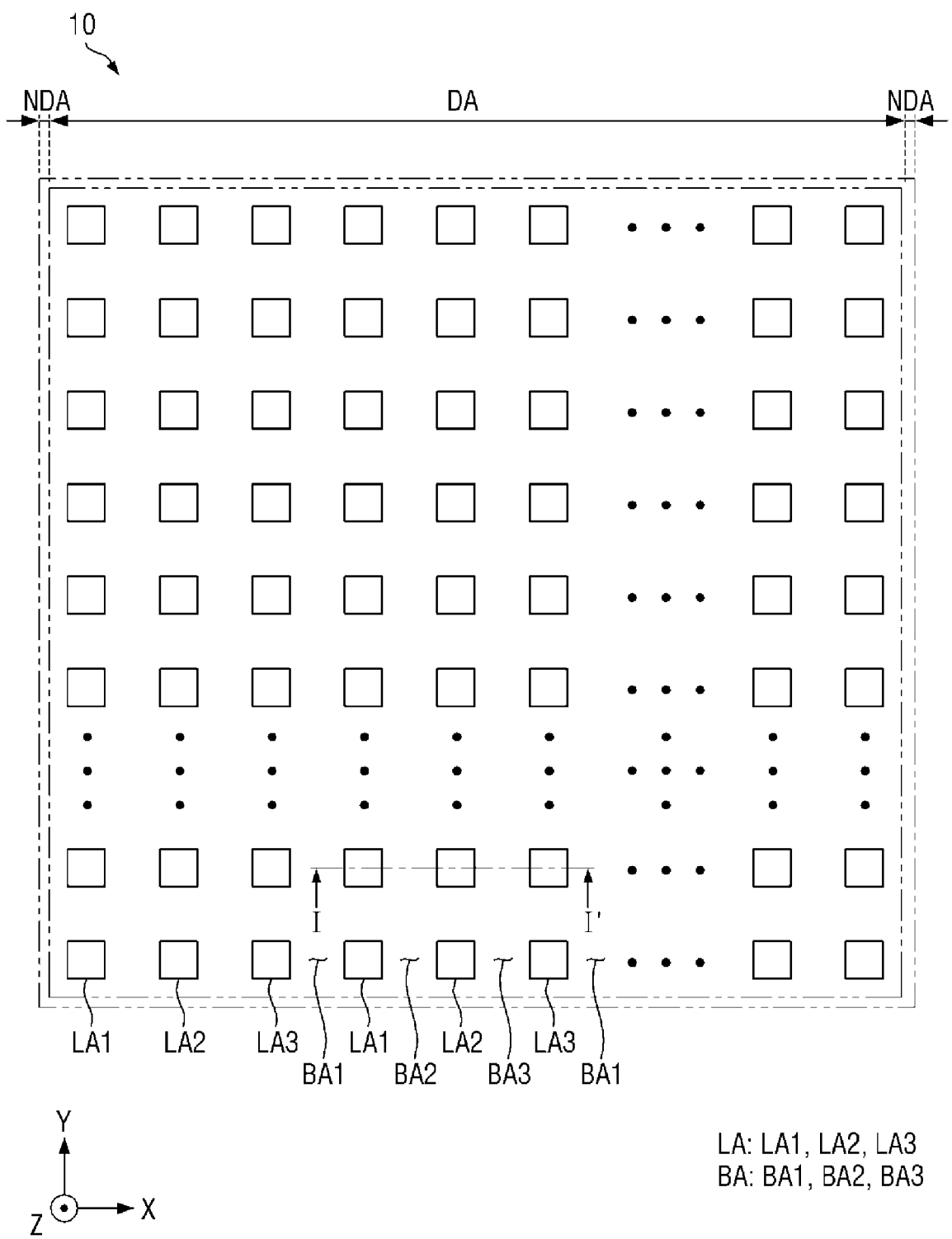
FIG. 2 is a plan view of a display device according to an embodiment.

FIG. 2 is a plan view of a display device 10 according to an embodiment.

Referring to FIG. 2, the display device 10 may include a plurality of pixels arranged along a plurality of rows and a plurality of columns in the display area DA. Each of the pixels may include a light emitting area LA defined by a pixel defining layer or a bank and may emit light having a predetermined peak wavelength through the light emitting area LA. For example, the display area DA of the display device 10 may include first through third light emitting areas LA1 through LA3. Each of the first through third light emitting areas LA1, LA2, and LA3 may be an area where light generated by a light emitting element of the display device 10 is emitted to the outside of the display device 10.

Each of the first through third light emitting areas LA1, LA2, and LA3 may emit light having a predetermined peak wavelength to the outside of the display device 10. The first light emitting area LA1 may emit light of a first color, the second light emitting area LA2 may emit light of a second color, and the third light emitting area LA3 may emit light of a third color. For example, the light of the first color may be red light having a peak wavelength of 610 to 650 nm, the light of the second color may be green light having a peak wavelength of 510 to 550 nm, and the light of the third color may be blue light having a peak wavelength of 440 to 480 nm. However, the present disclosure is not limited thereto.

The first through third light emitting areas LA1, LA2, and LA3 may be sequentially and repeatedly arranged along the first direction (X-axis direction) of the display area DA. For example, the area of the first light emitting area LA1, the area of the second light emitting area LA2, and the area of the third light emitting area LA3 may be substantially equal. For another example, the area of the first light emitting area LA1 may be larger than the area of the second light emitting area LA2, and the area of the second light emitting area LA2 may be larger than the area of the third light emitting area LA3.

The display area DA of the display device 10 may include a plurality of light blocking areas BA surrounding the light emitting areas LA. For example, the display area DA may include first through third light blocking areas BA1, BA2, and BA3. The first through third light blocking areas BA1, BA2, and BA3 may be disposed on each side of the first through third light emitting areas LA1, LA2, and LA3, respectively, and may prevent color mixing of light emitted from the first through third light emitting areas LA1, LA2, and LA3. In this example, each of the light blocking areas BA1, BA2, and BA3 are substantially equal. However, in another example, the first light blocking area BA1 may be larger than the second light blocking area BA2 and the third light blocking area BA3, and the second light blocking area BA2 is larger than the third light blocking area BA3.

Figure 3:
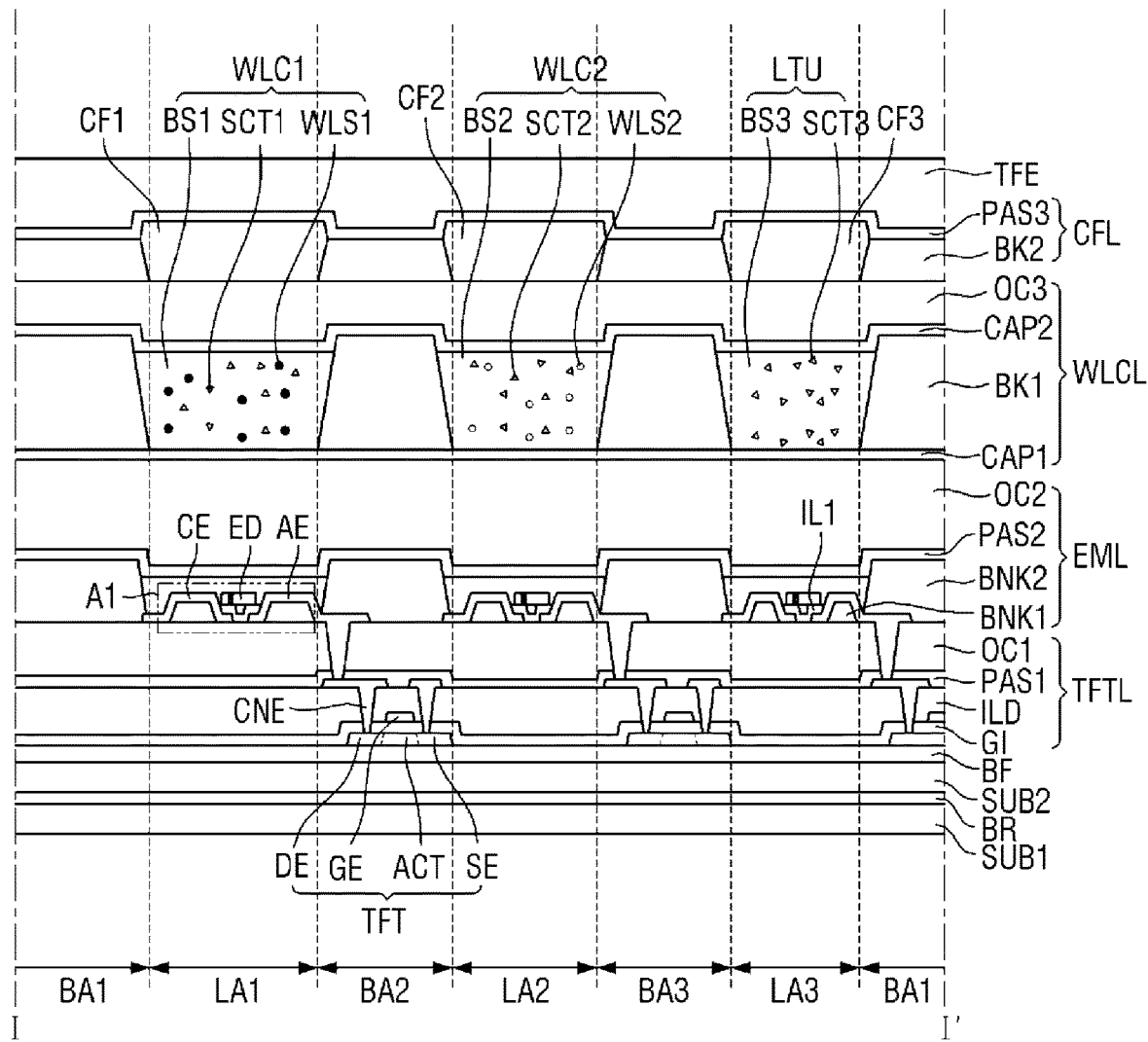
FIG. 3 is a cross-sectional view taken along line I-I' of FIG. 2.

FIG. 3 is a cross-sectional view taken along line I-I' of FIG. 2.

Referring to FIG. 3, the display area DA of the display device 10 may include the first through third light emitting areas LA1, LA2, and LA3. Each of the first through third light emitting areas LA1, LA2, and LA3 may be an area where light generated by a light emitting diode ED of the display device 10 is emitted to the outside of the display device 10.

The display device 10 may include a first substrate SUB1, a barrier layer BR, a second substrate SUB2, a buffer layer BF, a thin-film transistor layer TFTL, a light emitting element layer EML, a wavelength conversion layer WLCL, a color filter layer CFL, and an encapsulation layer TFE.

The first substrate SUB1 may be a base substrate or a base member and may be made of an insulating material such as polymer resin. For example, the first substrate SUB1 may be a flexible substrate that can be bent, folded, rolled, etc. The first substrate SUB1 may include, but is not limited to, polyimide (PI).

The barrier layer BR may be disposed on the first substrate SUB1. The barrier layer BR may include an inorganic material that can prevent penetration of air or moisture. For example, the barrier layer BR may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The second substrate SUB2 may be disposed on the barrier layer BR. The second substrate SUB2 may be a base substrate or a base member and may be made of an insulating material such as polymer resin. For example, the second substrate SUB2 may be a flexible substrate that can be bent, folded, rolled, etc. The second substrate SUB2 may include, but is not limited to, polyimide (PI).

The buffer layer BF may be disposed on the second substrate SUB2. The buffer layer BF may include an inorganic material that can prevent penetration of air or moisture. For example, the buffer layer BF may include a plurality of inorganic layers stacked alternately.

The thin-film transistor layer TFTL may include a plurality of thin-film transistors TFT, a gate insulating layer GI, an interlayer insulating film ILD, connection electrodes CNE, a first passivation layer PAS1, and a first planarization layer OC1.

The thin-film transistors TFT may be disposed on the buffer layer BF and may form respective pixel circuits of a plurality of pixels. For example, the thin-film transistors TFT may be driving transistors or switching transistors of the pixel circuits. Each of the thin-film transistors TFT may include a semiconductor region ACT, a gate electrode GE, a source electrode SE, and a drain electrode DE.

The semiconductor region ACT, the source electrode SE, and the drain electrode DE may be disposed on the buffer layer BF. The semiconductor region ACT may be overlapped by the gate electrode GE in a thickness direction and insulated from the gate electrode GE by the gate insulating layer GI. The source electrode SE and the drain electrode DE may be formed by making the material of the semiconductor region ACT conductive.

The gate electrode GE may be disposed on the gate insulating layer GI. The gate electrode GE may overlap the semiconductor region ACT with the gate insulating layer GI interposed between them.

The gate insulating layer GI may be provided on the semiconductor regions ACT, the source electrodes SE, and the drain electrodes DE. For example, the gate insulating layer GI may cover the semiconductor regions ACT, the source electrodes SE, the drain electrodes DE and the buffer layer BF and insulate the semiconductor regions ACT from the gate electrodes GE. The gate insulating layer GI may include contact holes through which the connection electrodes CNE pass.

The interlayer insulating film ILD may be disposed on the gate electrodes GE. For example, the interlayer insulating film ILD may include contact holes through which the connection electrodes CNE pass. Here, the contact holes of the interlayer insulating film ILD may be connected to the contact holes of the gate insulating layer GI.

The connection electrodes CNE may be disposed on the interlayer insulating film ILD. The connection electrodes CNE may connect the drain electrodes DE of the thin-film transistors TFT to first electrodes AE of light emitting elements EL. The connection electrodes CNE may contact the drain electrodes DE through the contact holes provided in the gate insulating layer GI and the interlayer insulating film ILD.

The first passivation layer PAS1 may be provided on the connection electrodes CNE to protect the thin-film transistors TFT. For example, the first passivation layer PAS1 may include contact holes through which the first electrodes AE of the light emitting elements EL pass.

The first planarization layer OC1 may be provided on the first passivation layer PAS1 to planarize the top of the thin-film transistor layer TFTL. For example, the first planarization layer OC1 may include contact holes through which the first electrodes AE of the light emitting elements EL pass. Here, the contact holes of the first planarization layer OC1 may be connected to the contact holes of the first passivation layer PAS1. The first planarization layer OC1 may include an organic material.

The light emitting element layer EML may include the light emitting elements EL, first banks BNK1, a second bank BNK2, a second passivation layer PAS2, and a second planarization layer OC2.

The light emitting elements EL may be provided on the thin-film transistors TFT. Each of the light emitting elements EL may include the first electrode AE, a second electrode CE, and the light emitting diode ED.

The first electrode AE may be provided on the first planarization layer OC1. For example, the first electrode AE may be disposed on a first bank BNK1 disposed on the first planarization layer OC1 to cover the first bank BNK1. The first electrode AE may overlap one of the first through third light emitting areas LA1 through LA3 defined by the second bank BNK2. In addition, the first electrode AE may be connected to the drain electrode DE of each thin-film transistor TFT. The first electrode AE may be, but is not limited to, an anode of each light emitting element EL.

The second electrode CE may be disposed on the first planarization layer OC1 and spaced apart from the first electrode AE. For example, the second electrode CE may be disposed on a first bank BNK1 disposed on the first planarization layer OC1 to cover the first bank BNK1. The second electrode CE may overlap one of the first through third light emitting areas LA1, LA2, and LA3 defined by the second bank BNK2. For example, the second electrode CE may receive a common voltage supplied to all pixels. The second electrode CE may be, but is not limited to, a cathode of each light emitting element EL.

A first insulating layer IL1 may cover a part of the first electrode AE and a part of the second electrode CE which are adjacent to each other and may insulate the first electrode AE and the second electrode CE from each other.

The light emitting diode ED may be disposed on the first planarization layer OC1 between the first electrode AE and the second electrode CE. The light emitting diode ED may be disposed on the first insulating layer ILL One end of the light emitting diode ED may be connected to the first electrode AE, and the other end of the light emitting diode ED may be connected to the second electrode CE. For example, a plurality of light emitting diodes ED may include active layers having the same material to emit light of the same wavelength band or light of the same color. Light emitted from the first through third light emitting areas LA1, LA2, and LA3 may have the same color. For example, the light emitting diodes ED may emit light of the third color or blue light having a peak wavelength of 440 to 480 nm. Therefore, the light emitting element layer EML may emit light of the third color or blue light.

The second bank BNK2 may be disposed on the first planarization layer OC1 to define the first through third light emitting areas LA1, LA2, and LA3. For example, the second bank BNK2 may surround each of the first through third light emitting areas LA1, LA2, and LA3, but the present disclosure is not limited thereto. The second bank BNK2 may separate and insulate the respective first electrodes AE or second electrodes CE of the light emitting elements EL. The second bank BNK2 may be disposed in the first through third light blocking areas BA1, BA2, and BA3.

The second passivation layer PAS2 may be disposed on the light emitting elements EL and the second bank BNK2. The second passivation layer PAS2 may cover the light emitting elements EL and protect the light emitting elements EL. The second passivation layer PAS2 may prevent damage to the light emitting elements EL by preventing penetration of impurities such as moisture or air from the outside.

The second planarization layer OC2 may be provided on the second passivation layer PAS2 to planarize the top of the light emitting element layer EML. For example, the second planarization layer OC2 may include an organic material.

The wavelength conversion layer WLCL may include a first capping layer CAP1, a first light blocking member BK1, a first wavelength converting part WLC1, a second wavelength converting part WLC2, a light transmitting part LTU, a second capping layer CAP2, and a third planarization layer OC3.

The first capping layer CAP1 may be disposed on the second planarization layer OC2 of the light emitting element layer EML. The first capping layer CAP1 may seal lower surfaces of the first and second wavelength converting parts WLC1 and WLC2 and the light transmitting part LTU. For example, the first capping layer CAP1 may include an inorganic material.

The first light blocking member BK1 may be disposed on the first capping layer CAP1 in the first through third light blocking areas BA1, BA2, and BA3. The first light blocking member BK1 may overlap the second bank BNK2 in the thickness direction. The first light blocking member BK1 may block transmission of light. The first light blocking member BK1 may prevent color mixing by preventing intrusion of light between the first through third light emitting areas LA1, LA2, and LA3, thereby improving a color gamut of the display device 10. The first light blocking member BK1 may be disposed in a lattice shape surrounding the first through third light emitting areas LA1, LA2, and LA3 in plan view.

The first light blocking member BK1 may include an organic light blocking material and a liquid repellent component. For example, the first light blocking member BK1 may be made of a black organic material including a liquid repellent component. The first light blocking member BK1 may be formed by coating and exposing an organic light blocking material including a liquid repellent component.

The first wavelength converting part WLC1 may be disposed on the first capping layer CAP1 in the first light emitting area LA1. The first wavelength converting part WLC1 may be surrounded by the first light blocking member BK1. The first wavelength converting part WLC1 may include a first base resin BS1, first scatterers SCT1, and first wavelength shifters WLS1.

The first base resin BS1 may include a material having a relatively high light transmittance. The first base resin BS1 may be made of a transparent organic material. For example, the first base resin BS1 may include at least one of organic materials such as epoxy resin, acrylic resin, cardo resin, and imide resin.

The first scatterers SCT1 may have a refractive index different from that of the first base resin BS1 and may form an optical interface with the first base resin BS1. For example, the first scatterers SCT1 may include a light scattering material or light scattering particles that scatter at least a part of transmitted light. For example, the first scatterers SCT1 may include metal oxide such as titanium oxide ($TiO_2$), zirconium oxide ($ZrO_2$), aluminum oxide ($Al_2O_3$), indium oxide ($In_2O_3$), zinc oxide (ZnO) or tin oxide ($SnO_2$) or may include organic particles such as acrylic resin or urethane resin. The first scatterers SCT1 may scatter incident light in random directions regardless of an incident direction of the incident light without substantially converting a peak wavelength of the incident light.

The first wavelength shifters WLS1 may convert or shift a peak wavelength of incident light into a first peak wavelength. For example, the first wavelength shifters WLS1 may convert blue light provided by the display device 10 into red light having a single peak wavelength of 610 to 650 nm and emit red light. The first wavelength shifters WLS1 may be quantum dots, quantum rods, or phosphors. The quantum dots may be particulate materials that emit light of a specific color when electrons transition from a conduction band to a valence band.

A part of blue light provided by the light emitting element layer EML may be transmitted through the first wavelength converting part WLC1 without being converted into red light by the first wavelength shifters WLS1. Of the blue light provided by the light emitting element layer EML, light incident on a first color filter CF1 without being converted by the first wavelength converting part WLC1 may be blocked by the first color filter CF1. In addition, red light into which the blue light provided by the light emitting element layer EML has been converted by the first wavelength converting part WLC1 may be emitted to the outside through the first color filter CF1. Therefore, the first light emitting area LA1 may emit red light.

The second wavelength converting part WLC2 may be disposed on the first capping layer CAP1 in the second light emitting area LA2. The second wavelength converting part WLC2 may be surrounded by the first light blocking member BK1. The second wavelength converting part WLC2 may include a second base resin BS2, second scatterers SCT2, and second wavelength shifters WLS2.

The second base resin BS2 may include a material having a relatively high light transmittance. The second base resin BS2 may be made of a transparent organic material. For example, the second base resin BS2 may be made of the same material as the first base resin BS1 or may be formed using the materials exemplified in the description of the first base resin BS1.

The second scatterers SCT2 may have a refractive index different from that of the second base resin BS2 and may form an optical interface with the second base resin BS2. For example, the second scatterers SCT2 may include a light scattering material or light scattering particles that scatter at least a part of transmitted light. For example, the second scatterers SCT2 may be made of the same material as the first scatterers SCT1 or may be formed using the materials exemplified in the description of the first scatterers SCT1. The second scatterers SCT2 may scatter incident light in random directions regardless of an incident direction of the incident light without substantially converting a peak wavelength of the incident light.

The second wavelength shifters WLS2 may convert or shift a peak wavelength of incident light into a second peak wavelength different from the first peak wavelength of the first wavelength shifters WLS1. For example, the second wavelength shifters WLS2 may convert blue light provided by the display device 10 into green light having a single peak wavelength of 510 to 550 nm and emit green light. The second wavelength shifters WLS2 may be quantum dots, quantum rods, or phosphors. The second wavelength shifters WLS2 may include a material having the same purpose as the materials exemplified in the description of the first wavelength shifters WLS1. The second wavelength shifters WLS2 may be made of quantum dots, quantum rods, or phosphors such that their wavelength conversion range is different from the wavelength conversion range of the first wavelength shifters WLS1.

The light transmitting part LTU may be disposed on the first capping layer CAP1 in the third light emitting area LA3. The light transmitting part LTU may be surrounded by the first light blocking member BK1. The light transmitting part LTU may transmit incident light while maintaining a peak wavelength of the incident light. The light transmitting part LTU may include a third base resin BS3 and third scatterers SCT3.

The third base resin BS3 may include a material having a relatively high light transmittance. The third base resin BS3 may be made of a transparent organic material. For example, the third base resin BS3 may be made of the same material as the first or second base resin BS1 or BS2 or may be formed using the materials exemplified in the description of the first or second base resin BS1 or BS2.

The third scatterers SCT3 may have a refractive index different from that of the third base resin BS3 and may form an optical interface with the third base resin BS3. For example, the third scatterers SCT3 may include a light scattering material or light scattering particles that scatter at least a part of transmitted light. For example, the third scatterers SCT3 may be made of the same material as the first or second scatterers SCT1 or SCT2 or may be formed using the materials exemplified in the description of the first or second scatterers SCT1 or SCT2. The third scatterer SCT3 may scatter incident light in random directions regardless of an incident direction of the incident light without substantially converting a peak wavelength of the incident light.

Since the wavelength conversion layer WLCL is directly disposed on the second planarization layer OC2 of the light emitting element layer EML, the display device 10 may not require a separate substrate for the first and second wavelength converting parts WLC1 and WLC2 and the light transmitting part LTU. Therefore, the first and second wavelength converting parts WLC1 and WLC2 and the light transmitting part LTU can be easily aligned in the first through third light emitting areas LA1 through LA3, respectively, and the thickness of the display device 10 can be relatively reduced.

The second capping layer CAP2 may cover the first and second wavelength converting parts WLC1 and WLC2, the light transmitting part LTU, and the first light blocking member BK1. For example, the second capping layer CAP2 may prevent damage to or contamination of the first and second wavelength converting parts WLC1 and WLC2 and the light transmitting part LTU by sealing the first and second wavelength converting parts WLC1 and WLC2 and the light transmitting part LTU. For example, the second capping layer CAP2 may include an inorganic material.

The third planarization layer OC3 may be disposed on the second capping layer CAP2 to planarize the tops of the first and second wavelength converting parts WLC1 and WLC2 and the light transmitting part LTU. For example, the third planarization layer OC3 may include an organic material.

The color filter layer CFL may include a second light blocking member BK2, first through third color filters CF1, CF2, and CF3, and a third passivation layer PAS3.

The second light blocking member BK2 may be disposed on the third planarization layer OC3 of the wavelength conversion layer WLCL in the first through third light blocking areas BA1, BA2, and BA3. The second light blocking member BK2 may overlap the first light blocking member BK1 or the second bank BNK2 in the thickness direction. The second light blocking member BK2 may block transmission of light. The second light blocking member BK2 may prevent color mixing by preventing intrusion of light between the first through third light emitting areas LA1, LA2, and LA3, thereby improving the color gamut of the display device 10. The second light blocking member BK2 may be disposed in a lattice shape surrounding the first through third light emitting areas LA1, LA2, and LA3 in plan view.

The first color filter CF1 may be disposed on the third planarization layer OC3 in the first light emitting area LA1. The first color filter CF1 may be surrounded by the second light blocking member BK2. The first color filter CF1 may overlap the first wavelength converting part WLC1 in the thickness direction. The first color filter CF1 may selectively transmit light of the first color (e.g., red light) and block or absorb light of the second color (e.g., green light) and light of the third color (e.g., blue light). For example, the first color filter CF1 may be a red color filter and may include a red colorant.

The second color filter CF2 may be disposed on the third planarization layer OC3 in the second light emitting area LA2. The second color filter CF2 may be surrounded by the second light blocking member BK2. The second color filter CF2 may overlap the second wavelength converting part WLC2 in the thickness direction. The second color filter CF2 may selectively transmit light of the second color (e.g., green light) and block or absorb light of the first color (e.g., red light) and light of the third color (e.g., blue light). For example, the second color filter CF2 may be a green color filter and may include a green colorant.

The third color filter CF3 may be disposed on the third planarization layer OC3 in the third light emitting area LA3. The third color filter CF3 may be surrounded by the second light blocking member BK2. The third color filter CF3 may overlap the light transmitting part LTU in the thickness direction. The third color filter CF3 may selectively transmit light of the third color (e.g., blue light) and block or absorb light of the first color (e.g., red light) and light of the second color (e.g., green light). For example, the third color filter CF3 may be a blue color filter and may include a blue colorant.

The first through third color filters CF1, CF2, and CF3 may absorb a part of light coming from the outside of the display device 10, thereby reducing reflected light due to the external light. Therefore, the first through third color filters CF1, CF2, and CF3 may prevent color distortion due to reflection of external light.

Since the first through third color filters CF1, CF2, and CF3 are directly disposed on the third planarization layer OC3 of the wavelength conversion layer WLCL, the display device 10 may not require a separate substrate for the first through third color filters CF1, CF2, and CF3. Therefore, the thickness of the display device 10 can be relatively reduced.

The third passivation layer PAS3 may cover the first through third color filters CF1, CF2, and CF3. The third passivation layer PAS3 may protect the first through third color filters CF1, CF2, and CF3.

The encapsulation layer TFE may be disposed on the third passivation layer PAS3 of the color filter layer CFL. The encapsulation layer TFE may cover upper and side surfaces of a display layer. For example, the encapsulation layer TFE may include at least one inorganic layer to prevent penetration of oxygen or moisture. In addition, the encapsulation layer TFE may include at least one organic layer to protect the display device 10 from foreign substances such as dust.

Figure 4:
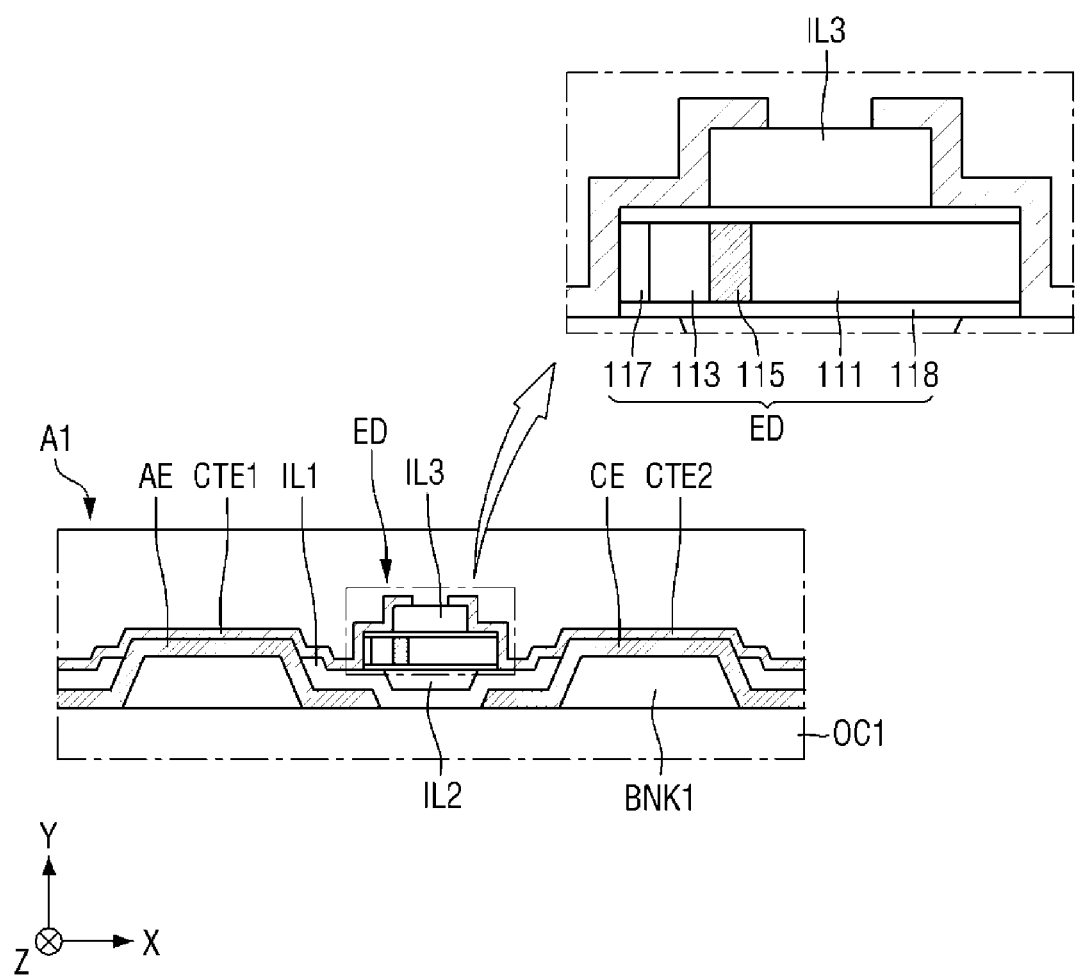
FIG. 4 is an enlarged view of an area A1 of FIG. 3.

FIG. 4 is an enlarged view of an area A1 of FIG. 3.

Referring to FIG. 4, the light emitting element layer EML of the display device 10 may be disposed on the thin-film transistor layer TFTL and may include first through third insulating layers IL1 through IL3.

A plurality of first banks BNK1 may be disposed in each of the first through third light emitting areas LA1, LA2, and LA3. Each of the first banks BNK1 may correspond to the first electrode AE or the second electrode CE. The first banks BNK1 may be disposed on the first planarization layer OC1, and side surfaces of each of the first banks BNK1 may be inclined from the first planarization layer OC1. The first and second electrodes AE and CE may be disposed on the corresponding first banks BNK1, respectively. The first banks BNK1 may include, but is not limited to, polyimide (PI).

The first and second electrodes AE and CE may include a transparent conductive material. For example, each of the first and second electrodes AE and CE may include, but is not limited to, at least one of indium tin oxide (ITO), indium zinc oxide (IZO), and indium tin zinc oxide (ITZO).

The first and second electrodes AE and CE may include a conductive material having high reflectivity. For example, the first and second electrodes AE and CE may include a metal having high reflectivity, such as silver (Ag), copper (Cu) or aluminum (Al). The first and second electrodes AE and CE may reflect light incident from the light emitting diode ED to above the display device 10.

The first insulating layer IL1 may be disposed on the first planarization layer OC1, the first electrode AE, and the second electrode CE. The first insulating layer IL1 may cover a part of each of the first and second electrodes AE and CE. For example, the first insulating layer IL1 may expose parts of the first and second electrodes AE and CE which correspond to upper surfaces of the first banks BNK1 and cover parts of the first and second electrodes AE and CE which do not correspond to the upper surfaces. Therefore, the first insulating layer IL1 may include openings that expose the parts of the first and second electrodes AE and CE which correspond to the upper surfaces of the first banks BNK1.

For example, the first insulating layer IL1 may include an inorganic insulating material and include a step recessed between the first and second electrodes AE and CE. The second insulating layer IL2 may fill the recessed step of the first insulating layer ILL Therefore, the second insulating layer IL2 may planarize an upper surface of the first insulating layer Ill, and the light emitting diode ED may be disposed on the first and second insulating layers IL1 and IL2.

The first insulating layer IL1 may protect the first and second electrodes AE and CE and insulate the first and second electrodes AE and CE from each other. The first insulating layer IL1 may prevent the light emitting diode ED from directly contacting other members and thus being damaged.

The light emitting diode ED may be disposed on the first and second insulating layers IL1 and IL2 between the first electrode AE and the second electrode CE. An end of the light emitting diode ED may be connected to the first electrode AE, and the other end of the light emitting diode ED may be connected to the second electrode CE. For example, the light emitting diode ED may be connected to the first electrode AE through a first contact electrode CTE1 and may be connected to the second electrode CE through a second contact electrode CTE2.

The light emitting diode ED may be an inorganic light emitting diode having a size of micrometers or nanometers and including an inorganic material. The inorganic light emitting diode may be aligned between two electrodes facing each other according to an electric field formed in a specific direction between the two electrodes.

The light emitting diode ED may include a first semiconductor layer 111, a second semiconductor layer 113, an active layer 115, an electrode layer 117, and an insulating film 118.

The first semiconductor layer 111 may be an n-type semiconductor. For example, when the light emitting diode ED emits blue light, the first semiconductor layer 111 may include a semiconductor material having a chemical formula of $Al_xGa_yIn_{1-x-y}N$ ($0 \leq x \leq 1$, $0 \leq y \leq 1$, $0 \leq x+y \leq 1$). The first semiconductor layer 111 may include at least one semiconductor material selected from n-type doped AlGaInN, GaN, AlGaN, InGaN, AlN, and InN. The first semiconductor layer 111 may be doped with an n-type dopant such as Si Ge, or Sn. The first semiconductor layer 111 may be n-GaN doped with n-type Si.

The second semiconductor layer 113 may be disposed on the active layer 115. For example, when the light emitting diode ED emits blue light or green light, the second semiconductor layer 113 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 113 may include at least one semiconductor material selected from p-type doped AlGaInN, GaN, AlGaN, InGaN, AlN, and InN. The second semiconductor layer 113 may be doped with a p-type dopant such as Mg, Zn, Ca, Se, or Ba. The second semiconductor layer 113 may be p-GaN doped with p-type Mg.

The active layer 115 may be disposed between the first and second semiconductor layers 111 and 113 along the first direction (X-axis direction). The active layer 115 may include a material having a single or multiple quantum well structure. When the active layer 115 includes a material having a multiple quantum well structure, it may have a structure in which a plurality of quantum layers and a plurality of well layers are alternately stacked. The active layer 115 may emit light through combination of electron-hole pairs according to electrical signals received through the first and second semiconductor layers 111 and 113, For example, when the active layer 115 emits blue light, it may include a material such as AlGaN or AlGaInN. When the active layer 115 has a multiple quantum well structure in which a quantum layer and a well layer are alternately stacked, the quantum layer may include a material such as AlGaN or AlGaInN, and the well layer may include a material such as GaN or AlInN. The active layer 115 may include AlGaInN as a quantum layer and AlInN as a well layer to emit blue light.

The electrode layer 117 may be an ohmic contact electrode. Alternatively, the electrode layer 117 may be a Schottky contact electrode. The light emitting diode ED may include at least one electrode layer 117, When the light emitting diode ED is electrically connected to an electrode or a contact electrode CTE, the electrode layer 117 may reduce the resistance between the light emitting diode ED and the electrode or the contact electrode CTE. The electrode layer 117 may include a conductive metal.

The insulating film 118 may surround outer surfaces of a plurality of semiconductor layers and a plurality of electrode layers. The insulating film 118 may surround an outer surface of the active layer 115 and extend in a direction in which the light emitting diode ED extends. The insulating film 118 may protect the light emitting diode ED. For example, the insulating film 118 may surround side surfaces of the light emitting diode ED and expose both ends of the light emitting diode ED in a longitudinal direction. In addition, the insulating film 118 may protect an outer surface of the light emitting diode ED including the active layer 115, thereby preventing a reduction in luminous efficiency.

The third insulating layer 113 may be disposed on a part of the light emitting diode ED which is disposed between the first and second electrodes AE and CE along the first direction (X-axis direction). The third insulating layer IL3 may partially cover the outer surface of the light emitting diode ED. The third insulating layer IL3 may protect the light emitting diode ED.

The contact electrodes CTE may include the first and second contact electrodes CTE1 and CTE2. The first contact electrode CTE1 may cover the first electrode AE and a part of the light emitting diode ED and may electrically connect the first electrode AE and the light emitting diode ED. The second contact electrode CTE2 may cover the second electrode CE and another part of the light emitting diode ED and may electrically connect the second electrode CE and the light emitting diode ED.

The contact electrodes CTE may include a conductive material. For example, the contact electrodes CTE may include, but are not limited to, ITO, IZO, ITZO, or aluminum (Al).

Figure 5:
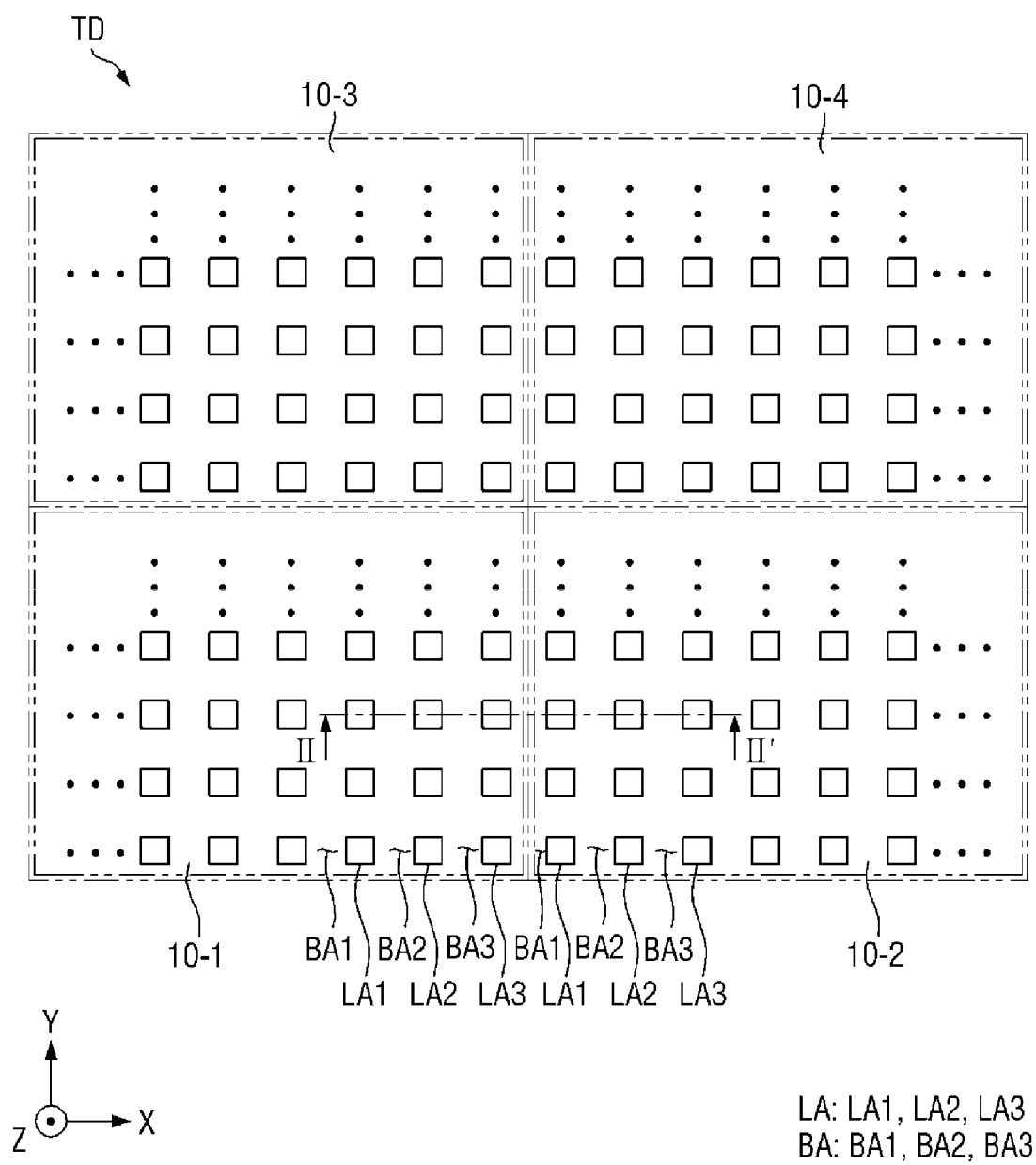
FIG. 5 is a plan view illustrating the coupling structure of a tiled display device according to an embodiment.
Figure 6:
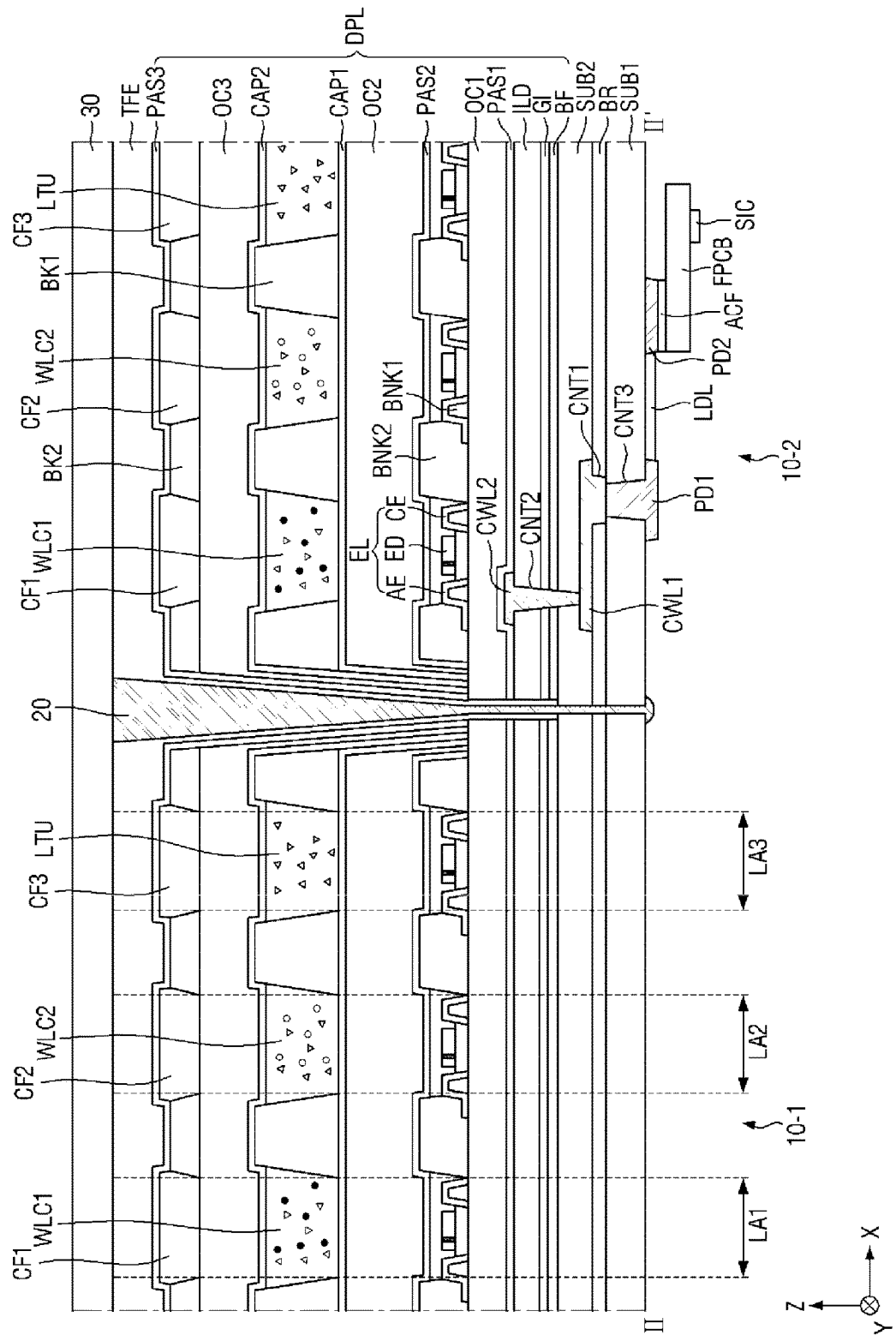
FIG. 6 is a cross-sectional view of an example taken along line II-II' of FIG. 5.

FIG. 5 is a plan view illustrating the coupling structure of a tiled display device TD according to an embodiment. FIG. 6 is a cross-sectional view of an example taken along line II-II' of FIG. 5, A description of the same elements as those described above will be given briefly or omitted.

Referring to FIGS. 5 and 6, the tiled display device TD may include a plurality of display devices 10, a coupling member 20, and a cover member 30. For example, the tiled display device TD may include first through fourth display devices 10-1, 10-2, 10-3, and 10-4. However, the number of the display devices 10 is not limited to the embodiment of FIG. 5. The number of the display devices 10 may be determined by the size of each display device 10 and the size of the tiled display device TD.

Each of the display devices 10 may include a first substrate SUB1, a barrier layer BR, a first connection line CWL1, a second substrate SUB2, a display layer DPL, an encapsulation layer TFE, a first pad part PD1, a second pad part PD2, a flexible film FPCB, and a source driver SIC.

The first substrate SUB1 may be a base substrate or a base member and may be made of an insulating material such as polymer resin. For example, the first substrate SUB1 may be a flexible substrate that can be bent, folded, rolled, etc. The first substrate SUB1 may include, but is not limited to, polyimide (PI).

The first substrate SUB1 may include a third contact hole CNT3 passing through the first substrate SUB1 from a lower surface of the first substrate SUB1. For example, the third contact hole CNT3 may pass through the first substrate SUB1 from the lower surface of the first substrate SUB1 to an upper surface of the first substrate SUB1. The third contact hole CNT3 may overlap a display area DA. The first pad part PD1 inserted into the third contact hole CNT3 may be disposed in the display area DA. Therefore, each display device may not include a separate pad part disposed at an outermost position, and a bezel area or a dead space of each display device 10 can be minimized. Since the first pad part PD1 is disposed on a lower surface of each display device 10, a gap between the display devices 10 can be further reduced compared with when a pad part is disposed at an outermost position on a substrate or when a flexible film is disposed on a side surface of the substrate.

The barrier layer BR may be disposed on the first substrate SUB1. The barrier layer BR may support the first connection line CWL1. The barrier layer BR may be disposed between the first substrate SUB1 and the first connection line CWL1 to prevent damage to wirings during an etching process of the first substrate SUB1 and prevent an unnecessary short circuit between the wirings. The barrier layer BR may include an inorganic material that can prevent penetration of air or moisture. For example, the barrier layer BR may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The barrier layer BR may include a first contact hole CNT1 passing through the barrier layer BR from an upper surface of the barrier layer BR. For example, the first contact hole CNT1 may pass through the barrier layer BR from the upper surface of the barrier layer BR to a lower surface of the barrier layer BR. The first contact hole CNT1 may be connected to the third contact hole CNT3 of the first substrate SUB1 and may overlap the display area DA. The first connection line CWL1 inserted into the first contact hole CNT1 may be disposed in the display area DA.

The first connection line CWL1 may be disposed on the barrier layer BR and connected to the first pad part PD1 provided on the lower surface of the first substrate SUB1 through the first contact hole CNT1. The first connection line CWL1 may be inserted into the first contact hole CNT1 and connected to the first pad part PD1 inserted into the third contact hole CNT3. The first connection line CWL1 may supply an electrical signal received from the first pad part PD1 to a thin-film transistor layer TFTL through the second connection line CWL2. For example, the first connection line CWL1 may have, but is not limited to, a spider shape.

The second substrate SUB2 may cover the first connection line CWL1 and the barrier layer BR. The second substrate SUB2 may planarize the top of the barrier layer BR. The second substrate SUB2 may be a base substrate or a base member and may be made of an insulating material such as polymer resin. For example, the second substrate SUB2 may be a flexible substrate that can be bent, folded, rolled, etc. The second substrate SUB2 may include, but is not limited to, polyimide (PI).

The display layer DPL may be disposed on the second substrate SUB2. The display layer DPL may include a buffer layer BF, the thin-film transistor layer TFTL, a light emitting element layer EML, a wavelength conversion layer WLCL, and a color filter layer CFL illustrated in FIG. 3. The elements described above in FIG. 3 will not be described below.

The buffer layer BF may be disposed on the second substrate SUB2. The buffer layer BF may include an inorganic material that can prevent penetration of air or moisture. For example, the buffer layer BF may include a plurality of inorganic layers stacked alternately.

A gate insulating layer GI may be disposed on the buffer layer BF and semiconductor regions ACT, source electrodes SE and drain electrodes DE of thin-film transistors TFT.

An interlayer insulating film ILD may be disposed on the gate insulating layer GI and gate electrodes GE of the thin-film transistors TFT.

The interlayer insulating film ILD, the gate insulating layer GI, the buffer layer BF, and the second substrate SUB2 may include a second contact hole CNT2 through which a second connection line CWL2 passes. The second contact hole CNT2 may be spaced apart from the first contact hole CNT1 or the third contact hole CNT3 in plan view.

The thin-film transistor layer TFTL may further include the second connection line CWL2 disposed on the interlayer insulating film ILD. The second connection line CWL2 may be connected to the first connection line CWL1 disposed on the barrier layer BR through the second contact hole CNT2. The second connection line CWL2 may be connected to a plurality of data lines to supply data voltages and may be connected to a plurality of scan lines to supply scan signals. For example, the second connection line CWL2 may be formed on the same layer and of the same material as connection electrodes CNE of the thin-film transistors TFT, but the present disclosure is not limited thereto. For another example, the second connection line CWL2 may be formed on the same layer and of the same material as the gate electrodes GE of the thin-film transistors TFT.

Each display device 10 including the third contact hole CNT3 provided in the first substrate SUB1, the first contact hole CNT1 provided in the barrier layer BR, and the second contact hole CNT2 provided in the second substrate SUB2, the buffer layer BF, the gate insulating layer GI and the interlayer insulating film ILD may supply a signal of the first pad part PD1 to the thin-film transistor layer TFTL using the first connection line CWL1 and the second connection line CWL2. The second contact hole CNT2 may be spaced apart from the first contact hole CNT1 or the third contact hole CNT3 in plan view. Since each display device 10 includes multiple contact holes, a depth of each of the first through third contact holes CNT1, CNT2, and CNT3 can be reduced compared with when one contact hole is formed to penetrate from the interlayer insulating film ILD to the first substrate SUB1. Therefore, in each display device 10, thicknesses of the first and second connection lines CWL1 and CWL2 and the first pad part PD1 respectively inserted into the first through third contact holes CNT1, CNT2, and CNT3 can be reduced. In addition, since each display device 10 includes the first and second contact holes CNT1 and CNT2 spaced apart from each other in plan view, interference between the first and second connection lines CWL1 and CWL2 can be prevented, and process stability can be promoted.

The first pad part PD1 may be disposed on the lower surface of the first substrate SUB1 and may be connected to the first connection line CWL1 exposed through the third contact hole CNT3. The first contact hole CNT1 through which the first connection line CWL1 passes and the third contact hole CNT3 through which the first pad part PD1 passes may be connected to each other.

The second pad part PD2 may be disposed on the lower surface of the first substrate SUB1 and spaced apart from the first pad part PD1. The second pad part PD2 may be connected to the first pad part PD1 through a lead line LDL. The second pad part PD2 may receive various voltages or signals from the flexible film FPCB and supply the voltages or signals to the first pad part PD1, the first connection line CWL1, and the second connection line CWL2.

A connection film ACF may attach the flexible film FPCB to the second pad part PD2. A surface of the connection film ACF may be attached to the second pad part PD2, and the other surface of the connection film ACF may be attached to the flexible film FPCB. For example, the connection film ACF may cover the entire second pad part PD2, but the present disclosure is not limited thereto.

The connection film ACF may include an anisotropic conductive film. When the connection film ACF includes an anisotropic conductive film, it may have conductivity in an area where the second pad part PD2 and a contact pad of the flexible film FPCB contact each other and may electrically connect the flexible film FPCB to the second pad part PD2.

The flexible film FPCB may be disposed on the lower surface of the first substrate SUB1. A side of the flexible film FPCB may be connected to the second pad part PD2, and the other side of the flexible film FPCB may be connected to a source circuit board (not illustrated) on the lower surface of the first substrate SUB1. The flexible film FPCB may transmit signals of the source driver SIC to the display device 10. For example, the source driver SIC may be an integrated circuit. The source driver SIC may convert digital video data into analog data voltages based on a source control signal of a timing controller and supply the analog data voltages to the data lines of the display area DA through the flexible film FPCB.

The tiled display device TD may be formed by coupling side surfaces of adjacent display devices 10 to each other using the coupling member 20 disposed between the display devices 10. The coupling member 20 may connect side surfaces of the first through fourth display devices 10-1, 10-2, 10-3, and 10-4 arranged in a lattice shape, thereby realizing the tiled display device TD. The coupling member 20 may couple side surfaces of the respective first and second substrates SUB1 and SUB2 and encapsulation layers TFE of adjacent display devices 10.

For example, the coupling member 20 may be made of an adhesive or double-sided tape having a relatively small thickness to minimize the gap between the display devices 10. For another example, the coupling member 20 may be made of a coupling frame having thickness to minimize the gap between the display devices 10. Therefore, the tiled display device TD may prevent a non-display area NDA or a boundary part between the display devices 10 from being recognized by a user.

The cover member 30 may be disposed on upper surfaces of the display devices 10 and the coupling member 20 to cover the display devices 10 and the coupling member 20. For example, the cover member 30 may be disposed on an upper surface of the encapsulation layer TFE of each of the display devices 10. The cover member 30 may protect an upper surface of the tiled display device TD.

FIGS. 7, 8, 9, 10, and 11 are cross-sectional views illustrating a process of manufacturing a display device 10 of FIG. 6.

Figure 7:
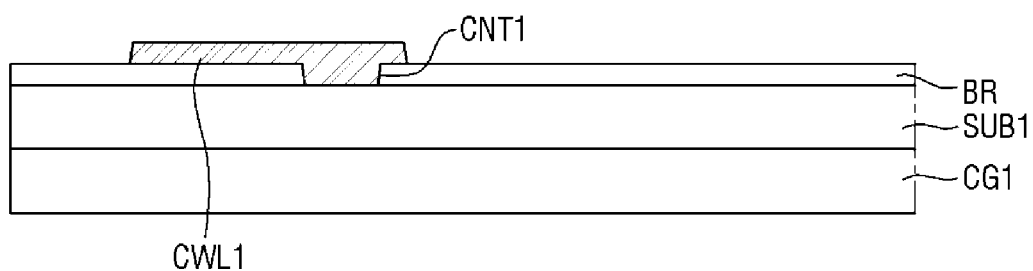
FIGS. 7, 8, 9, 10, and 11 are cross-sectional views illustrating a process of manufacturing a display device of FIG. 6.

In FIG. 7, a first substrate SUB1 may be provided on a first carrier substrate CG1. The first substrate SUB1 may include, but is not limited to, polyimide (PI). For example, the first carrier substrate CG1 may be, but is not limited to, a carrier glass. The first carrier substrate CG1 may support the first substrate SUB1 in the process of forming a display layer DPL and an encapsulation TFE on the first substrate SUB1.

A barrier layer BR may be disposed on the first substrate SUB1. The barrier layer BR may include an inorganic material that can prevent penetration of air or moisture. The barrier layer BR may include a first contact hole CNT1 passing through the barrier layer BR from an upper surface of the barrier layer BR. For example, the first contact hole CNT1 may pass through the barrier layer BR from the upper surface of the barrier layer BR to a lower surface of the barrier layer BR.

A first connection line CWL1 may be disposed on the barrier layer BR and inserted into the first contact hole CNT1. For example, the first connection line CWL1 may be formed to fill the first contact hole CNT1 through an inkjet process, a cutting process, or a plating process.

Figure 8:
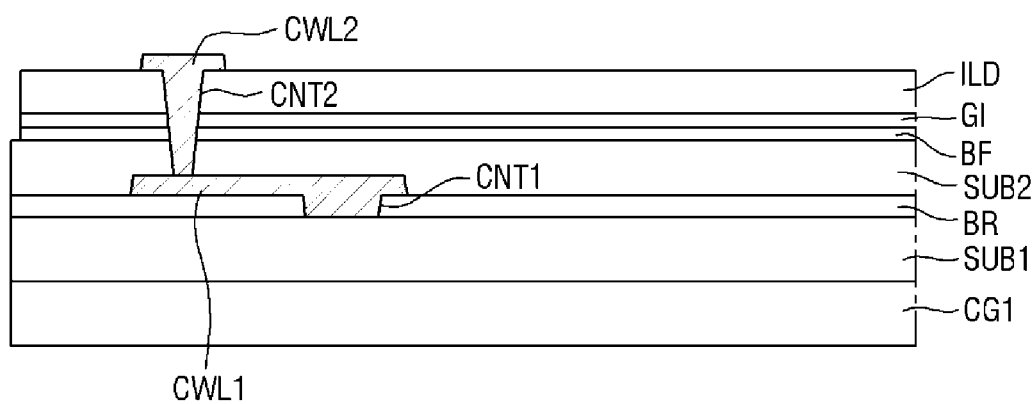

In FIG. 8, a second substrate SUB2 may cover the first connection line CWL1 and the barrier layer BR. The second substrate SUB2 may planarize the top of the barrier layer BR. The second substrate SUB2 may include, but is not limited to, polyimide (PI).

A buffer layer BF maybe disposed on the planarized second substrate SUB2. A gate insulating layer GI and an interlayer insulating film ILD may be sequentially stacked on the buffer layer BF.

A second contact hole CNT2 may be formed to pass through the interlayer insulating film ILD, the gate insulating layer GI, the buffer layer BF, and the second substrate SUB2. The second contact hole CNT2 may be spaced apart from the first contact hole CNT1.

A second connection line CWL2 may be disposed on the interlayer insulating film ILD and may be connected to the first connection line CWL1 disposed on the barrier layer BR through the second contact hole CNT2. For example, the second connection line CWL2 may be formed on the same layer and of the same material as connection electrodes CNE of thin-film transistors TFT, but the present disclosure is not limited thereto.

For another example, the second connection line CWL2 may be formed on the same layer and of the same material as gate electrodes GE of the thin-film transistors TFT. When the second connection line CWL2 is disposed on the same layer as the gate electrodes GE, it may be disposed on the gate insulating layer GI.

Figure 9:
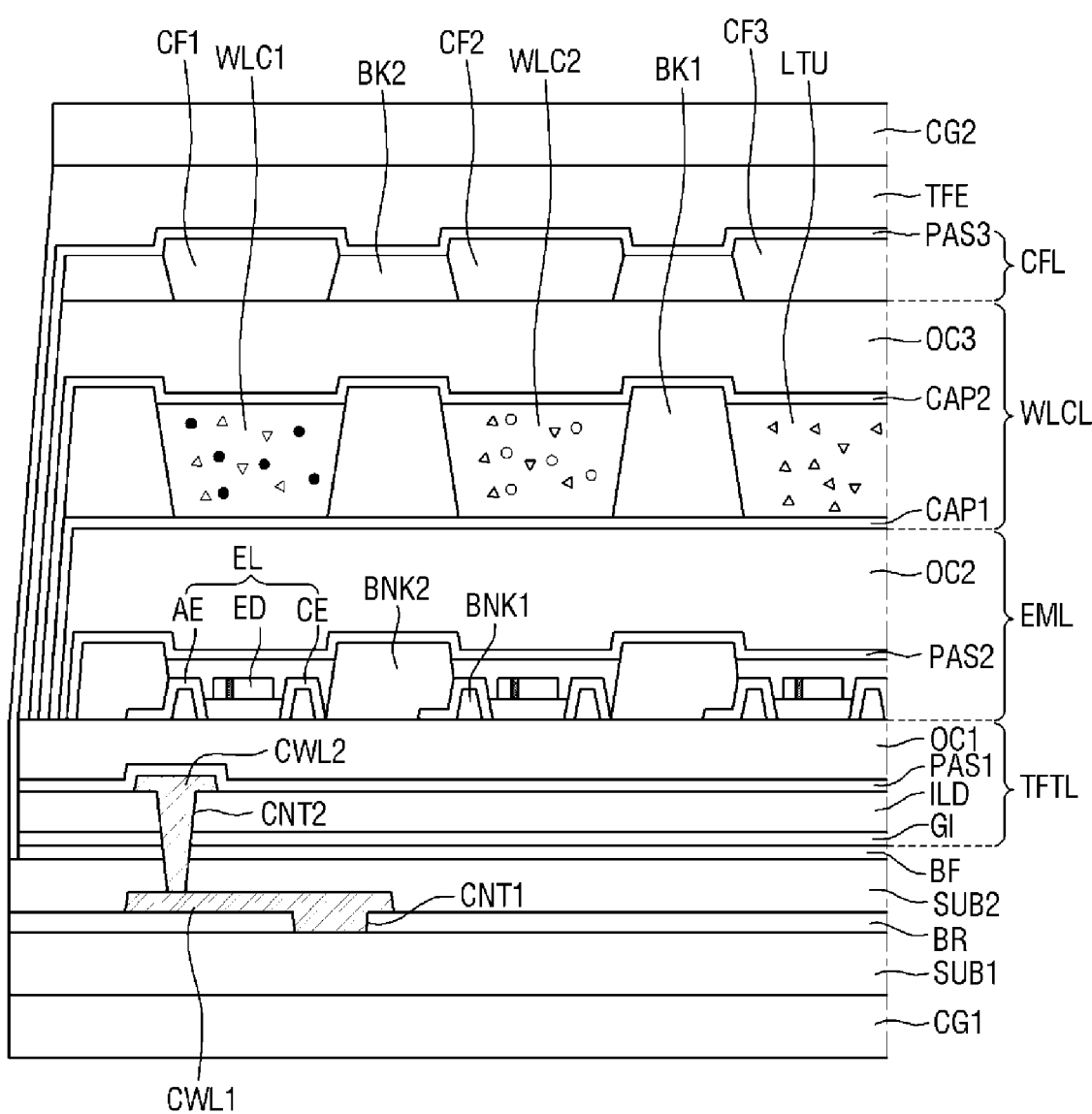

In FIG. 9, a first passivation layer PAS1 may cover the second connection line CWL2 and the interlayer insulating film ILD, and a first planarization layer OC1 may cover the first passivation layer PAS1.

A light emitting element layer EML, a wavelength conversion layer WLCL, a color filter layer CFL, and the encapsulation layer TFE may be sequentially stacked on a thin-film transistor layer TFTL.

A second carrier substrate CG2 may be disposed on the encapsulation layer TFE. For example, the second carrier substrate CG2 may be, but is not limited to, a carrier glass. The second carrier substrate CG2 may support the display device 10 in the process of forming a first pad part PD1 on a lower surface of the first substrate SUB1. After the second carrier substrate CG2 is disposed, the display device being manufactured may be inverted. Accordingly, the second carrier substrate CG2 may support the display device, and the first carrier substrate CG1 may be exposed. The first carrier substrate CG1 may be removed after the stacking of the display layer DPL and the encapsulation layer TFE is completed.

Figure 10:
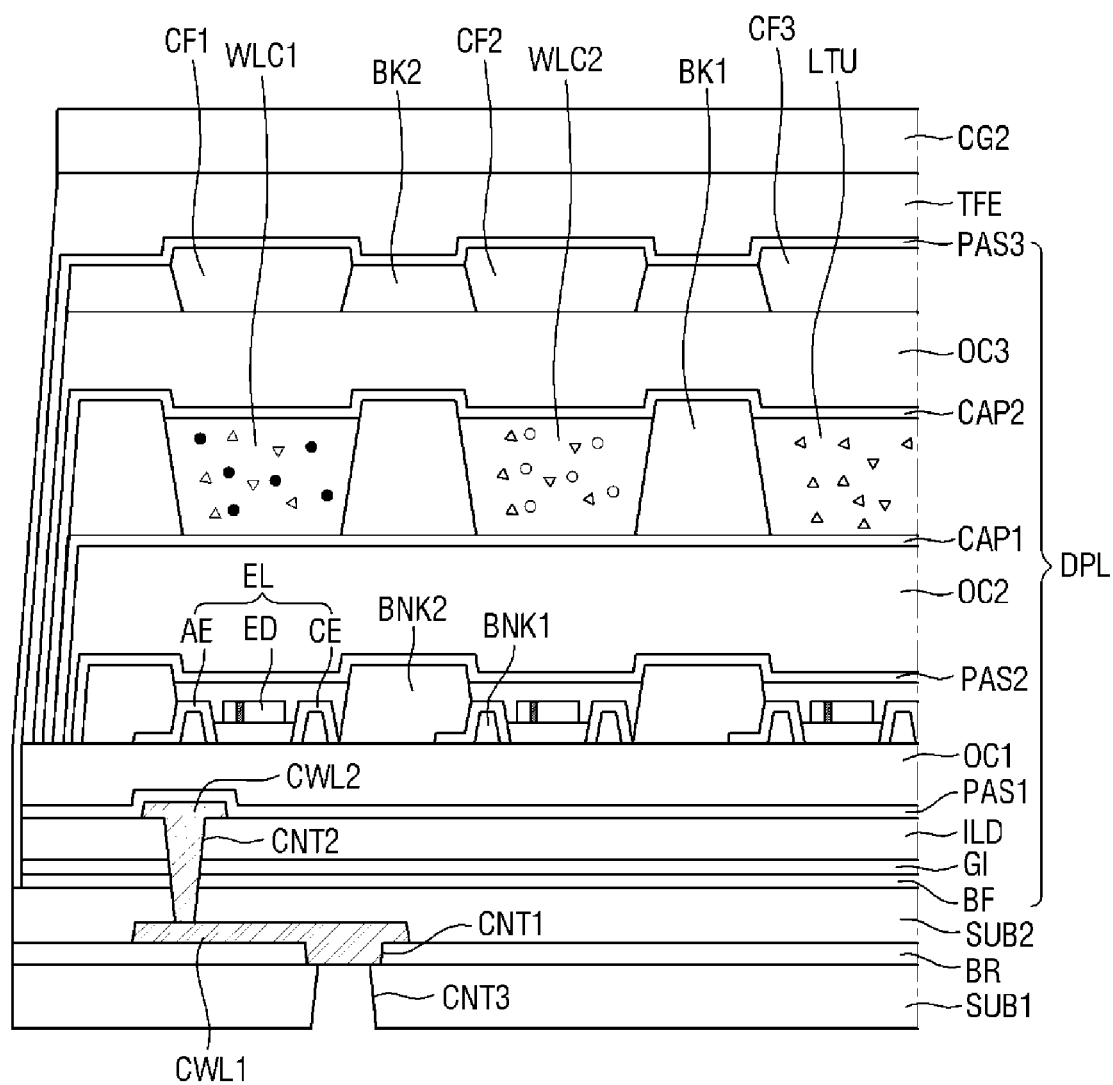

In FIG. 10, a third contact hole CNT3 may be formed to pass through the first substrate SUB1 from the lower surface of the first substrate SUB1. The third contact hole CNT3 may be connected to the first contact hole CNT1. The first connection line CWL1 inserted into the first contact hole CNT1 may be exposed by the third contact hole CNT3.

For example, the third contact hole CNT3 may be formed by removing a lower part of the first substrate SUB1 through a laser etching process, but the present disclosure is not limited thereto. In the display device 10, a plurality of third contact holes CNT3 respectively corresponding to a plurality of first pad parts PD1 may be precisely formed using the laser etching process.

For another example, the third contact hole CNT3 may be formed by removing the lower part of the first substrate SUB1 through a dry etching process. In the display device 10, the third contact hole CNT3 corresponding to at least some of a plurality of first pad parts PD1 may be formed using the dry etching process. The third contact hole CNT3 may be etched using a process gas and high-frequency power that meet etching characteristics of the first substrate SUB1. The third contact hole CNT3 may be etched by physical or chemical reaction of electrons or ions generated in a plasma state of the process gas with the first substrate SUB1.

Figure 11:
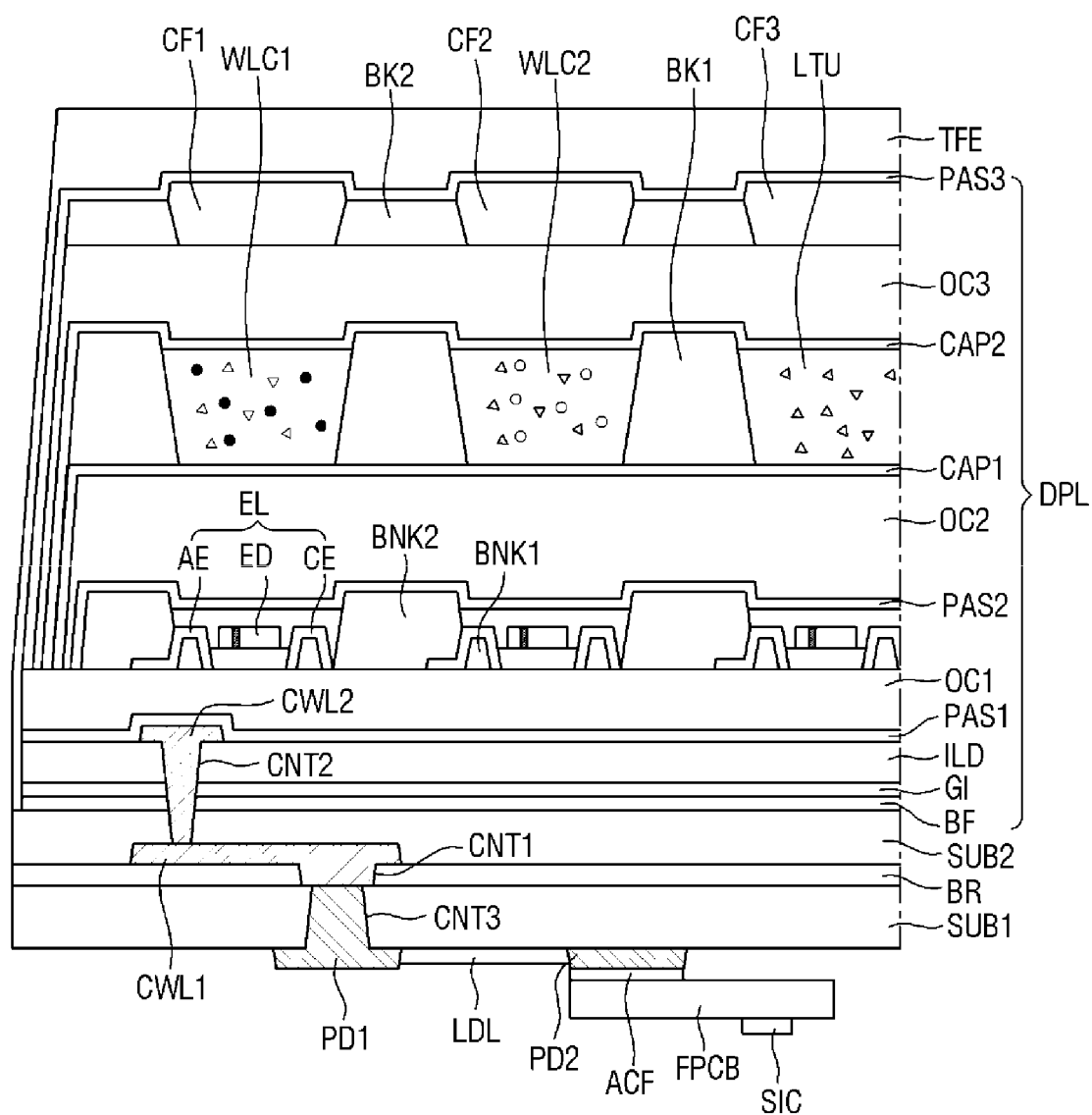

In FIG. 11, the first pad part PD1 may be disposed on the lower surface of the first substrate SLIM and may be connected to the first connection line CWL1 exposed through the third contact hole CNT3.

A second pad part PD2 may be disposed on the lower surface of the first substrate SUB1 and spaced apart from the first pad part PD1. The second pad part PD2 may be connected to the first pad part PD1 through a lead line LDL. The second pad part PD2 may receive various voltages or signals from a flexible film FPCB and supply the voltages or signals to the first pad part PD1, the first connection line CWL1, and the second connection line CWL2.

The flexible film FPCB may be disposed on the lower surface of the first substrate SUB1. A side of the flexible film FPCB may be connected to the second pad part PD2, and the other side of the flexible film FPCB may be connected to a source circuit board (not illustrated) on the lower surface of the first substrate SUB1. The flexible film FPCB may transmit signals of a source driver SIC to the display device 10.

Figure 12:
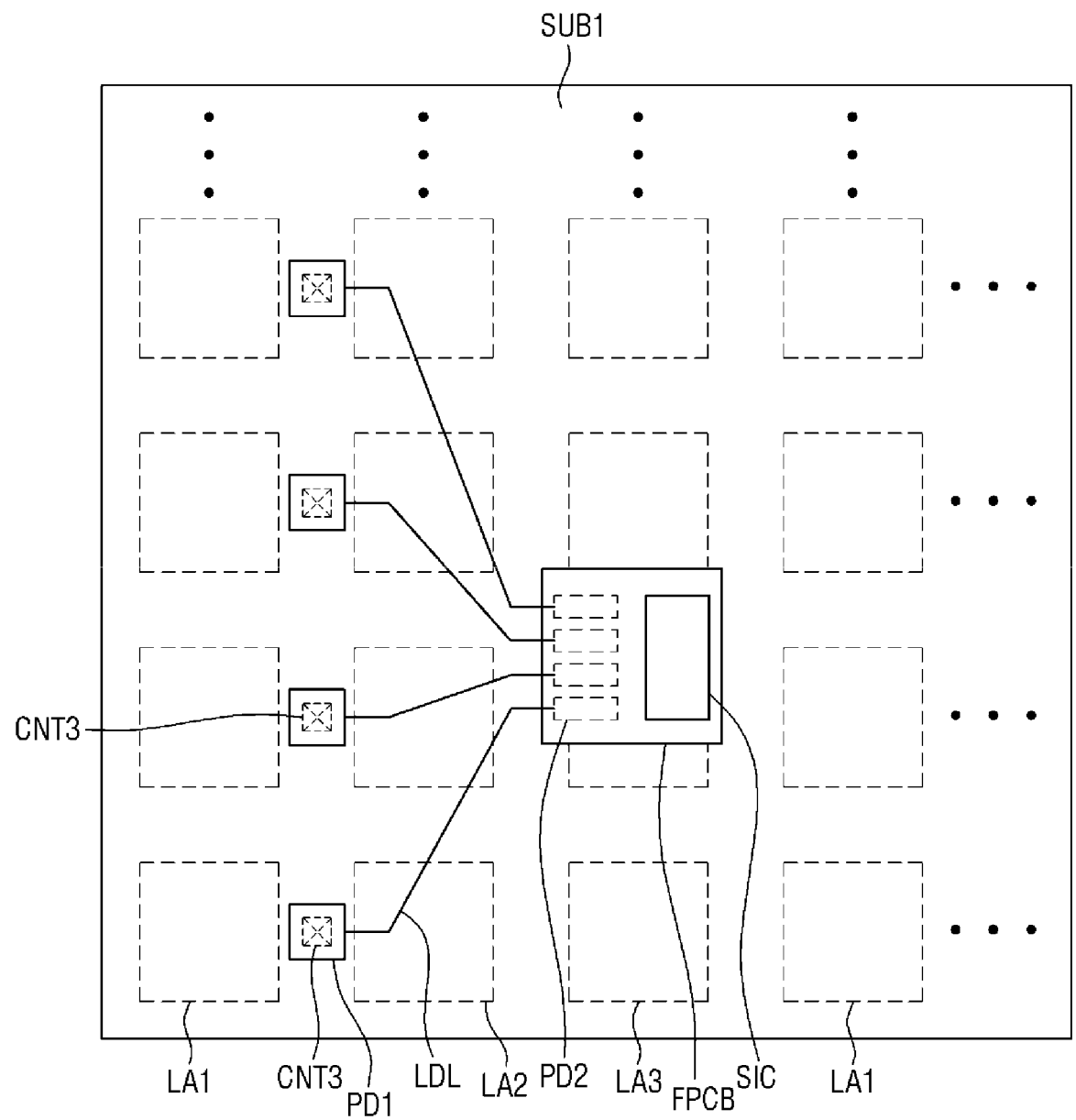
FIG. 12 is a plan view of an example of a back surface of a display device of FIG. 6.

FIG. 12 is a plan view of an example of a back surface of a display device 10 of FIG. 6.

Referring to FIG. 12, first pad parts PD1 may be disposed on a lower surface of a first substrate SUB1 and may be connected to first connection lines CWL1 exposed through third contact holes CNT3.

For example, the third contact holes CNT3 may be formed by removing a lower part of the first substrate SUB1 through a laser etching process, but the present disclosure is not limited thereto. The first pad parts PD1 may correspond to the third contact holes CNT3, respectively. In the display device 10, the third contact holes CNT3 respectively corresponding to the first pad parts PD1 may be precisely formed using the laser etching process. Therefore, each of the first connection lines CWL1 may be exposed through a corresponding third contact hole CNT3, and one first pad part PD1 may be connected to a first connection line CWL1 through a corresponding third contact hole CNT3.

Second pad parts PD2 may be disposed on the lower surface of the first substrate SUB1 and may be spaced apart from the first pad parts PD1. The second pad parts PD2 may be connected to the first pad parts PD1 through lead lines LDL. The second pad parts PD2 may receive various voltages or signals from a flexible film FPCB and supply the voltages or signals to the first pad parts PD1, the first connection lines CWL1, and second connection lines CWL2.

A connection film ACF may attach the flexible film FPCB to the second pad parts PD2. One surface of the connection film ACF may be attached to the second pad parts PD2, and the other surface of the connection film ACF may be attached to the flexible film FPCB. For example, the connection film ACF may cover the whole of the second pad part PD2, but the present disclosure is not limited thereto.

The connection film ACF may include an anisotropic conductive film. When the connection film ACF includes an anisotropic conductive film, it may have conductivity in an area where the second pad part PD2 and a contact pad of the flexible film FPCB contact each other and may electrically connect the flexible film FPCB to the second pad part PD2.

The flexible film FPCB may be disposed on the lower surface of the first substrate SUB1. A side of the flexible film FPCB may be connected to the second pad parts PD2, and the other side of the flexible film FPCB may be connected to a source circuit board (not illustrated) on the lower surface of the first substrate SUB1. The flexible film FPCB may transmit signals of the source driver SIC to the display device 10. For example, the source driver SIC may be an integrated circuit. The source driver SIC may convert digital video data into analog data voltages based on a source control signal of a timing controller and supply the analog data voltages to data lines of a display area DA through the flexible film FPCB.

Figure 13:
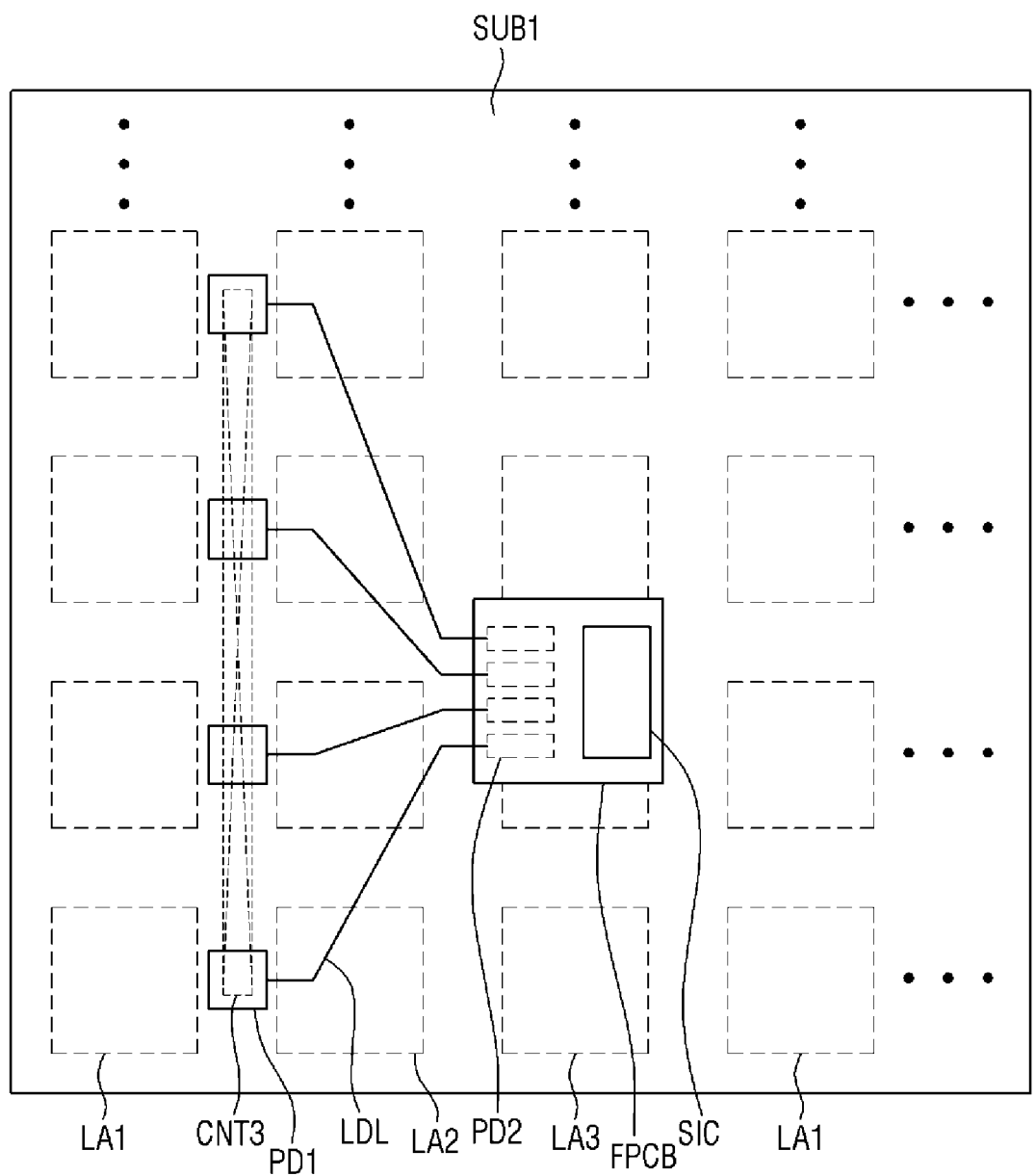
FIG. 13 is a plan view of an example of the back surface of the display device of FIG. 6.

FIG. 13 is a plan view of an example of the back surface of the display device of FIG. 6. The display device of FIG. 13 is different from the display device of FIG. 12 in the configuration of a third contact hole CNT3. Thus, a description of the same elements as those described above will be given briefly or omitted.

Referring to FIG. 13, first pad parts PD1 may be disposed on a lower surface of a first substrate SUB1 and may be connected to the first connection line CWL1 exposed through the third contact hole CNT3.

For example, the third contact hole CNT3 may be formed by removing a lower part of the first substrate SUB1 through a dry etching process. At least some of the first pad parts PD1 may correspond to one third contact hole CNT3. One third contact hole CNT3 formed through the dry etching process may expose at least some of a plurality of first connection lines CWL1. The third contact hole CNT3 may be etched using a process gas and high-frequency power that meet etching characteristics of the first substrate SUB1. The third contact hole CNT3 may be etched by physical or chemical reaction of electrons or ions generated in a plasma state of the process gas with the first substrate SUB1. At least some of the first connection lines CWL1 may be exposed through one third contact hole CNT3, and at least some of the first pad parts PD1 may be connected to corresponding first connection line CWL1.

Figure 14:
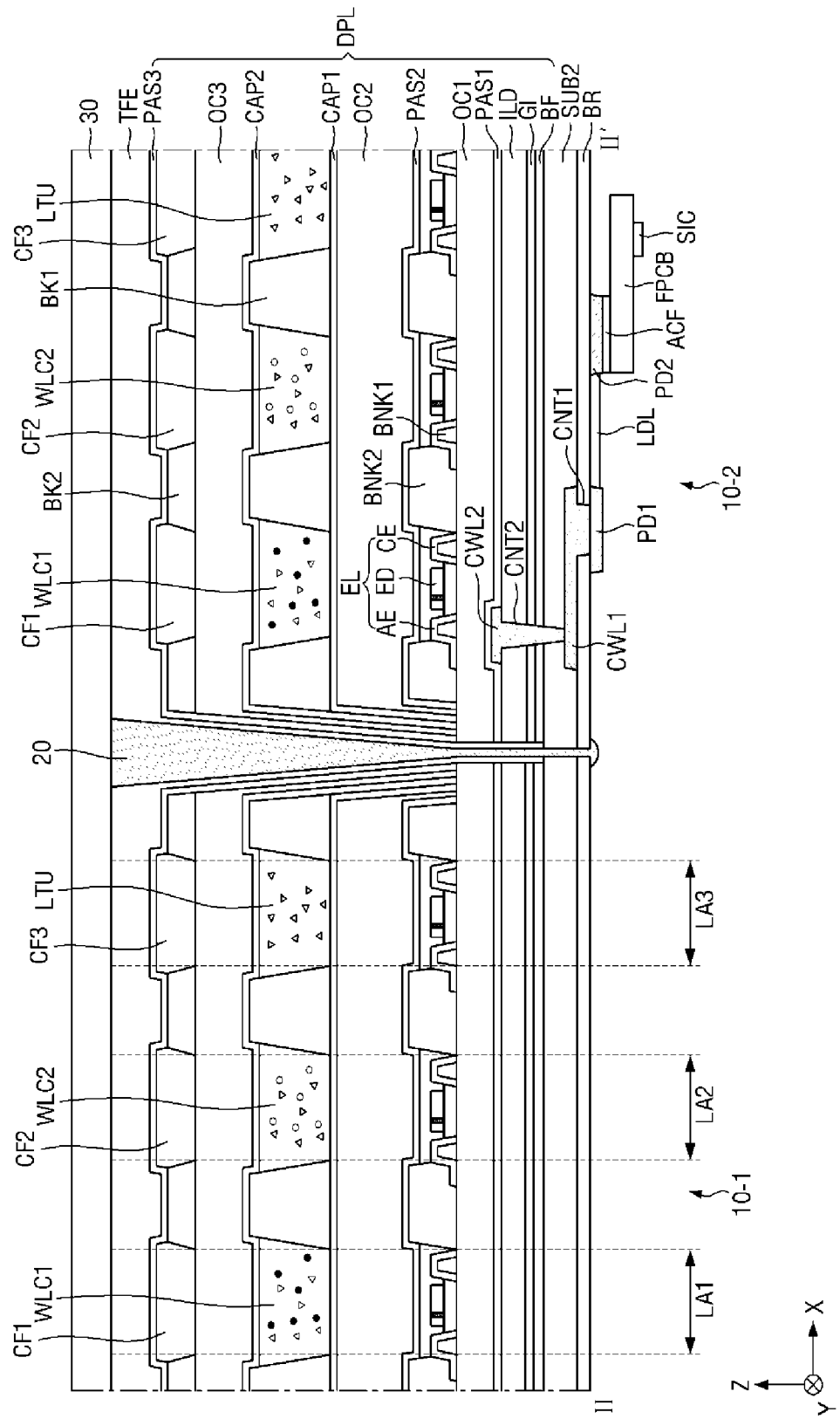
FIG. 14 is a cross-sectional view of an example taken along line II-IF of FIG. 5.

FIG. 14 is a cross-sectional view of an example taken along line II-II' of FIG. 5. A tiled display device TD of FIG. 14 is different from the tiled display device TD of FIG. 6 in a first substrate SUB1. Thus, a description of the same elements as those described above will be given briefly or omitted.

Referring to FIG. 14, the tiled display device TD may include a plurality of display devices 10, a coupling member 20, and a cover member 30.

Each of the display devices 10 may include a barrier layer BR, a first connection line CWL1, a second substrate SUB2, a display layer DPL, an encapsulation layer TEE, a first pad part PD1, a second pad part PD2, a flexible film FPCB, and a source driver SIC.

The barrier layer BR may support the first connection line CWL1. The barrier layer BR may be disposed between the first pad part PD1 and the first connection line CWL1 to prevent damage to wirings during an etching process and prevent an unnecessary short circuit between the wirings. The barrier layer BR may include an inorganic material that can prevent penetration of air or moisture. For example, the barrier layer BR may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The barrier layer BR may include a first contact hole CNT1 passing through the barrier layer BR from an upper surface of the barrier layer BR. For example, the first contact hole CNT1 may pass through the barrier layer BR from the upper surface of the barrier layer BR to a lower surface of the barrier layer BR. The first contact hole CNT1 may overlap a display area DA. The first connection line CWL1 inserted into the first contact hole CNT1 may be disposed in the display area DA.

The first connection line CWL1 may be disposed on the barrier layer BR and connected to the first pad part PD1 provided on the lower surface of the barrier layer BR through the first contact hole CNT1. The first connection line CWL1 may supply an electrical signal received from the first pad part PD1 to a thin-film transistor layer TFTL through a second connection line CWL2.

The second substrate SUB2 may cover the first connection line CWL1 and the barrier layer BR. The second substrate SUB2 may planarize the top of the barrier layer BR. The second substrate SUB2 may be a base substrate or a base member and may be made of an insulating material such as polymer resin. For example, the second substrate SUB2 may include, but is not limited to, polyimide (PI).

The display layer DPL may be disposed on the second substrate SUB2. The display layer DPL may include a buffer layer BF, the thin-film transistor layer TFTL, a light emitting element layer EML, a wavelength conversion layer WLCL, and a color filter layer CFL illustrated in FIG. 3.

The thin-film transistor layer TFTL may further include the second connection line CWL2 disposed on an interlayer insulating film ILD. The second connection line CWL2 may be connected to the first connection line CWL1 disposed on the barrier layer BR through a second contact hole CNT2. The second connection line CWL2 may be connected to a plurality of data lines to supply data voltages and may be connected to a plurality of scan lines to supply scan signals. For example, the second connection line CWL2 may be formed on the same layer and of the same material as connection electrodes CNE of thin-film transistors TFT, but the present disclosure is not limited thereto. For another example, the second connection line CWL2 may be formed on the same layer and of the same material as gate electrodes GE of the thin-film transistors TFT.

The first pad part PD1 may be disposed on the lower surface of the barrier layer BR and may be connected to the first connection line CWL1 exposed on the lower surface of the barrier layer BR. The first pad part PD1 may be disposed in the display area DA. Therefore, each display device 10 may not include a separate pad part disposed at an outermost position, and a bezel area or a dead space of each display device 10 can be minimized. Since the first pad part PD1 is disposed on a lower surface of each display device 10, a gap between the display devices 10 can be further reduced compared with when a pad part is disposed at an outermost position on a substrate or when a flexible film is disposed on a side surface of the substrate.

The second pad part PD2 may be disposed on the lower surface of the barrier layer BR and spaced apart from the first pad part PD1. The second pad part PD2 may be connected to the first pad part PD1 through a lead line LDL. The second pad part PD2 may receive various voltages or signals from the flexible film FPCB and supply the voltages or signals to the first pad part PD1, the first connection line CWL1, and the second connection line CWL2.

Figure 15:
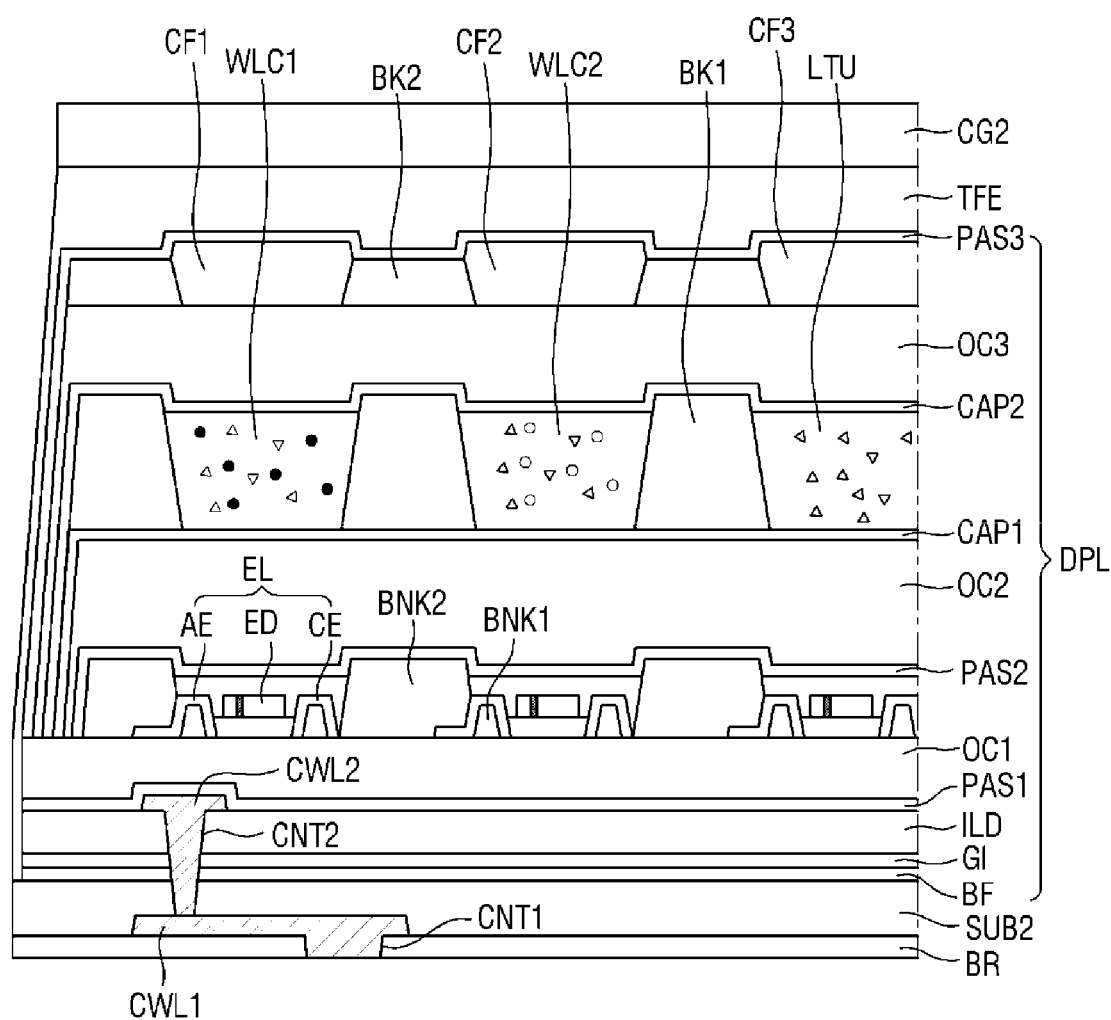
FIGS. 15 and 16 are cross-sectional views illustrating a process of manufacturing a display device of FIG. 14.
Figure 16:
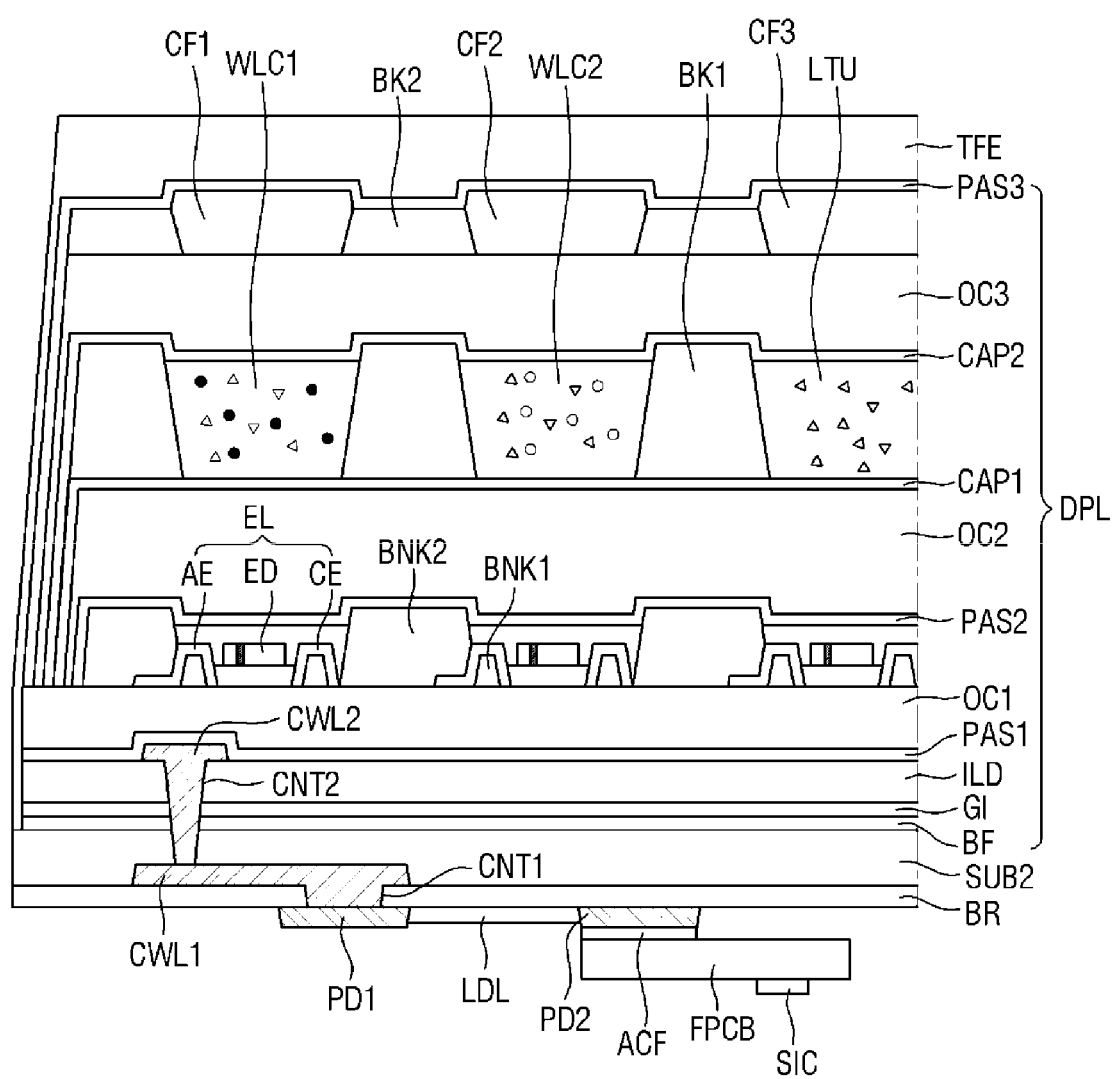

FIGS. 15 and 16 are cross-sectional views illustrating a process of manufacturing a display device of FIG. 14. The display device manufacturing process of FIG. 15 may be a process following the display device manufacturing process of FIG. 9.

In FIG. 15, a first substrate SUB1 disposed on a lower surface of a barrier layer BR may be entirely removed, and a first connection line CWL1 may be exposed on the lower surface of the barrier layer BR. The entire lower surface of the first substrate SUB1 may be etched while having a flat surface, and the first connection line CWL1 may be exposed on the lower surface of the barrier layer BR without an additional contact hole.

For example, the first substrate SUB1 may be etched through a dry etching process, but the present disclosure is not limited thereto. The barrier layer BR may be disposed between the first substrate SUB1 and the first connection line CWL1 to prevent damage to wirings during an etching process of the first substrate SUB1 and prevent an unnecessary short circuit between the wirings. The barrier layer BR may include an inorganic material that can prevent penetration of air or moisture.

In FIG. 16, a first pad part PD1 may be disposed on the lower surface of the barrier layer BR and may be connected to the first connection line CWL1 exposed on the lower surface of the barrier layer BR.

A second pad part PD2 may be disposed on the lower surface of the barrier layer BR and spaced apart from the first pad part PD1. The second pad part PD2 may be connected to the first pad part PD1 through a lead line LDL. The second pad part PD2 may receive various voltages or signals from a flexible film FPCB and supply the voltages or signals to the first pad part PD1, the first connection line CWL1, and a second connection line CWL2.

Figure 17:
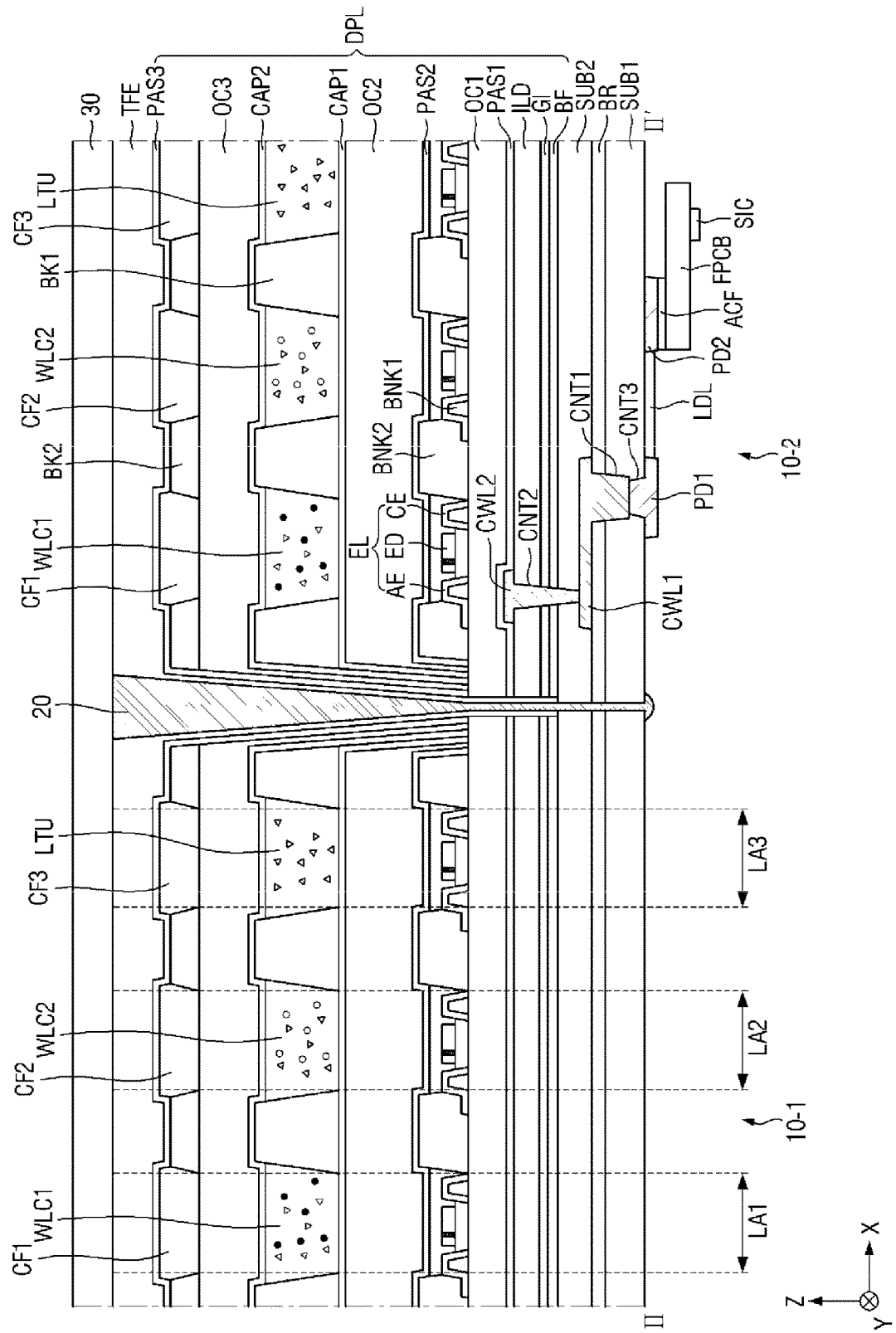
FIG. 17 is a cross-sectional view of an example taken along line II-IF of FIG. 5.

FIG. 17 is a cross-sectional view of an example taken along line II-IF of FIG. 5.

A tiled display device TD of FIG. 17 is different from the tiled display device TD of FIG. 6 in the configuration of a first contact hole CNT1 and a first connection line CWL1. Thus, a description of the same elements as those described above will be given briefly or omitted.

Referring to FIG. 17, the tiled display device TD may include a plurality of display devices 10, a coupling member 20, and a cover member 30.

Each of the display devices 10 may include a first substrate SUB1, a barrier layer BR, the first connection line CWL1, a second substrate SUB2, a display layer DPL, an encapsulation layer TFE, a first pad part PD1, a second pad part PD2, a flexible film FPCB, and a source driver SIC.

The first substrate SUB1 may be a base substrate or a base member and may be made of an insulating material such as polymer resin. For example, the first substrate SUB1 may include, but is not limited to, polyimide (PI).

The first substrate SUB1 may include the first contact hole CNT1 provided in a surface thereof and a third contact hole CNT3 provided in the other surface opposite the above surface. For example, the first contact hole CNT1 may pass through a part of the first substrate SUB1 from an upper surface of the first substrate SUB1, and the third contact hole CNT3 may pass through the other part of the first substrate SUB1 from a lower surface of the first substrate SUB1. The first contact hole CNT1 and the third contact hole CNT3 may be connected to each other. Therefore, the first substrate SUB1 may be penetrated by the first contact hole CNT1 and the third contact hole CNT3.

The first contact hole CNT1 and the third contact hole CNT3 may overlap a display area DA. The first connection line CWL1 inserted into the first contact hole CNT1 and the first pad part PD1 inserted into the third contact hole CNT3 may be disposed in the display area DA. Therefore, each display device 10 may not include a separate pad part disposed at an outermost position, and a bezel area or a dead space of each display device 10 can be minimized. Since the first pad part PD1 is disposed on a lower surface of each display device 10, a gap between the display devices 10 can be further reduced compared with when a pad part is disposed at an outermost position on a substrate or when a flexible film is disposed on a side surface of the substrate.

The barrier layer BR may be disposed on the first substrate SUB1. The barrier layer BR may support the first connection line CWL1. The barrier layer BR may be disposed between the first substrate SUB1 and the first connection line CWL1 to prevent damage to wirings during an etching process of the first substrate SUB1 and prevent an unnecessary short circuit between the wirings. The barrier layer BR may include an inorganic material that can prevent penetration of air or moisture.

The barrier layer BR may include the first contact hole CNT1 passing through the barrier layer BR from an upper surface of the barrier layer BR. For example, the first contact hole CNT1 may penetrate from the upper surface of the barrier layer BR to a part of the first substrate SUB1. The first contact hole CNT1 may be connected to the third contact hole CNT3 of the first substrate SUB1 and may overlap the display area DA. The first connection line CWL1 inserted into the first contact hole CNT1 may be disposed in the display area DA.

The first connection line CWL1 may be disposed on the barrier layer BR and connected to the first pad part PD1 provided on the lower surface of the first substrate SUB1 through the first contact hole CNT1. The first connection line CWL1 may be inserted into the first contact hole CNT1 and connected to the first pad part PD1 inserted into the third contact hole CNT3. The first connection line CWL1 may supply an electrical signal received from the first pad part PD1 to a thin-film transistor layer TFTL through a second connection line CWL2.

The second substrate SUB2 may cover the first connection line CWL1 and the barrier layer BR. The second substrate SUB2 may planarize the top of the barrier layer BR. The second substrate SUB2 may be a base substrate or a base member and may be made of an insulating material such as polymer resin. For example, the second substrate SUB2 may include, but is not limited to, polyimide (PI).

The display layer DPL may be disposed on the second substrate SUB2. The display layer DPL may include a buffer layer BF, the thin-film transistor layer TFTL, a light emitting element layer EML, a wavelength conversion layer WLCL, and a color filter layer CFL illustrated in FIG. 3.

The thin-film transistor layer TFTL may further include the second connection line CWL2 disposed on an interlayer insulating film ILD. The second connection line CWL2 may be connected to the first connection line CWL1 disposed on the barrier layer BR through a second contact hole CNT2. The second connection line CWL2 may be connected to a plurality of data lines to supply data voltages and may be connected to a plurality of scan lines to supply scan signals. For example, the second connection line CWL2 may be formed on the same layer and of the same material as connection electrodes CNE of thin-film transistors TFT, but the present disclosure is not limited thereto. For another example, the second connection line CWL2 may be formed on the same layer and of the same material as gate electrodes GE of the thin-film transistors TFT.

Each display device 10 including the first contact hole CNT1 provided in a surface of the first substrate SUB1 and the barrier layer BR, the second contact hole CNT2 provided in the second substrate SUB2, the buffer layer BF, a gate insulating layer GI and the interlayer insulating film ILD, and the third contact hole CNT3 provided in the other surface of the first substrate SUB1 may supply a signal of the first pad part PD1 to the thin-film transistor layer TFTL using the first connection line CWL1 and the second connection line CWL2. Since each display device 10 includes multiple contact holes, a depth of each of the first through third contact holes CNT1, CNT2, and CNT3 can be reduced compared with when one contact hole is formed to penetrate from the interlayer insulating film ILD to the first substrate SUB1. Therefore, in each display device 10, thicknesses of the first and second connection lines CWL1 and CWL2 and the first pad part PD1 respectively inserted into the first through third contact holes CNT1 through CNT3 can be reduced. In addition, since each display device 10 includes the first and second contact holes CNT1 and CNT2 spaced apart from each other in plan view, interference between the first and second connection lines CWL1 and CWL2 can be prevented, and process stability can be promoted.

The first pad part PD1 may be disposed on the lower surface of the first substrate SUB1 and may be connected to the first connection line CWL1 exposed through the third contact hole CNT3. The first contact hole CNT1 through which the first connection line CWL1 passes and the third contact hole CNT3 through which the first pad part PD1 passes may be connected to each other.

The second pad part PD2 may be disposed on the lower surface of the first substrate SUB1 and spaced apart from the first pad part PD1. The second pad part PD2 may be connected to the first pad part PD1 through a lead line LDL. The second pad part PD2 may receive various voltages or signals from the flexible film FPCB and supply the voltages or signals to the first pad part PD1, the first connection line CWL1, and the second connection line CWL2.

FIGS. 18, 19, 20, 21, and 22 are cross-sectional views illustrating a process of manufacturing the display device 10 of FIG. 17.

Figure 18:
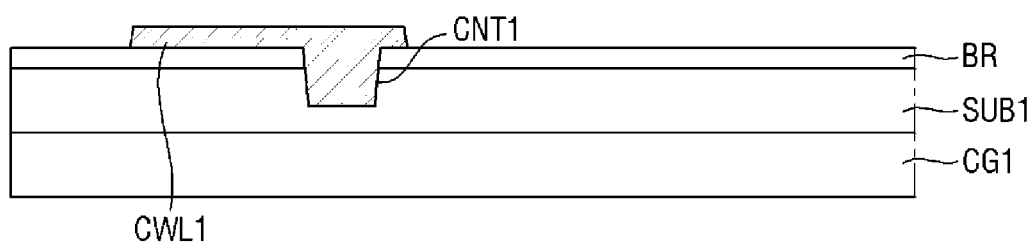
FIGS. 18, 19, 20, 21, and 22 are cross-sectional views illustrating a process of manufacturing a display device of FIG. 17.

In FIG. 18, a first substrate SUB1 may be provided on a first carrier substrate CG1. The first substrate SUB1 may include, but is not limited to, polyimide (PI). For example, the first carrier substrate CG1 may be, but is not limited to, a carrier glass. The first carrier substrate CG1 may support the first substrate SUB1 in the process of forming a display layer DPL and an encapsulation TFE on the first substrate SUB1.

A barrier layer BR may be disposed on the first substrate SUB1. The barrier layer BR may include an inorganic material that can prevent penetration of air or moisture.

A first contact hole CNT1 may penetrate from an upper surface of the barrier layer BR to a part of the first substrate SUB1. The other part of the first substrate SUB1 which is not penetrated by the first contact hole CNT1 may separate a first connection line CWL1 inserted into the first contact hole CNT1 from the first carrier substrate CG1.

The first connection line CWL1 may be disposed on the barrier layer BR and inserted into the first contact hole CNT1. For example, the first connection line CWL1 may be formed to fill the first contact hole CNT1 through an inkjet process, a cutting process, or a plating process.

Figure 19:
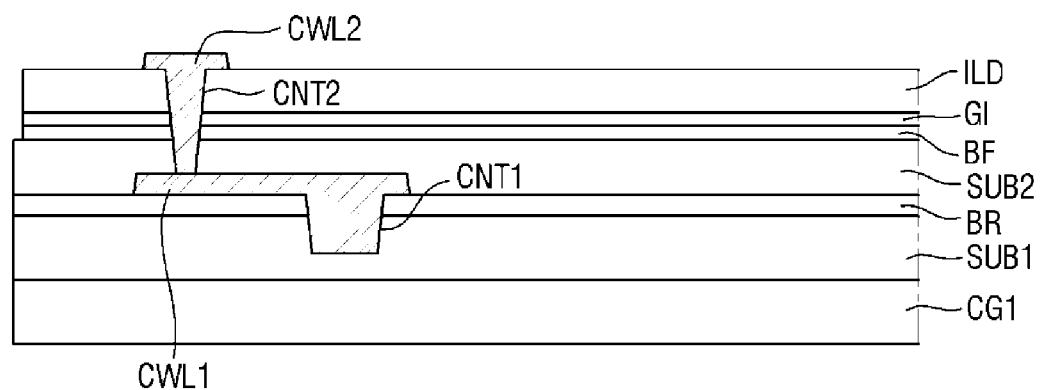

In FIG. 19, a second substrate SUB2 may cover the first connection line CWL1 and the barrier layer BR. The second substrate SUB2 may planarize the top of the barrier layer BR. The second substrate SUB2 may include, but is not limited to, polyimide (PI).

A buffer layer BF may be disposed on the planarized second substrate SUB2. A gate insulating layer GI and an interlayer insulating film ILD may be sequentially stacked on the buffer layer BF.

A second contact hole CNT2 may be formed to pass through the interlayer insulating film ILD, the gate insulating layer GI, the buffer layer BF, and the second substrate SUB2. The second contact hole CNT2 may be spaced apart from the first contact hole CNT1.

A second connection line CWL2 may be disposed on the interlayer insulating film ILD and may be connected to the first connection line CWL1 disposed on the barrier layer BR through the second contact hole CNT2. For example, the second connection line CWL2 may be formed on the same layer and of the same material as connection electrodes CNE of thin-film transistors TFT, but the present disclosure is not limited thereto.

For another example, the second connection line CWL2 may be formed on the same layer and of the same material as gate electrodes GE of the thin-film transistors TFT. When the second connection line CWL2 is disposed on the same layer as the gate electrodes GE, it may be disposed on the gate insulating layer GI.

Figure 20:
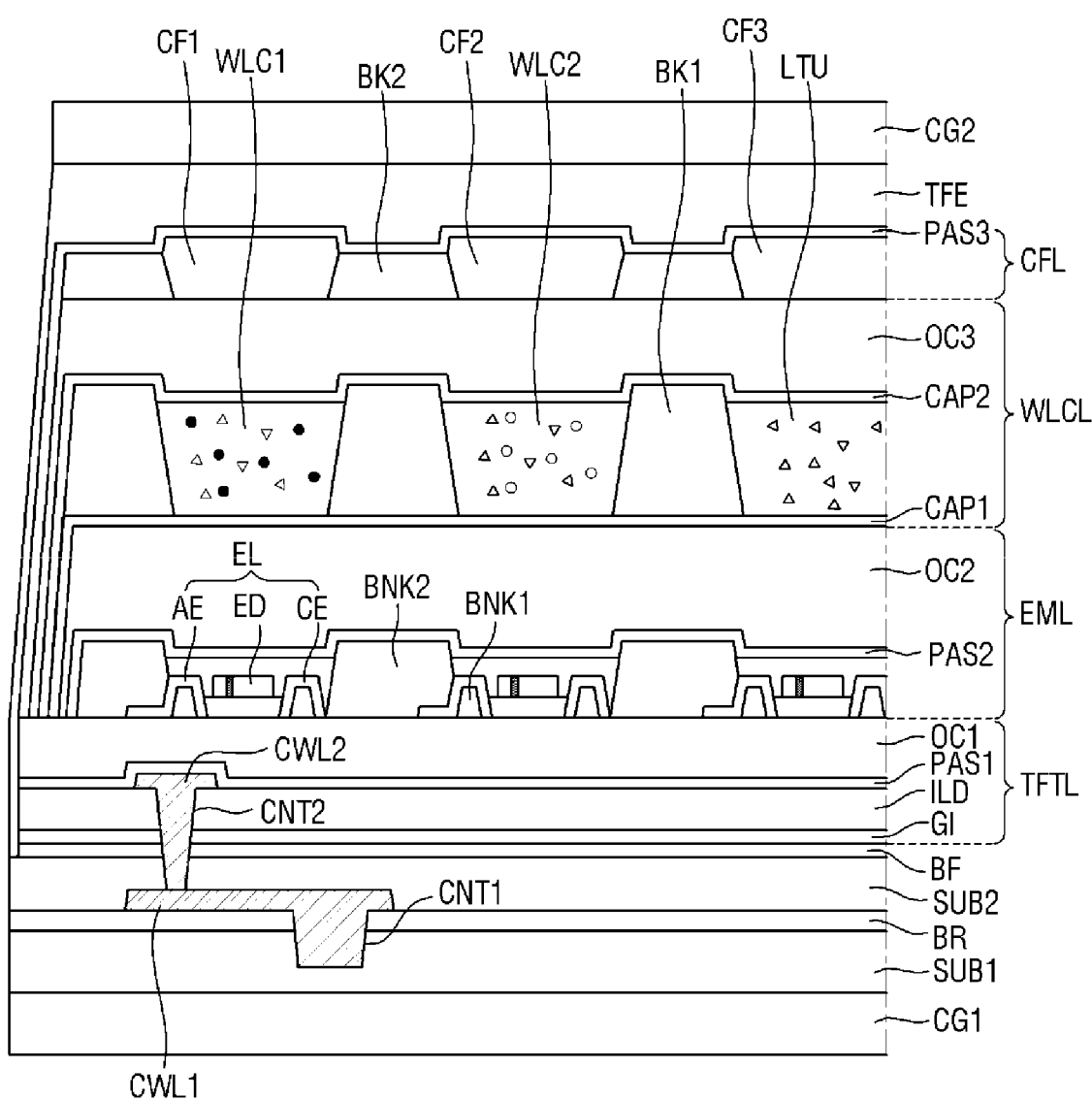

In FIG. 20, a first passivation layer PAS1 may cover the second connection line CWL2 and the interlayer insulating film ILD, and a first planarization layer OC1 may cover the first passivation layer PAS1.

A light emitting element layer EML, a wavelength conversion layer WLCL, a color filter layer CFL, and the encapsulation layer TFE may be sequentially stacked on a thin-film transistor layer TFTL.

A second carrier substrate CG2 may be disposed on the encapsulation layer TFE. For example, the second carrier substrate CG2 may be, but is not limited to, a carrier glass. The second carrier substrate CG2 may support the display device 10 in the process of forming a first pad part PD1 on a lower surface of the first substrate SUB1. After the second carrier substrate CG2 is disposed, the display device being manufactured may be inverted. Accordingly, the second carrier substrate CG2 may support the display device, and the first carrier substrate CG1 may be exposed. The first carrier substrate CG1 may be removed after the stacking of the display layer DPL and the encapsulation layer TFE is completed. Here, the other part of the first substrate SUB1 which is not penetrated by the first contact hole CNT1 may separate the first connection line CWL1 inserted into the first contact hole CNT1 from the first carrier substrate CG1. Therefore, since the first contact hole CNT1 does not entirely pass through the first substrate SUB1, and the first connection line CWL1 is spaced apart from the first carrier substrate CG1, the first carrier substrate CG1 can be easily removed. In this way, the first carrier substrate CG1 can be easily detached in the manufacturing process of the display device 10.

Figure 21:
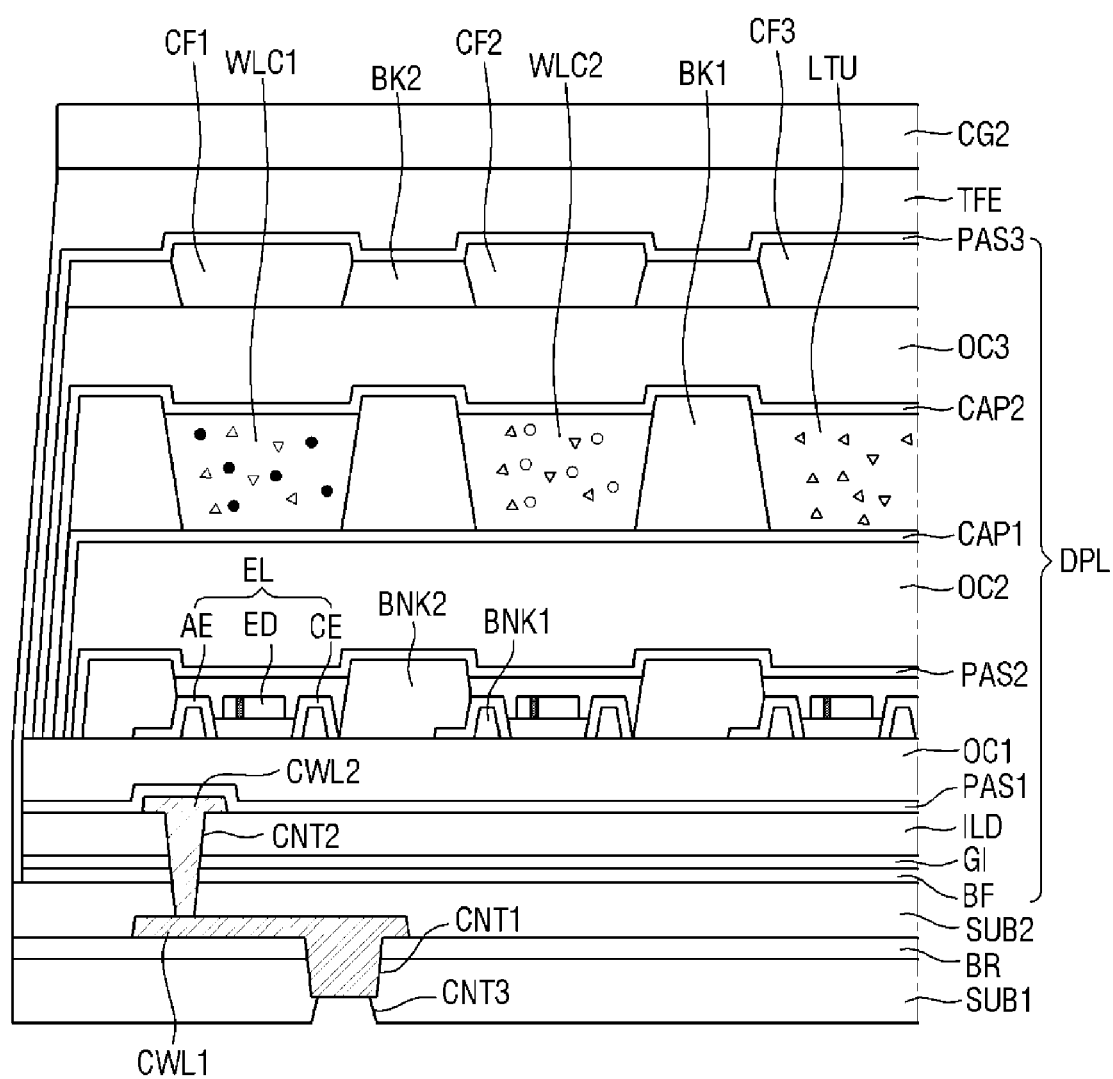

In FIG. 21, a third contact hole CNT3 may be formed to pass through the other part of the first substrate SUB1 from the lower surface of the first substrate SUB1. The third contact hole CNT3 may be connected to the first contact hole CNT1. The first connection line CWL1 inserted into the first contact hole CNT1 may be exposed by the third contact hole CNT3.

Figure 22:
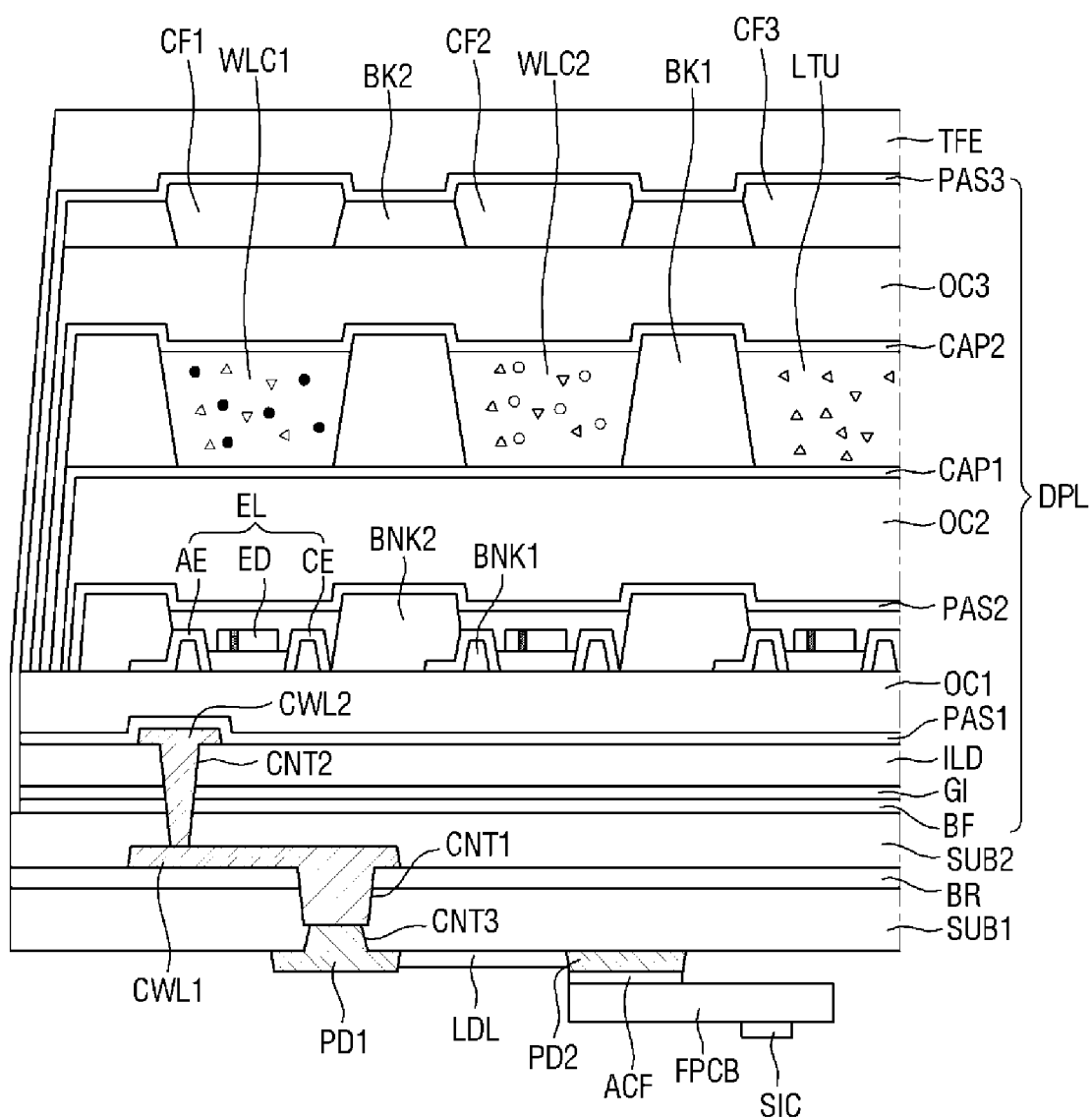

In FIG. 22, the first pad part PD1 may be disposed on the lower surface of the first substrate SUB1 and may be inserted into the third contact hole CNT3 and thus connected to the first connection line CWL1.

A second pad part PD2 may be disposed on the lower surface of the first substrate SUB1 and spaced apart from the first pad part PIM. The second pad part PD2 may be connected to the first pad part PD1 through a lead line LDL, The second pad part PD2 may receive various voltages or signals from a flexible film FPCB and supply the voltages or signals to the first pad part PD1, the first connection line CWL1, and the second connection line CWL2.

Figure 23:
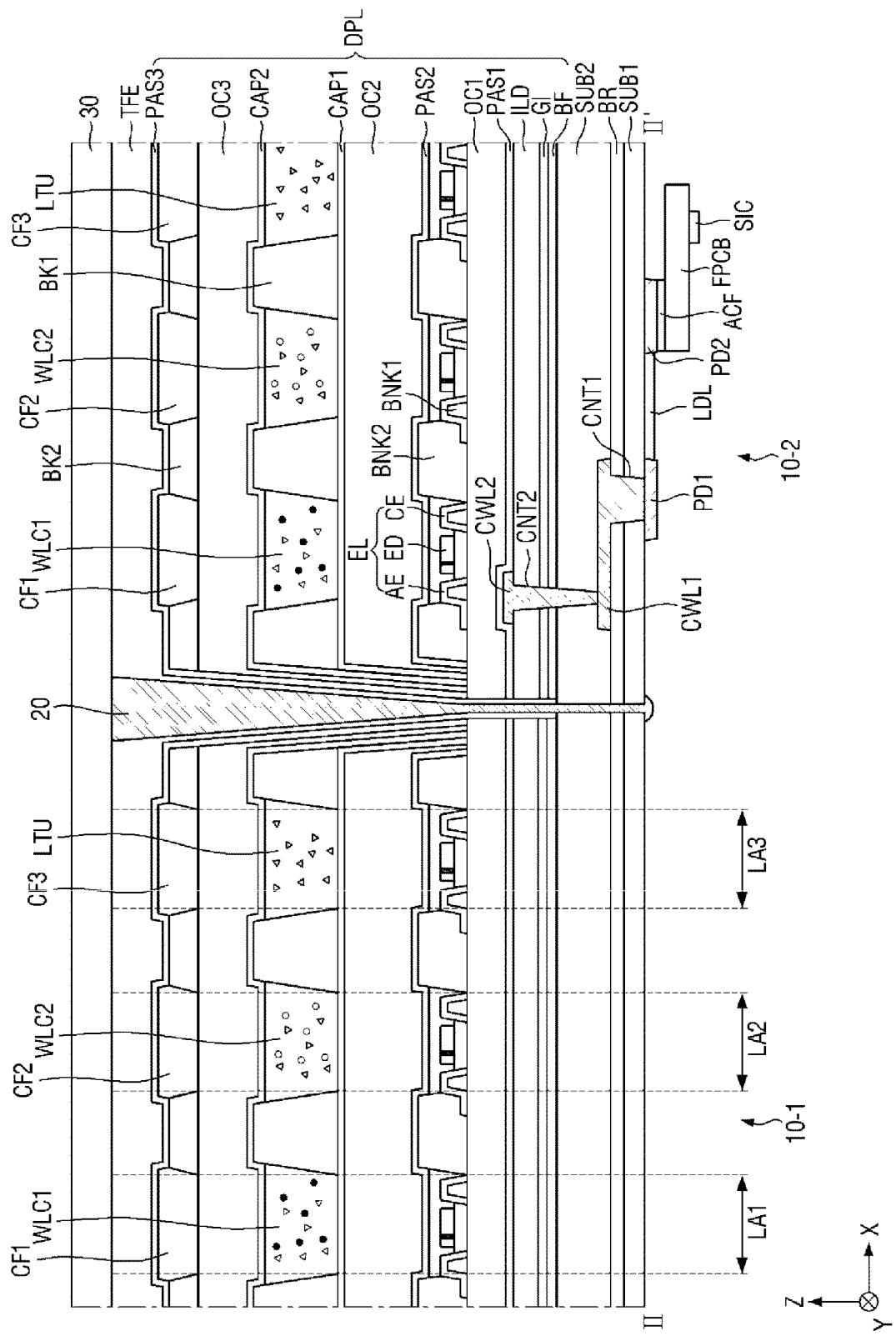
FIG. 23 is a cross-sectional view of an example taken along line II-IF of FIG. 5.

FIG. 23 is a cross-sectional view of an example taken along line II-II' of FIG. 5, A tiled display device TD of FIG. 23 is different from the tiled display device TD of FIG. 17 in the configuration of a first substrate SUB L Thus, a description of the same elements as those described above will be given briefly or omitted.

Referring to FIG. 23, the tiled display device TD may include a plurality of display devices 10, a coupling member 20, and a cover member 30.

Each of the display devices 10 may include the first substrate SUB1, a barrier layer BR, a first connection line CWL1, a second substrate SUB2, a display layer DPL, an encapsulation layer TFE, a first pad part PD1, a second pad part PD2, a flexible film FPCB, and a source driver SIC.

The first substrate SUB1 may be a base substrate or a base member and may be made of an insulating material such as polymer resin. For example, the first substrate SUB1 may include, but is not limited to, polyimide (PI).

The first substrate SUB1 may include a first contact hole CNT1 provided in a surface thereof. For example, the first contact hole CNT1 may pass through the first substrate SUB1 from an upper surface of the first substrate SUB1 to a lower surface of the first substrate SUB1. The first contact hole CNT1 may overlap a display area DA. The first connection line CWL1 inserted into the first contact hole CNT1 may be disposed in the display area DA. Therefore, each display device 10 may not include a separate pad part disposed at an outermost position, and a bezel area or a dead space of each display device 10 can be minimized. Since the first pad part PD1 is disposed on a lower surface of each display device 10, a gap between the display devices 10 can be further reduced compared with when a pad part is disposed at an outermost position on a substrate or when a flexible film is disposed on a side surface of the substrate.

The barrier layer BR may be disposed on the first substrate SUB1. The barrier layer BR may support the first connection line CWL1. The barrier layer BR may be disposed between the first substrate SUB1 and the first connection line CWL1 to prevent damage to wirings during an etching process of the first substrate SUB1 and prevent an unnecessary short circuit between the wirings. The barrier layer BR may include an inorganic material that can prevent penetration of air or moisture.

The barrier layer BR may include the first contact hole CNT1 passing through the barrier layer BR from an upper surface of the barrier layer BR. For example, the first contact hole CNT1 may penetrate from the upper surface of the barrier layer BR to a part of the first substrate SUB1.

The first connection line CWL1 may be disposed on the barrier layer BR and connected to the first pad part PD1 provided on the lower surface of the first substrate SUB1 through the first contact hole CNT1. The first connection line CWL1 may supply an electrical signal received from the first pad part PD1 to a thin-film transistor layer TFTL through a second connection line CWL2.

The second substrate SUB2 may cover the first connection line CWL1 and the barrier layer BR. The second substrate SUB2 may planarize the top of the barrier layer BR. The second substrate SUB2 may be a base substrate or a base member and may be made of an insulating material such as polymer resin. For example, the second substrate SUB2 may include, but is not limited to, polyimide (PI).

The display layer DPL may be disposed on the second substrate SUB2. The display layer DPL may include a buffer layer BF, the thin-film transistor layer TFTL, a light emitting element layer EML, a wavelength conversion layer WLCL, and a color filter layer CFL illustrated in FIG. 3.

The thin-film transistor layer TFTL may further include the second connection line CWL2 disposed on an interlayer insulating film ILD. The second connection line CWL2 may be connected to the first connection line CWL1 disposed on the barrier layer BR through a second contact hole CNT2. The second connection line CWL2 may be connected to a plurality of data lines to supply data voltages and may be connected to a plurality of scan lines to supply scan signals. For example, the second connection line CWL2 may be formed on the same layer and of the same material as connection electrodes CNE of thin-film transistors TFT, but the present disclosure is not limited thereto. For another example, the second connection line CWL2 may be formed on the same layer and of the same material as gate electrodes GE of the thin-film transistors TFT.

Each display device 10 including the first contact hole CNT1 provided in a surface of the first substrate SUB1 and the barrier layer BR and the second contact hole CNT2 provided in the second substrate SUB2, the buffer layer BF, a gate insulating layer GI and the interlayer insulating film ILD may supply a signal of the first pad part PD1 to the thin-film transistor layer TFTL using the first connection line CWL1 and the second connection line CWL2. Since each display device 10 includes multiple contact holes, a depth of each of the first and second contact holes CNT1 and CNT2 can be reduced compared with when one contact hole is formed to penetrate from the interlayer insulating film ILD to the first substrate SUB1. Therefore, in each display device 10, thicknesses of the first and second connection lines CWL1 and CWL2 respectively inserted into the first and second contact holes CNT1 and CNT2 can be reduced.

The first pad part PD1 may be disposed on the lower surface of the first substrate SUB1 and may be connected to the first connection line CWL1 exposed on the lower surface on the first substrate SUB1.

The second pad part PD2 may be disposed on the lower surface of the first substrate SUB1 and spaced apart from the first pad part PD1. The second pad part PD2 may be connected to the first pad part PD1 through a lead line LDL. The second pad part PD2 may receive various voltages or signals from the flexible film FPCB and supply the voltages or signals to the first pad part PD1, the first connection line CWL1, and the second connection line CWL2.

Figure 24:
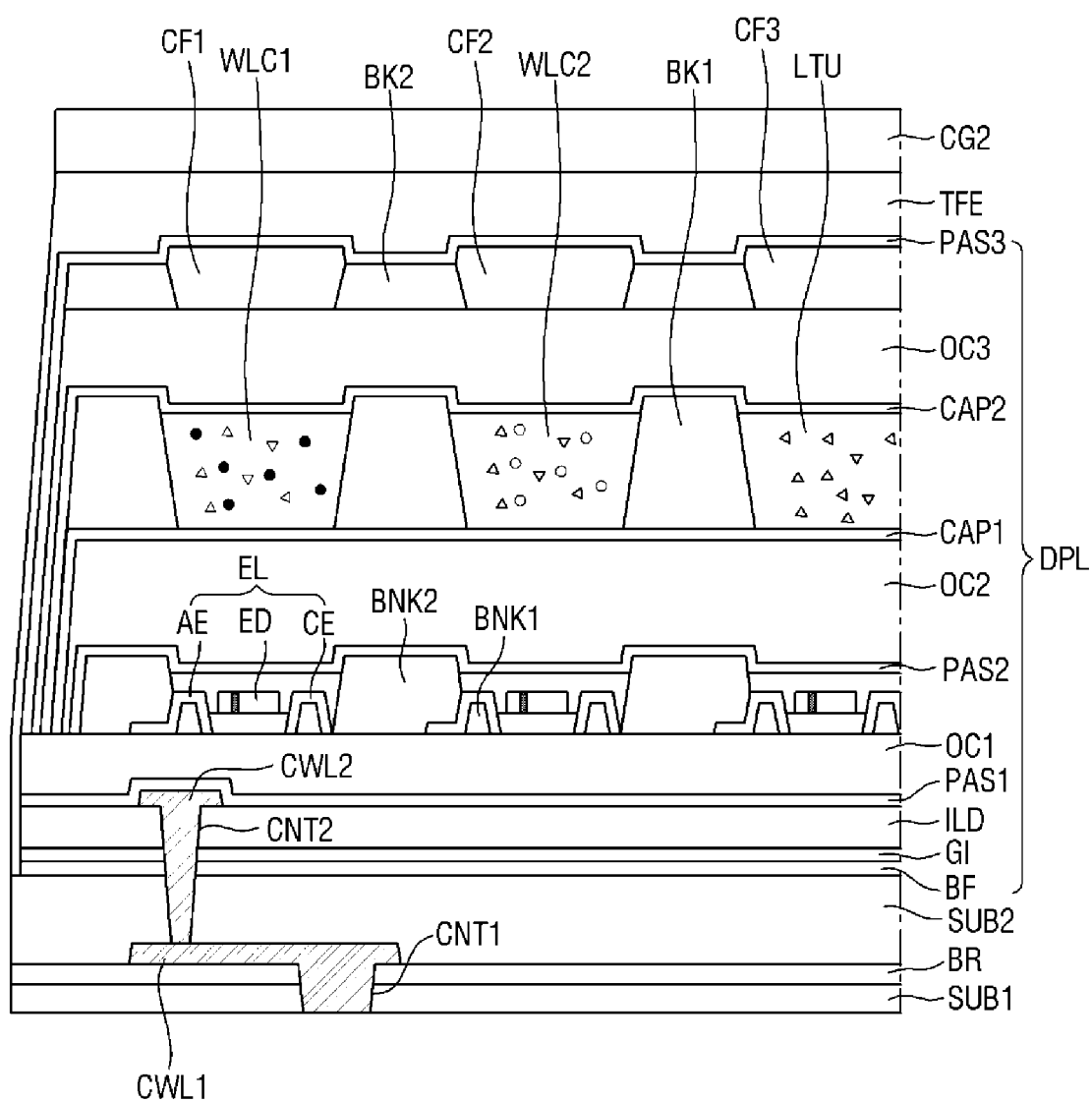
FIGS. 24 and 25 are cross-sectional views illustrating a process of manufacturing a display device of FIG. 23.
Figure 25:
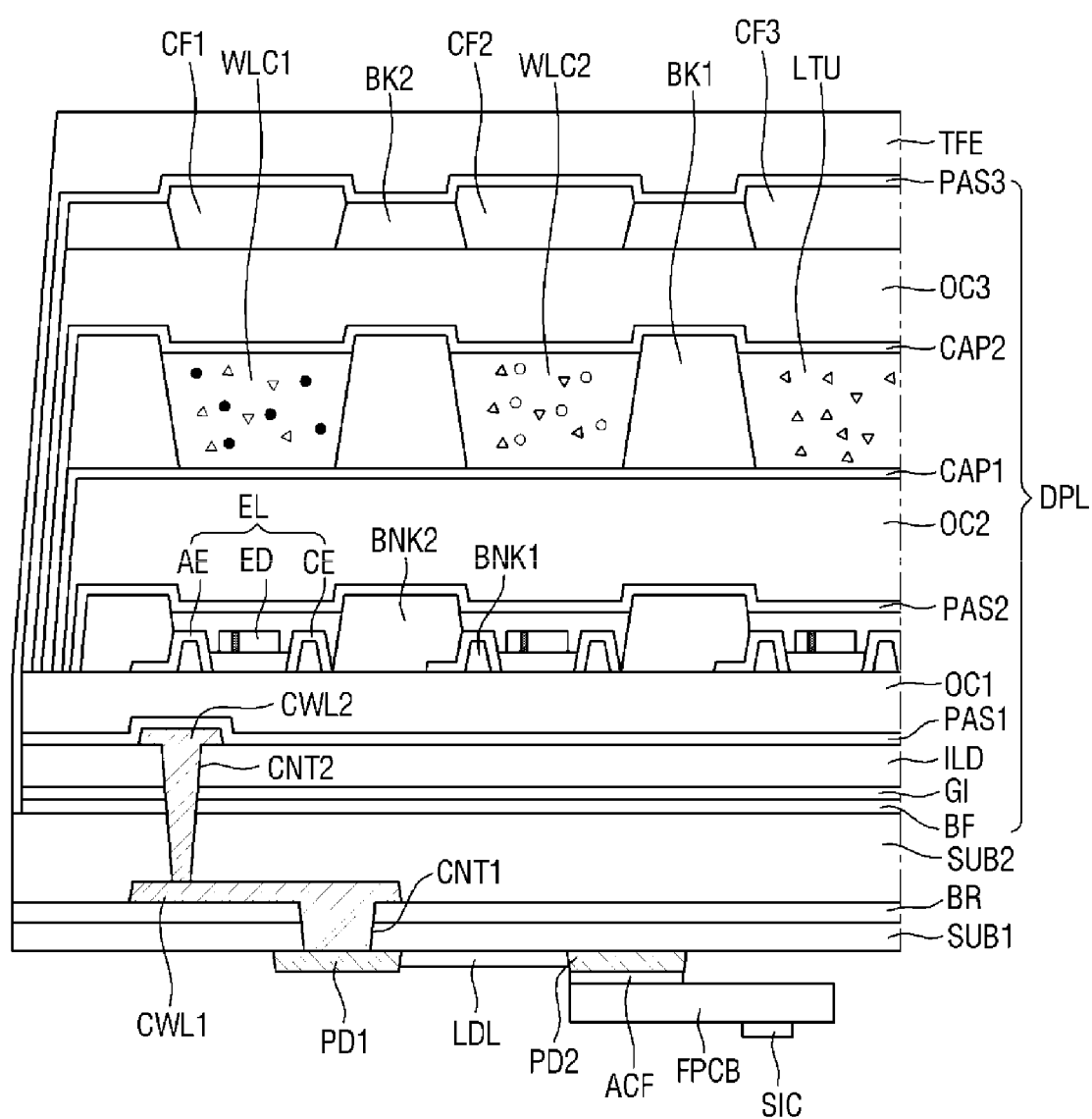

FIGS. 24 and 25 are cross-sectional views illustrating a process of manufacturing a display device of FIG. 23. The display device manufacturing process of FIG. 24 may be a process following the display device manufacturing process of FIG. 20.

In FIG. 24, a lower surface of a first substrate SUB1 may be removed until a first connection line CWL1 is exposed. The entire lower surface of the first substrate SUB1 may be etched while having a flat surface, and the first connection line CWL1 may be exposed on the lower surface of the first substrate SUB1 without an additional contact hole.

For example, the first substrate SUB1 may be etched through a dry etching process, but the present disclosure is not limited thereto. A barrier layer BR may be disposed between the first substrate SUB1 and the first connection line CWL1 to prevent damage to wirings during an etching process of the first substrate SUB1 and prevent an unnecessary short circuit between the wirings. The barrier layer BR may include an inorganic material that can prevent penetration of air or moisture.

In FIG. 25, a first pad part PD1 may be disposed on the lower surface of the first substrate SUB1 and may be connected to the first connection line CWL1 exposed on the lower surface of the first substrate SUB1.

A second pad part PD2 may be disposed on the lower surface of the first substrate SUB1 and spaced apart from the first pad part PD1. The second pad part PD2 may be connected to the first pad part PD1 through a lead line LDL. The second pad part PD2 may receive various voltages or signals from a flexible film FPCB and supply the voltages or signals to the first pad part PD1, the first connection line CWL1, and a second connection line CWL2.

Figure 26:
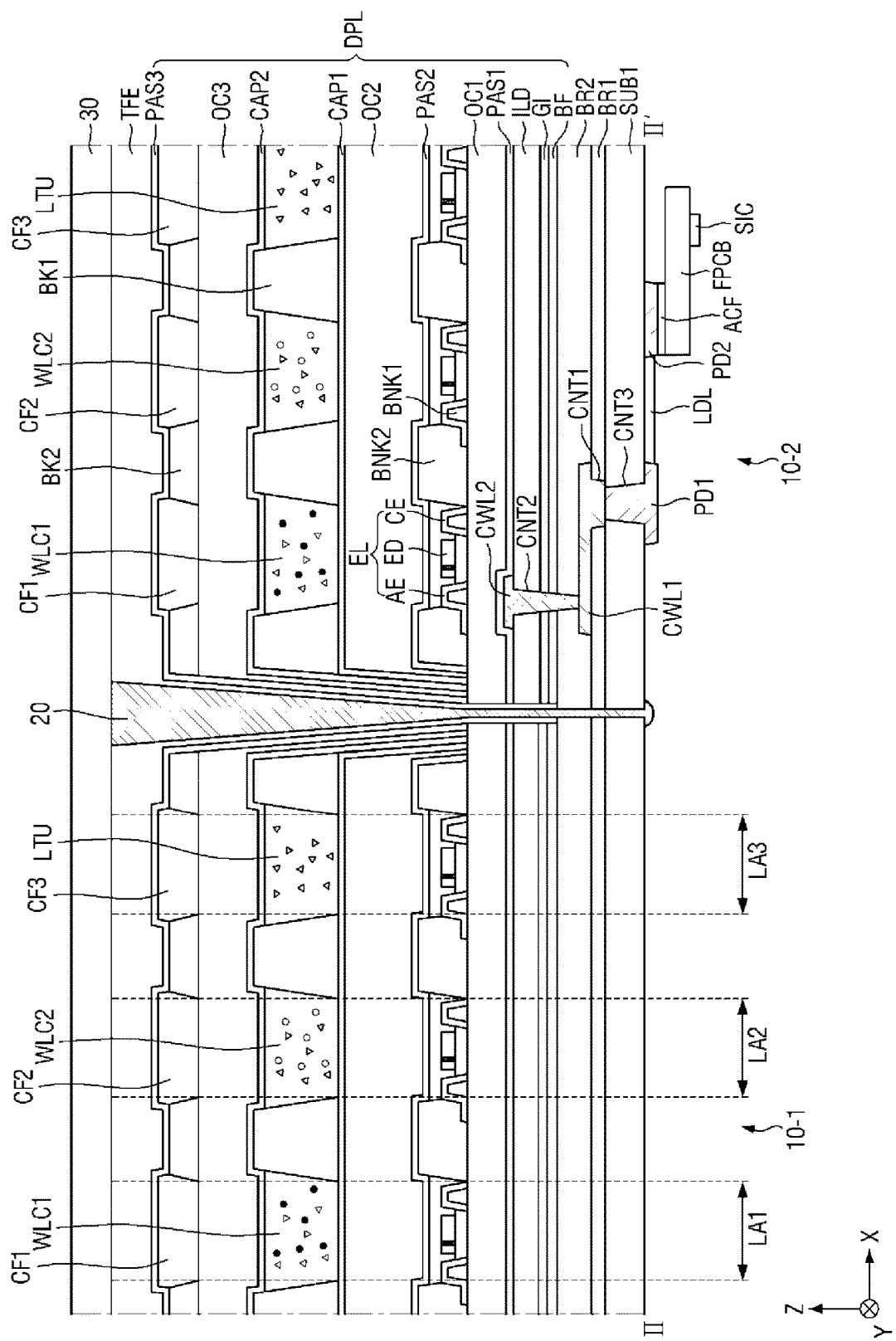
FIG. 26 is a cross-sectional view of an example taken along line II-IF of FIG. 5.

FIG. 26 is a cross-sectional view of an example taken along line II-II' of FIG. 5-A tiled display device TD of FIG. 26 is different from the tiled display device TD of FIG. 6 in a second barrier layer 13122. Thus, a description of the same elements as those described above will be given briefly or omitted.

Referring to FIG. 26, the tiled display device TD may include a plurality of display devices 10, a coupling member 20, and a cover member 30.

Each of the display devices 10 may include a first substrate SUB1, a first barrier layer BR1, a first connection line CWL1, the second barrier layer BR2, a display layer DPL, an encapsulation layer TFE, a first pad part PD1, a second pad part PD2, a flexible film FPCB, and a source driver SIC.

The first substrate SUB1 may be a base substrate or a base member and may be made of an insulating material such as polymer resin. For example, the first substrate SUB1 may include, but is not limited to, polyimide (PI).

The first substrate SUB1 may include a third contact hole CNT3 passing through the first substrate SUB1 from a lower surface of the first substrate SUB1. For example, the third contact hole CNT3 may pass through the first substrate SUB1 from the lower surface of the first substrate SUB1 to an upper surface of the first substrate SUB1. The third contact hole CNT3 may overlap a display area DA. The first pad part PD1 inserted into the third contact hole CNT3 may be disposed in the display area DA. Therefore, each display device may not include a separate pad part disposed at an outermost position, and a bezel area or a dead space of each display device 10 can be minimized. Since the first pad part PD1 is disposed on a lower surface of each display device 10, a gap between the display devices 10 can be further reduced compared with when a pad part is disposed at an outermost position on a substrate or when a flexible film is disposed on a side surface of the substrate.

The first barrier layer BR1 may be disposed on the first substrate SUB1. The first barrier layer BR1 may support the first connection line CWL1. The first barrier layer BR1 may be disposed between the first substrate SUB1 and the first connection line CWL1 to prevent damage to wirings during an etching process of the first substrate SUB1 and prevent an unnecessary short circuit between the wirings. The first barrier layer BR1 may include an inorganic material that can prevent penetration of air or moisture.

The first barrier layer BR1 may include a first contact hole CNT1 passing through the first barrier layer BR1 from an upper surface of the first barrier layer BR1. For example, the first contact hole CNT1 may pass through the first barrier layer BR1 from the upper surface of the first barrier layer BR1 to a lower surface of the first barrier layer BR1. The first contact hole CNT1 may be connected to the third contact hole CNT3 of the first substrate SUB1 and may overlap the display area DA. The first connection line CWL1 inserted into the first contact hole CNT1 may be disposed in the display area DA.

The first connection line CWL1 may be disposed on the first barrier layer BR1 and connected to the first pad part PD1 provided on the lower surface of the first substrate SUB1 through the first contact hole CNT1. The first connection line CWL1 may be inserted into the first contact hole CNT1 and connected to the first pad part PD1 inserted into the third contact hole CNT3. The first connection line CWL1 may supply an electrical signal received from the first pad part PD1 to a thin-film transistor layer TFTL through a second connection line CWL2.

The second barrier layer BR2 may cover the first connection line CWL1 and the first barrier layer BR1. The second barrier layer BR2 may planarize the top of the first barrier layer BR1. The top of the second barrier layer BR2 may be planarized through a chemical mechanical polishing (CMP) process, but the present disclosure is not limited thereto. The second barrier layer BR2 may include an inorganic material that can prevent penetration of air or moisture. For example, the second barrier layer BR2 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The display layer DPL may be disposed on the second barrier layer BR2. The display layer DPL may include a buffer layer BF, the thin-film transistor layer TFTL, a light emitting element layer EML, a wavelength conversion layer WLCL, and a color filter layer CFL illustrated in FIG. 3.

The thin-film transistor layer TFTL may further include the second connection line CWL2 disposed on an interlayer insulating film ILD. The second connection line CWL2 may be connected to the first connection line CWL1 disposed on the first barrier layer BR1 through a second contact hole CNT2. The second connection line CWL2 may be connected to a plurality of data lines to supply data voltages and may be connected to a plurality of scan lines to supply scan signals. For example, the second connection line CWL2 may be formed on the same layer and of the same material as connection electrodes CNE of thin-film transistors TFT, but the present disclosure is not limited thereto. For another example, the second connection line CWL2 may be formed on the same layer and of the same material as gate electrodes GE of the thin-film transistors TFT.

Each display device 10 including the third contact hole CNT3 provided in the first substrate SUB1, the first contact hole CNT1 provided in the first barrier layer BR1, and the second contact hole CNT2 provided in the second barrier layer BR2, the buffer layer BF, a gate insulating layer GI and the interlayer insulating film ILD may supply a signal of the first pad part PD1 to the thin-film transistor layer TFTL using the first connection line CWL1 and the second connection line CWL2. The second contact hole CNT2 may be spaced apart from the first contact hole CNT1 or the third contact hole CNT3. Since each display device includes multiple contact holes, a depth of each of the first through third contact holes CNT1, CNT2, and CNT3 can be reduced compared with when one contact hole is formed to penetrate from the interlayer insulating film ILD to the first substrate SUB1. Therefore, in each display device 10, thicknesses of the first and second connection lines CWL1 and CWL2 and the first pad part PD1 respectively inserted into the first through third contact holes CNT1, CNT2, and CNT3 can be reduced.

The first pad part PD1 may be disposed on the lower surface of the first substrate SUB1 and may be connected to the first connection line CWL1 exposed through the third contact hole CNT3. The first contact hole CNT1 through which the first connection line CWL1 passes and the third contact hole CNT3 through which the first pad part PD1 passes may be connected to each other.

The second pad part PD2 may be disposed on the lower surface of the first substrate SUB1 and spaced apart from the first pad part PD1. The second pad part PD2 may be connected to the first pad part PD1 through a lead line LDL. The second pad part PD2 may receive various voltages or signals from the flexible film FPCB and supply the voltages or signals to the first pad part PD1, the first connection line CWL1, and the second connection line CWL2.

FIGS. 27, 28, 29, 30, and 31 are cross-sectional views illustrating a process of manufacturing a display device 10 of FIG. 26.

Figure 27:
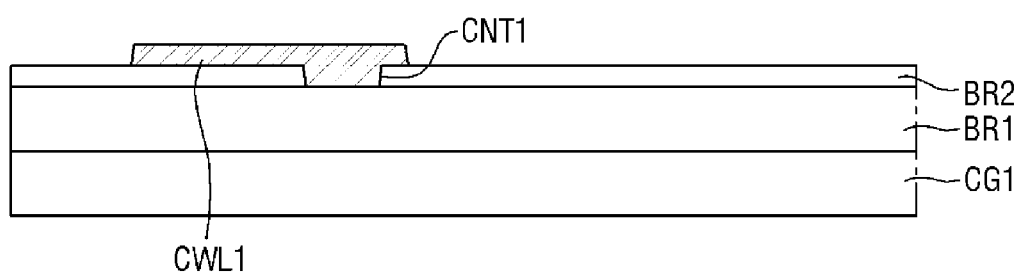
FIGS. 27, 28, 29, 30, and 31 are cross-sectional views illustrating a process of manufacturing a display device of FIG. 26.

In FIG. 27, a first substrate SUB1 may be provided on a first carrier substrate CG1. The first substrate SUB1 may include, but is not limited to, polyimide (PI). For example, the first carrier substrate CG1 may be, but is not limited to, a carrier glass. The first carrier substrate CG1 may support the first substrate SUB1 in the process of forming a display layer DPL and an encapsulation TFE on the first substrate SUB1.

A first barrier layer BR1 may be disposed on the first substrate SUB1. The first barrier layer BR1 may include an inorganic material that can prevent penetration of air or moisture. The first barrier layer BR1 may include a first contact hole CNT1 passing through the first barrier layer BR1 from an upper surface of the first barrier layer BR1. For example, the first contact hole CNT1 may pass through the first barrier layer BR1 from the upper surface of the first barrier layer BR1 to a lower surface of the first barrier layer BR1.

A first connection line CWL1 may be disposed on the first barrier layer BR1 and inserted into the first contact hole CNT1. For example, the first connection line CWL1 may be formed to fill the first contact hole CNT1 through an inkjet process, a cutting process, or a plating process.

Figure 28:
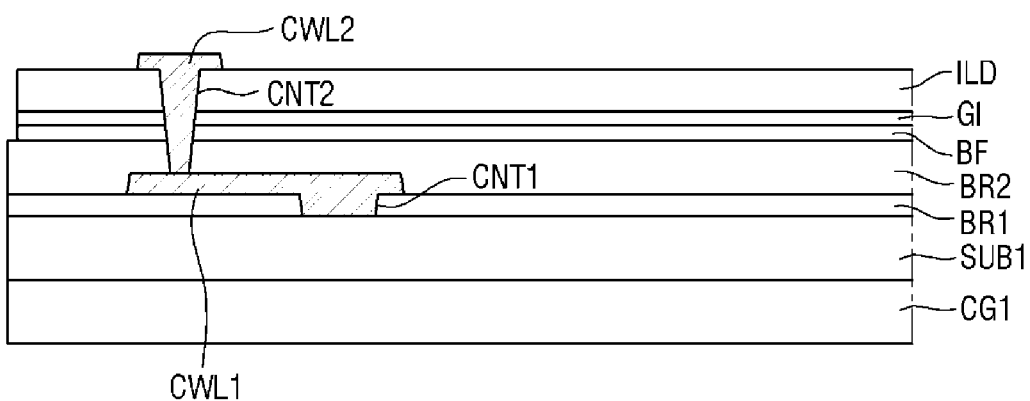

In FIG. 28, a second barrier layer BR2 may cover the first connection line CWL1 and the first barrier layer BR1. The second barrier layer BR2 may planarize the top of the first barrier layer BR1. The top of the second barrier layer BR2 may be planarized through a CMP process, but the present disclosure is not limited thereto. The second barrier layer BR2 may include an inorganic material that can prevent penetration of air or moisture.

A buffer layer BF may be disposed on the planarized second barrier layer BR2. A gate insulating layer GI and an interlayer insulating film ILD may be sequentially stacked on the buffer layer BF.

A second contact hole CNT2 may be formed to pass through the interlayer insulating film ILD, the gate insulating layer GI, the buffer layer BF, and the second barrier layer BR2. The second contact hole CNT2 may be spaced apart from the first contact hole CNT1.

A second connection line CWL2 may be disposed on the interlayer insulating film ILD and may be connected to the first connection line CWL1 disposed on the first barrier layer BR1 through the second contact hole CNT2. For example, the second connection line CWL2 may be formed on the same layer and of the same material as connection electrodes CNE of thin-film transistors TFT, but the present disclosure is not limited thereto.

For another example, the second connection line CWL2 may be formed on the same layer and of the same material as gate electrodes GE of the thin-film transistors TFT. When the second connection line CWL2 is disposed on the same layer as the gate electrodes GE, it may be disposed on the gate insulating layer GI.

Figure 29:
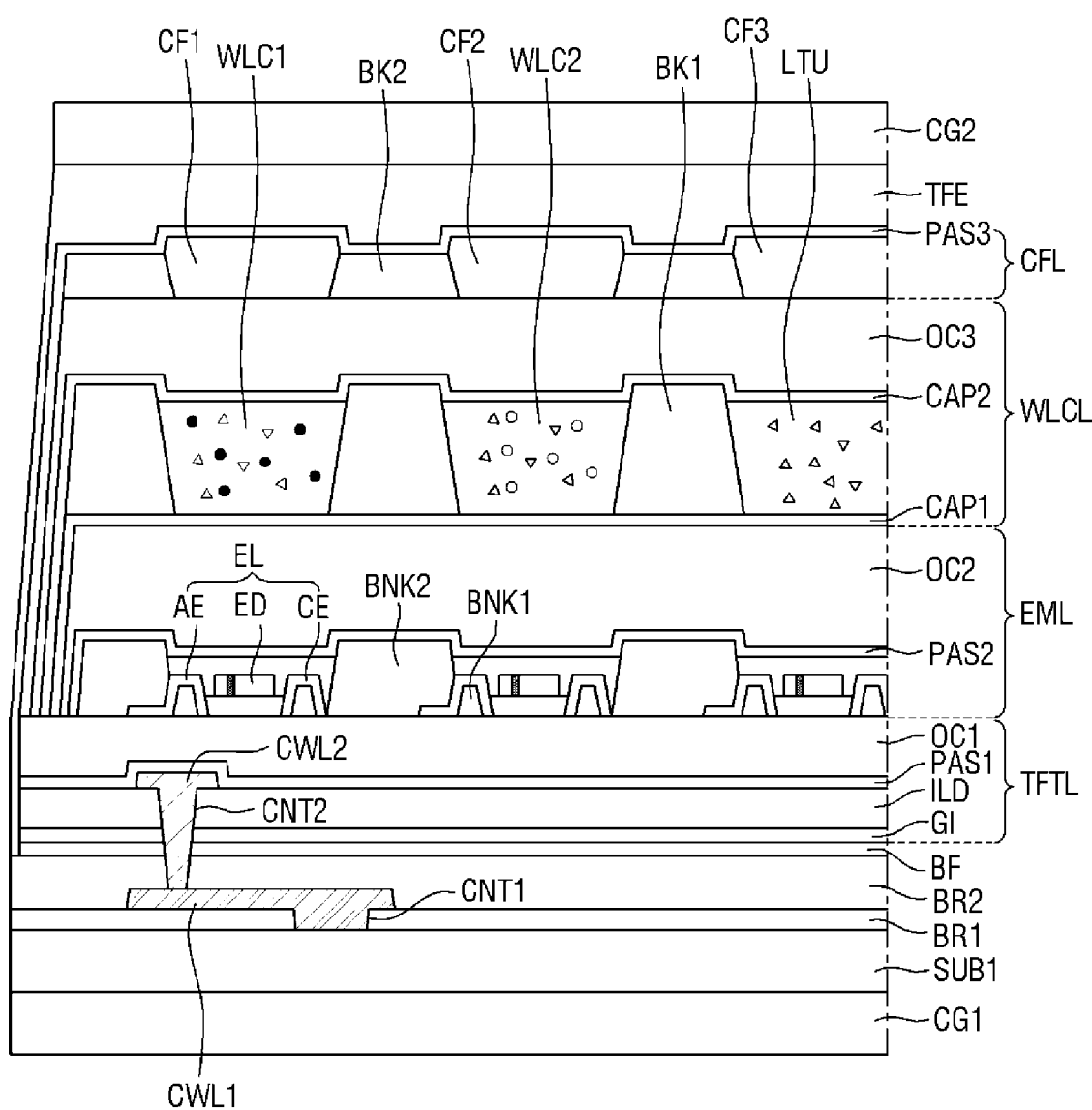

In FIG. 29, a first passivation layer PAS1 may cover the second connection line CWL2 and the interlayer insulating film ILD, and a first planarization layer OC1 may cover the first passivation layer PAS1.

A light emitting element layer EML, a wavelength conversion layer WLCL, a color filter layer CFL, and the encapsulation layer TFE may be sequentially stacked on a thin-film transistor layer TFTL.

A second carrier substrate CG2 may be disposed on the encapsulation layer TFE. For example, the second carrier substrate CG2 may be, but is not limited to, a carrier glass. The second carrier substrate CG2 may support the display device 10 in the process of forming a first pad part PD1 on a lower surface of the first substrate SUB1. After the second carrier substrate CG2 is disposed, the display device being manufactured may be inverted. Accordingly, the second carrier substrate CG2 may support the display device, and the first carrier substrate CG1 may be exposed. The first carrier substrate CG1 may be removed after the stacking of the display layer DPL and the encapsulation layer TFE is completed.

Figure 30:
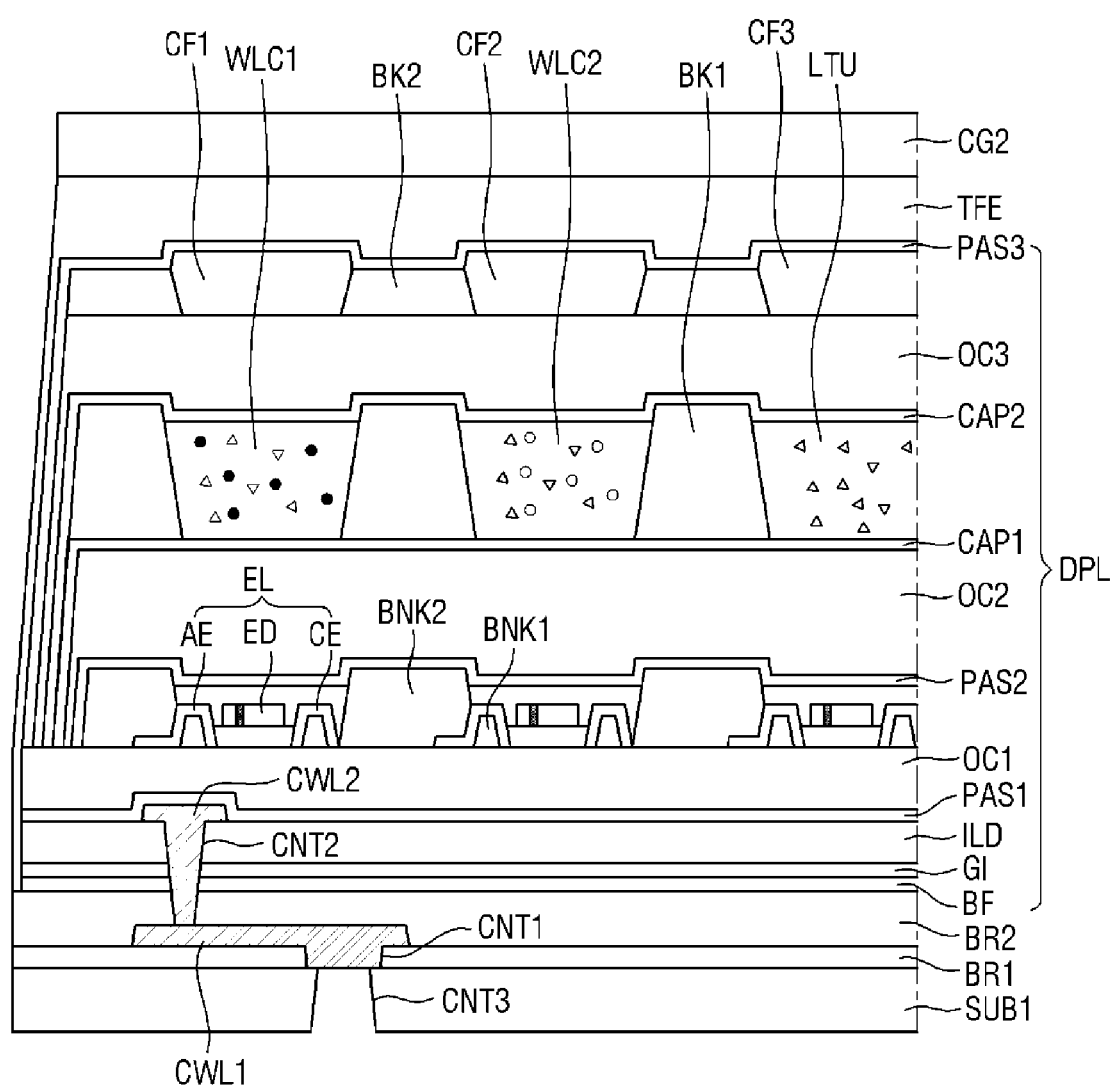

In FIG. 30, a third contact hole CNT3 may be formed to pass through the first substrate SUB1 from the lower surface of the first substrate SUB1. The third contact hole CNT3 may be connected to the first contact hole CNT1. The first connection line CWL1 inserted into the first contact hole CNT1 may be exposed by the third contact hole CNT3.

For example, the third contact hole CNT3 may be formed by removing a lower part of the first substrate SUB1 through a laser etching process, but the present disclosure is not limited thereto. In the display device 10, a plurality of third contact holes CNT3 respectively corresponding to a plurality of first pad parts PD1 may be precisely formed using the laser etching process.

For another example, the third contact hole CNT3 may be formed by removing the lower part of the first substrate SUB1 through a dry etching process. In the display device 10, the third contact hole CNT3 corresponding to at least some of a plurality of first pad parts PD1 may be formed using the dry etching process. The third contact hole CNT3 may be etched using a process gas and high-frequency power that meet etching characteristics of the first substrate SUB1. The third contact hole CNT3 may be etched by physical or chemical reaction of electrons or ions generated in a plasma state of the process gas with the first substrate SUB1.

Figure 31:
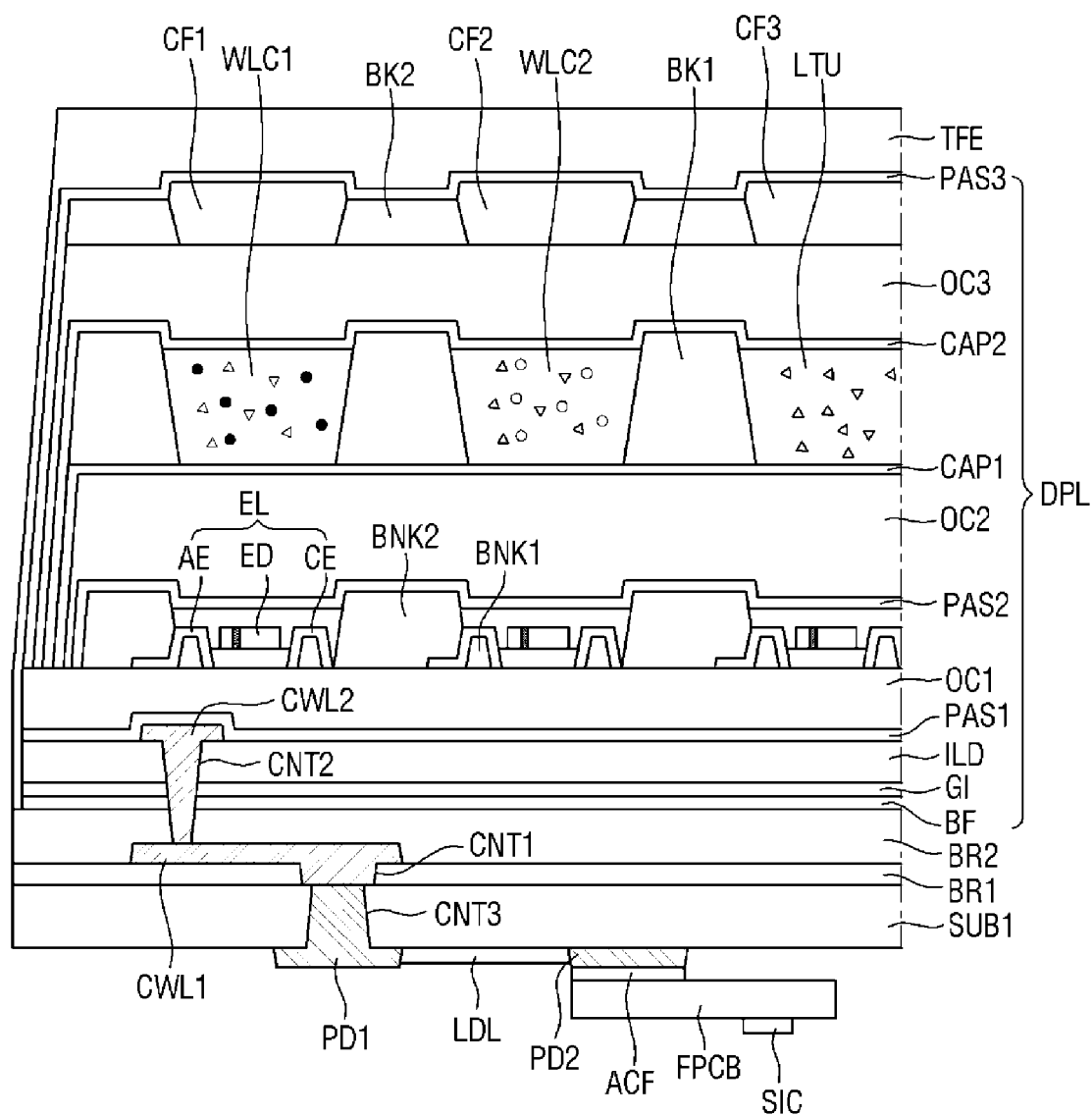

In FIG. 31, the first pad part PD1 may be disposed on the lower surface of the first substrate SUB1 and may be connected to the first connection line CWL1 exposed through the third contact hole CNT3.

A second pad part. PD2 may be disposed on the lower surface of the first substrate SUB1 and spaced apart from the first pad part PD1, The second pad part PD2 may be connected to the first pad part PD1 through a lead line LDL. The second pad part PD2 may receive various voltages or signals from a flexible film FPCB and supply the voltages or signals to the first pad part PD1, the first connection line CWL1, and the second connection line CWL2.

The flexible film FPCB may be disposed on the lower surface of the first substrate SUB1. A side of the flexible film FPCB may be connected to the second pad part PD2, and the other side of the flexible film FPCB may be connected to a source circuit board (not illustrated) on the lower surface of the first substrate SUB1. The flexible film FPCB may transmit signals of a source driver SIC to the display device 10.

Figure 32:
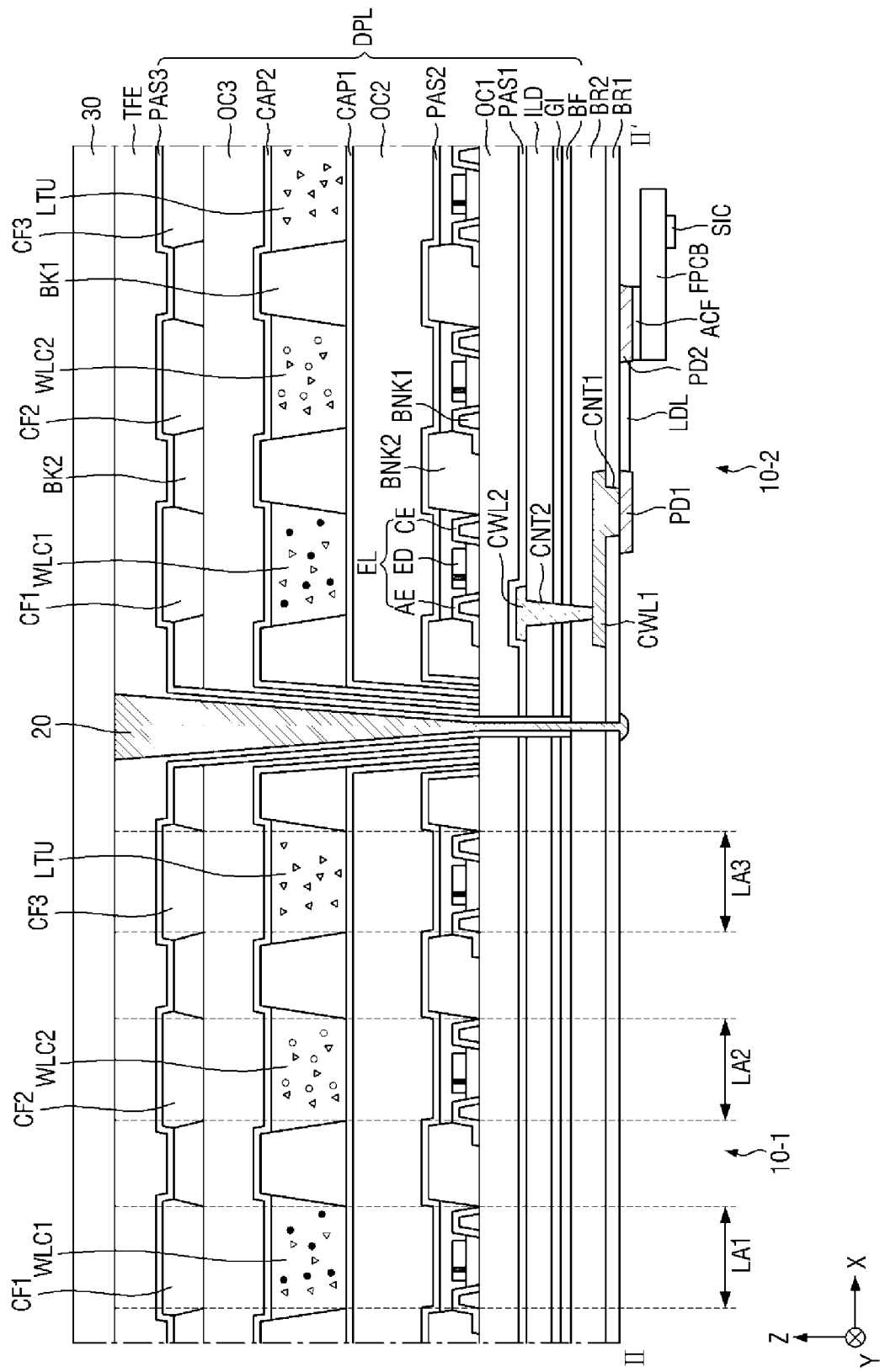
FIG. 32 is a cross-sectional view of an example taken along II-II' of FIG. 5.

FIG. 32 is a cross-sectional view of an example taken along line II-IF of FIG. 5. A tiled display device TD of FIG. 32 is different from the tiled display device TD of FIG. 26 in a first substrate SUB1. Thus, a description of the same elements as those described above will be given briefly or omitted.

Referring to FIG. 32, the tiled display device TD may include a plurality of display devices 10, a coupling member 20, and a cover member 30.

Each of the display devices 10 may include a first barrier layer BR1, a first connection line CWL1, a second barrier layer BR2, a display layer DPL, an encapsulation layer TFE, a first pad part PD1, a second pad part PD2, a flexible film FPCB, and a source driver SIC.

The first barrier layer BR1 may support the first connection line CWL1. The first barrier layer BR1 may be disposed between the first pad part PD1 and the first connection line CWL1 to prevent damage to wirings during an etching process and prevent an unnecessary short circuit between the wirings. The first barrier layer BR1 may include an inorganic material that can prevent penetration of air or moisture.

The first barrier layer BR1 may include a first contact hole CNT1 passing through the first barrier layer BR1 from an upper surface of the first barrier layer BR1. For example, the first contact hole CNT1 may pass through the first barrier layer BR1 from the upper surface of the first barrier layer BR1 to a lower surface of the first barrier layer BR1. The first contact hole CNT1 may overlap a display area DA. The first connection line CWL1 inserted into the first contact hole CNT1 may be disposed in the display area DA.

The first connection line CWL1 may be disposed on the first barrier layer BR1 and connected to the first pad part PD1 provided on the lower surface of the first barrier layer BR1 through the first contact hole CNT1. The first connection line CWL1 may supply an electrical signal received from the first pad part PD1 to a thin-film transistor layer TFTL through a second connection line CWL2.

The second barrier layer BR2 may cover the first connection line CWL1 and the first barrier layer BR1. The second barrier layer BR2 may planarize the top of the first barrier layer BR1. The second barrier layer BR2 may include an inorganic material that can prevent penetration of air or moisture. For example, the second barrier layer BR2 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The display layer DPL may be disposed on the second barrier layer BR2. The display layer DPL may include a buffer layer BF, the thin-film transistor layer TFTL, a light emitting element layer EML, a wavelength conversion layer WLCL, and a color filter layer CFL illustrated in FIG. 3.

The thin-film transistor layer TFTL may further include the second connection line CWL2 disposed on an interlayer insulating film ILD. The second connection line CWL2 may be connected to the first connection line CWL1 disposed on the first barrier layer BR1 through a second contact hole CNT2. The second connection line CWL2 may be connected to a plurality of data lines to supply data voltages and may be connected to a plurality of scan lines to supply scan signals. For example, the second connection line CWL2 may be formed on the same layer and of the same material as connection electrodes CNE of thin-film transistors TFT, but the present disclosure is not limited thereto. For another example, the second connection line CWL2 may be formed on the same layer and of the same material as gate electrodes GE of the thin-film transistors TFT.

The first pad part PD1 may be disposed on the lower surface of the first barrier layer BR1 and may be connected to the first connection line CWL1 exposed on the lower surface of the first barrier layer BR1. The first pad part PD1 may be disposed in the display area DA. Therefore, each display device 10 may not include a separate pad part disposed at an outermost position, and a bezel area or a dead space of each display device 10 can be minimized. Since the first pad part PD1 is disposed on a lower surface of each display device 10, a gap between the display devices 10 can be further reduced compared with when a pad part is disposed at an outermost position on a substrate or when a flexible film is disposed on a side surface of the substrate.

The second pad part PD2 may be disposed on the lower surface of the first barrier layer BR1 and spaced apart from the first pad part PD1. The second pad part PD2 may be connected to the first pad part PD1 through a lead line LDL. The second pad part PD2 may receive various voltages or signals from the flexible film FPCB and supply the voltages or signals to the first pad part PD1, the first connection line CWL1, and the second connection line CWL2.

Figure 33:
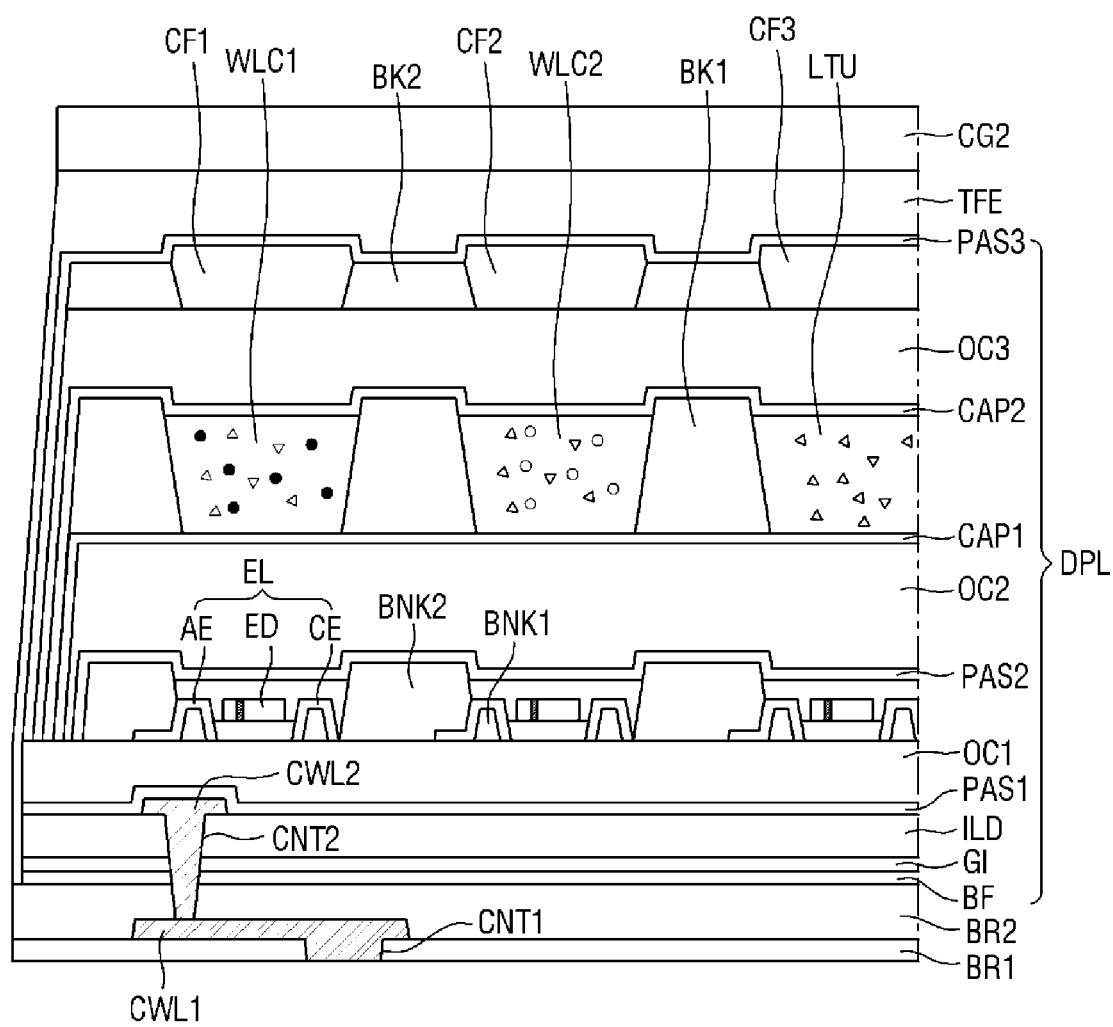
FIGS. 33 and 34 are cross-sectional views illustrating a process of manufacturing a display device of FIG. 32.
Figure 34:
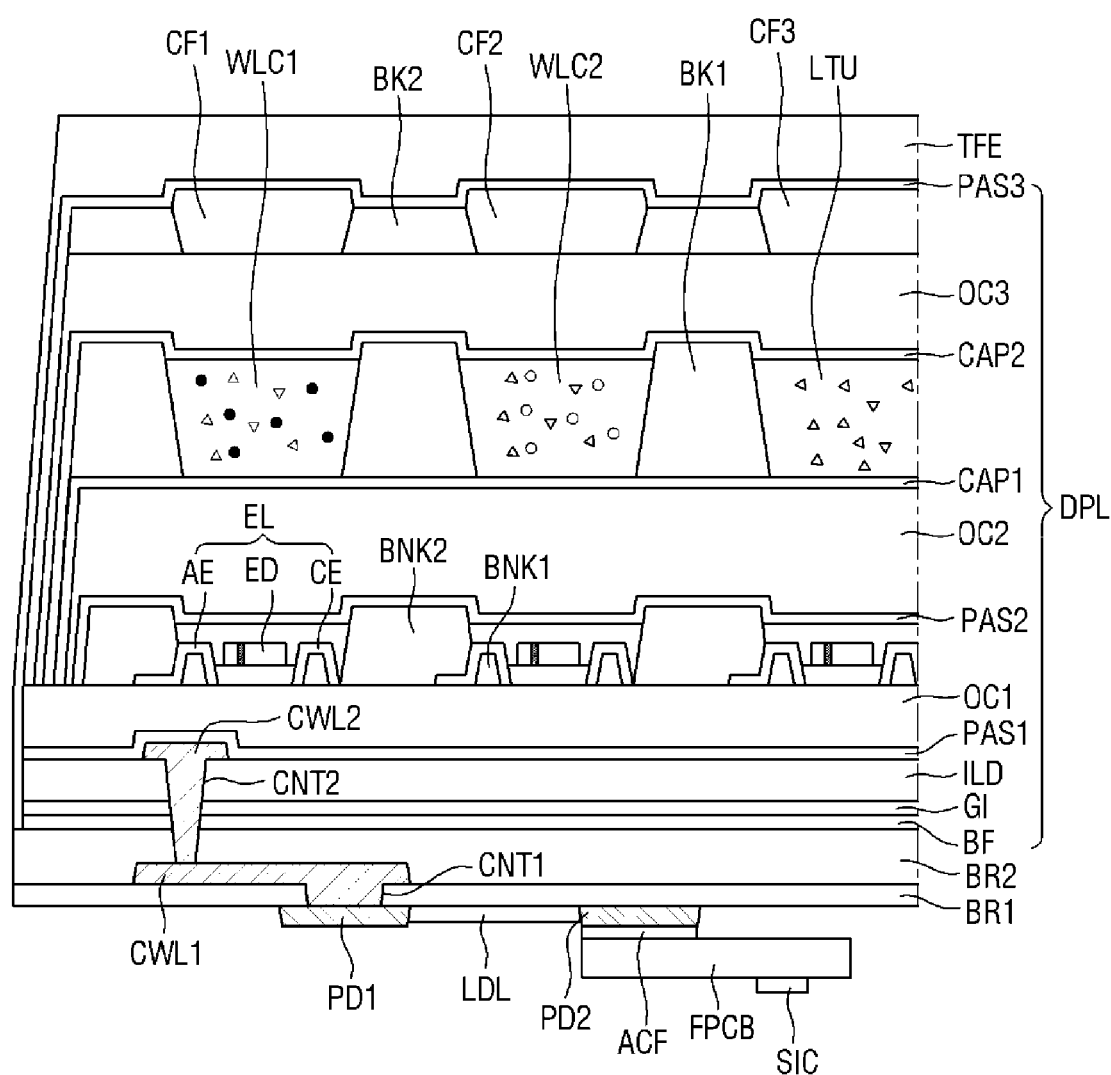

FIGS. 33 and 34 are cross-sectional views illustrating a process of manufacturing a display device of FIG. 32. The display device manufacturing process of FIG. 33 may be a process following the display device manufacturing process of FIG. 29.

In FIG. 33, a first substrate SUB1 disposed on a lower surface of a first barrier layer BR1 may be entirely removed, and a first connection line CWL1 may be exposed on the lower surface of the first barrier layer BR1. The entire lower surface of the first substrate SUB1 may be etched while having a flat surface, and the first connection line CWL1 may be exposed on the lower surface of the first barrier layer BR1 without an additional contact hole.

For example, the first substrate SUB1 may be etched through a dry etching process, but the present disclosure is not limited thereto. The first barrier layer BR1 may be disposed between the first substrate SUB1 and the first connection line CWL1 to prevent damage to wirings during an etching process of the first substrate SUB1 and prevent an unnecessary short circuit between the wirings. The first barrier layer BR1 may include an inorganic material that can prevent penetration of air or moisture.

In FIG. 34, a first pad part PD1 may be disposed on the lower surface of the first barrier layer BR1 and may be connected to the first connection line CWL1 exposed on the lower surface of the first barrier layer BR1.

A second pad part PD2 may be disposed on the lower surface of the first barrier layer BR1 and spaced apart from the first pad part PD1. The second pad part PD2 may be connected to the first pad part PD1 through a lead line LDL. The second pad part PD2 may receive various voltages or signals from a flexible film FPCB and supply the voltages or signals to the first pad part PD1, the first connection line CWL1, and a second connection line CWL2.

Figure 35:
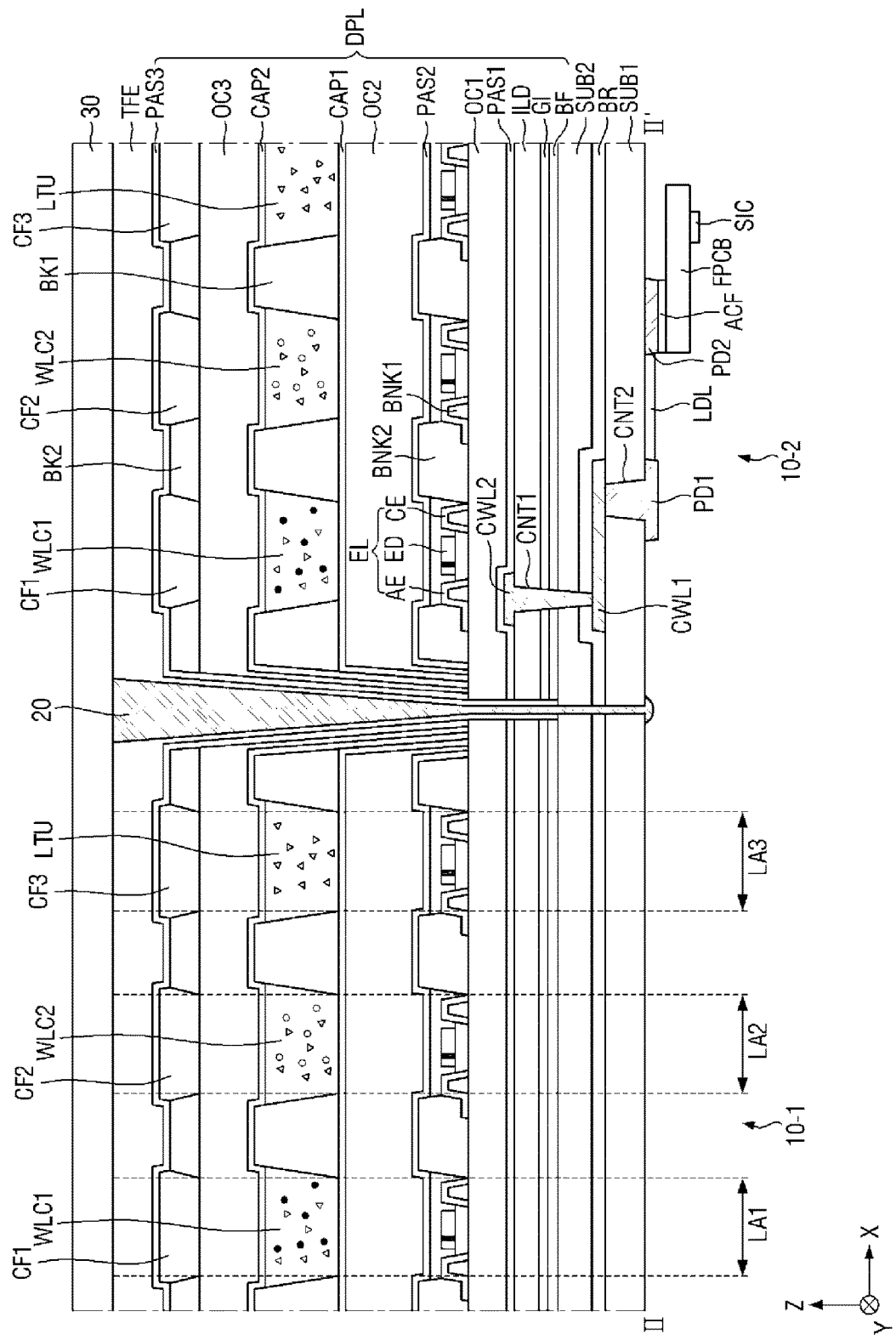
FIG. 35 is a cross-sectional view of an example taken along II-II' of FIG. 5.

FIG. 35 is a cross-sectional view of an example taken along line of FIG. 5. A tiled display device TD of FIG. 35 is different from the tiled display device TD of FIG. 6 in the configuration of a first connection line CWL1 and a barrier layer BR. Thus, a description of the same elements as those described above will be given briefly or omitted.

Referring to FIG. 35, the tiled display device TD may include a plurality of display devices 10, a coupling member 20, and a cover member 30.

Each of the display devices 10 may include a first substrate SUB1, the first connection line CWL1, the barrier layer BR, a second substrate SUB2, a display layer DPL, an encapsulation layer TFE, a first pad part PD1, a second pad part PD2, a flexible film FPCB, and a source driver SIC.

The first substrate SUB1 may be a base substrate or a base member and may be made of an insulating material such as polymer resin. For example, the first substrate SUB1 may be a flexible substrate that can be bent, folded, rolled, etc. The first substrate SUB1 may include, but is not limited to, polyimide (PI).

The first substrate SUB1 may include a second contact hole CNT2 passing through the first substrate SUB1 from a lower surface of the first substrate SUB1. For example, the second contact hole CNT2 may pass through the first substrate SUB1 from the lower surface of the first substrate SUB1 to an upper surface of the first substrate SUB1. The second contact hole CNT2 may overlap a display area DA. The first pad part PD1 inserted into the second contact hole CNT2 may be disposed in the display area DA. Therefore, each display device 10 may not include a separate pad part disposed at an outermost position, and a bezel area or a dead space of each display device 10 can be minimized. Since the first pad part PD1 is disposed on a lower surface of each display device 10, a gap between the display devices 10 can be further reduced compared with when a pad part is disposed at an outermost position on a substrate or when a flexible film is disposed on a side surface of the substrate.

The first connection line CWL1 may be disposed on the first substrate SUB1. The first connection line CWL1 may be disposed on the lower surface of the first substrate SUB1 and connected to the first pad part PD1 inserted into the second contact hole CNT2. The first connection line CWL1 may supply an electrical signal received from the first pad part PD1 to a thin-film transistor layer TFTL through a second connection line CWL2.

The barrier layer BR may cover the first connection line CWL1 and the first substrate SUB1. The barrier layer BR may include an inorganic material that can prevent penetration of air or moisture. For example, the barrier layer BR may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The second substrate SUB2 may be disposed on the barrier layer BR. The second substrate SUB2 may planarize the top of the barrier layer BR. The second substrate SUB2 may be a base substrate or a base member and may be made of an insulating material such as polymer resin. For example, the second substrate SUB2 may include, but is not limited to, polyimide (PI).

The display layer DPL may be disposed on the second substrate SUB2. The display layer DPL may include a buffer layer BF, the thin-film transistor layer TFTL, a light emitting element layer EML, a wavelength conversion layer WLCL, and a color filter layer CFL illustrated in FIG. 3.

The thin-film transistor layer TFTL may further include the second connection line CWL2 disposed on an interlayer insulating film ILD. The second connection line CWL2 may be connected to the first connection line CWL1 disposed on the first substrate SUB1 through a second contact hole CNT2. The second connection line CWL2 may be connected to a plurality of data lines to supply data voltages and may be connected to a plurality of scan lines to supply scan signals. For example, the second connection line CWL2 may be formed on the same layer and of the same material as connection electrodes CNE of thin-film transistors TFT, but the present disclosure is not limited thereto. For another example, the second connection line CWL2 may be formed on the same layer and of the same material as gate electrodes GE of the thin-film transistors TFT.

Each display device 10 including the second contact hole CNT2 provided in the first substrate SUB1 and a first contact hole CNT1 provided in the barrier layer BR, the second substrate SUB2, the buffer layer BF, a gate insulating layer GI and the interlayer insulating film ILD may supply a signal of the first pad part PD1 to the thin-film transistor layer TFTL using the first connection line CWL1 and the second connection line CWL2. Since each display device 10 includes multiple contact holes, a depth of each of the first and second contact holes CNT1 and CNT2 can be reduced compared with when one contact hole is formed to penetrate from the interlayer insulating film ILD to the first substrate SUB1. Therefore, in each display device 10, thicknesses of the second connection line CWL2 and the first pad part PD1 respectively inserted into the first and second contact holes CNT1 and CNT2 can be reduced.

In addition, in the tiled display device TD of FIG. 35, the first connection line CWL1 is directly disposed on the first substrate SUB1. Therefore, the number of contact holes is reduced compared with the tiled display device TD of FIG. 6, thereby simplifying the manufacturing process.

The first pad part PD1 may be disposed on the lower surface of the first substrate SUB1 and may be connected to the first connection line CWL1 exposed through the second contact hole CNT2. The first contact hole CNT1 through which the second connection line CWL2 passes and the second contact hole CNT2 through which the first pad part PD1 passes may be connected to each other.

The second pad part PD2 may be disposed on the lower surface of the first substrate SUB1 and spaced apart from the first pad part PD1. The second pad part PD2 may be connected to the first pad part PD1 through a lead line LDL. The second pad part PD2 may receive various voltages or signals from the flexible film FPCB and supply the voltages or signals to the first pad part PD1, the first connection line CWL1, and the second connection line CWL2.

FIGS. 36, 37, 38, 39, and 40 are cross-sectional views illustrating a process of manufacturing a display device 10 of FIG. 35.

Figure 36:
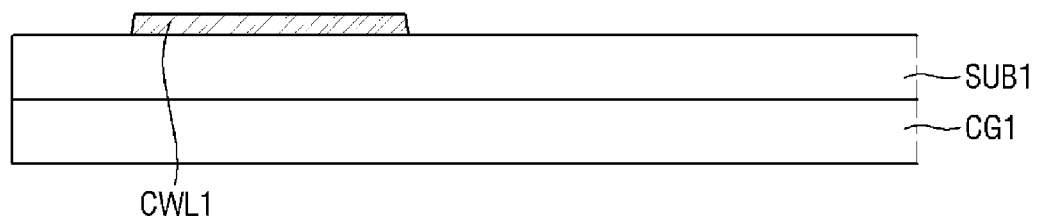
FIGS. 36, 37, 38, 39, and 40 are cross-sectional views illustrating a process of manufacturing a display device of FIG. 35.

In FIG. 36, a first substrate SUB1 may be provided on a first carrier substrate CG1. The first substrate SUB1 may include, but is not limited to, polyimide (PI). For example, the first carrier substrate CG1 may be, but is not limited to, a carrier glass. The first carrier substrate CG1 may support the first substrate SUB1 in the process of forming a display layer DPL and an encapsulation TFE on the first substrate SUB1.

A first connection line CWL1 may be disposed on the first substrate SUB1. For example, the first connection line CWL1 may be formed through an inkjet process, a cutting process, or a plating process.

Figure 37:
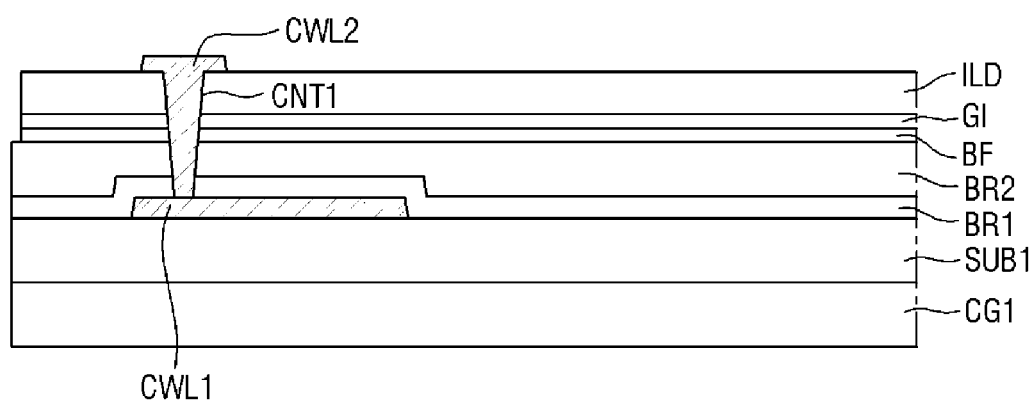

In FIG. 37, a first barrier layer BR1 may cover the first connection line CWL1 and the first substrate SUB1. The first barrier layer BR1 may include an inorganic material that can prevent penetration of air or moisture. For example, the first barrier layer BR1 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

A second barrier layer BR2 may be disposed on the first barrier layer BR1. The second barrier layer BR2 may planarize the top of the first barrier layer BR1. The second barrier layer BR2 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

A buffer layer BF may be disposed on the planarized second barrier layer BR2. A gate insulating layer GI and an interlayer insulating film ILD may be sequentially stacked on the buffer layer BF.

A first contact hole CNT1 may be formed to pass through the interlayer insulating film ILD, the gate insulating layer GI, the buffer layer BF, the second barrier layer BR2, and the first barrier layer BR1.

A second connection line CWL2 may be disposed on the interlayer insulating film ILD and may be connected to the first connection line CWL1 disposed on the first substrate SUB1 through a first contact hole CNT1. For example, the second connection line CWL2 may be formed on the same layer and of the same material as connection electrodes CNE of thin-film transistors TFT, but the present disclosure is not limited thereto.

For another example, the second connection line CWL2 may be formed on the same layer and of the same material as gate electrodes GE of thin-film transistors TFT. When the second connection line CWL2 is disposed on the same layer as the gate electrodes GE, it may be disposed on the gate insulating layer GI.

Figure 38:
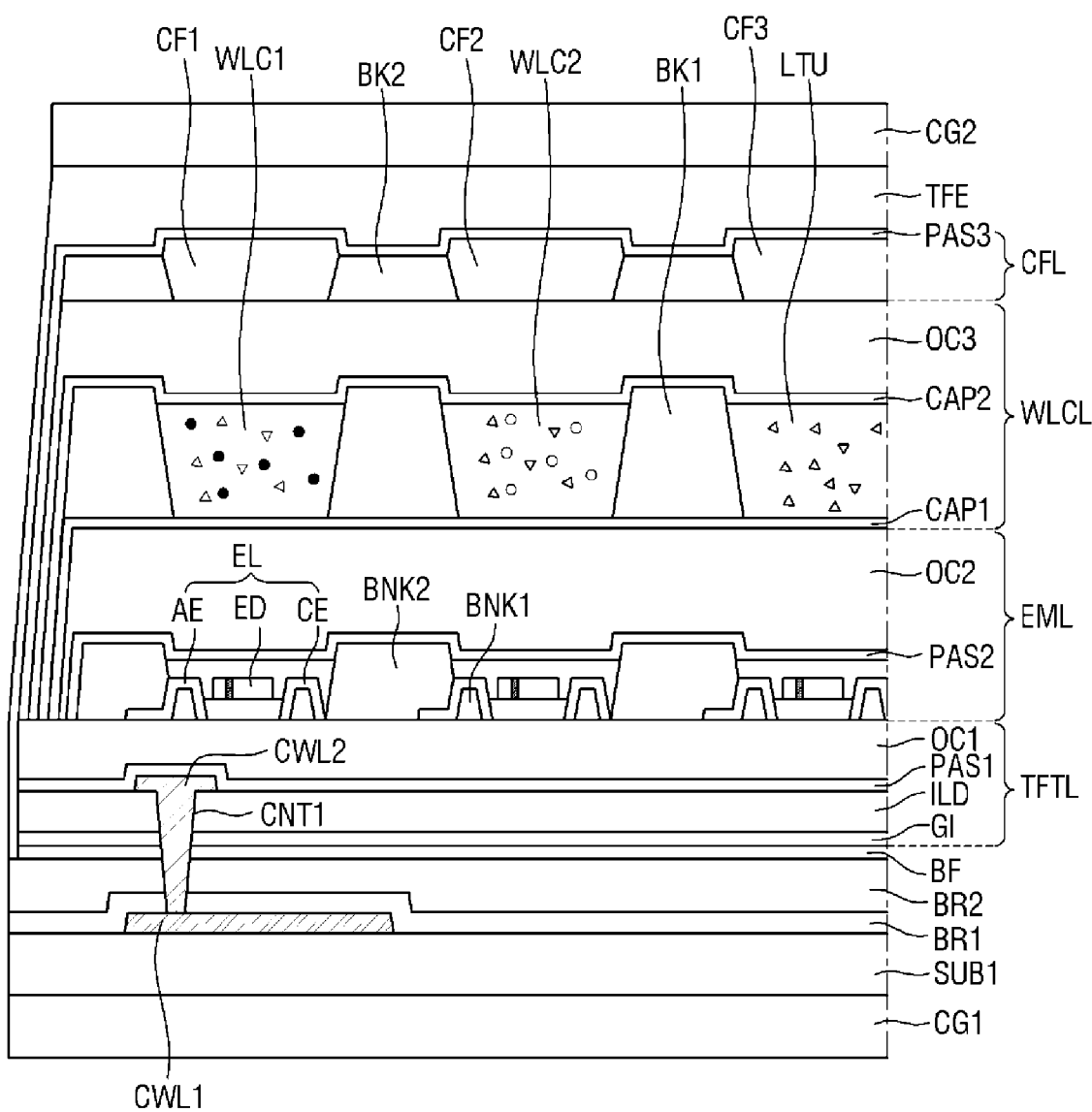

In FIG. 38, a first passivation layer PAS1 may cover the second connection line CWL2 and the interlayer insulating film ILD, and a first planarization layer OC1 may cover the first passivation layer PAS1.

A light emitting element layer EML, a wavelength conversion layer WLCL, a color filter layer CFL, and the encapsulation layer TFE may be sequentially stacked on a thin-film transistor layer TFTL.

A second carrier substrate CG2 may be disposed on the encapsulation layer TFE. For example, the second carrier substrate CG2 may be, but is not limited to, a carrier glass. The second carrier substrate CG2 may support the display device 10 in the process of forming a first pad part PD1 on a lower surface of the first substrate SUB1. After the second carrier substrate CG2 is disposed, the display device being manufactured may be inverted. Accordingly, the second carrier substrate CG2 may support the display device, and the first carrier substrate CG1 may be exposed. The first carrier substrate CG1 may be removed after the stacking of the display layer DPL and the encapsulation layer TFE is completed.

Figure 39:
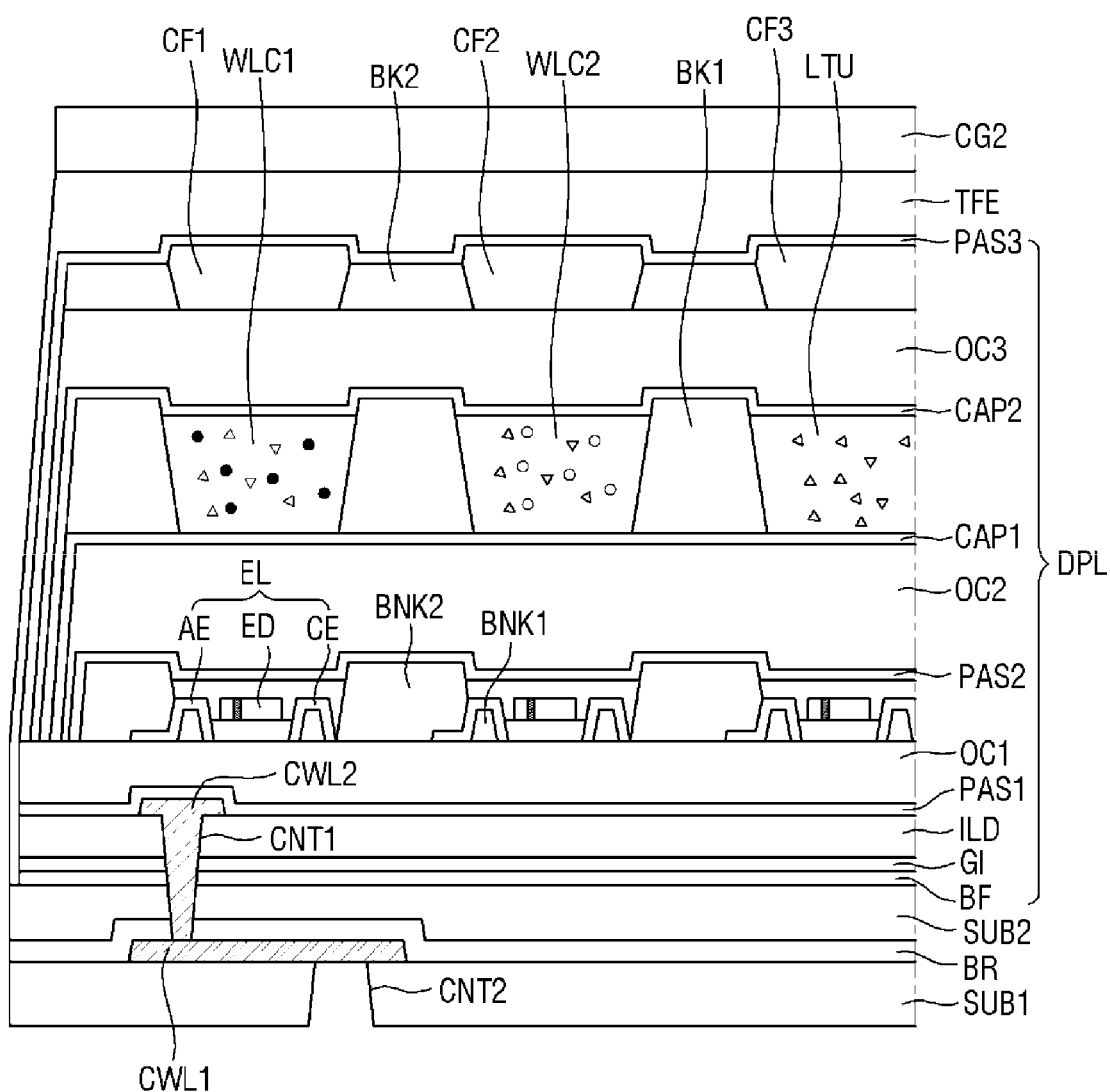

In FIG. 39, the second contact hole CNT2 may be formed to pass through the first substrate SUB1 from the lower surface of the first substrate SUB1. The first connection line CWL1 may be exposed by the second contact hole CNT2.

For example, the second contact hole CNT2 may be formed by removing a lower part of the first substrate SUB1 through a laser etching process, but the present disclosure is not limited thereto. In the display device 10, a plurality of second contact holes CNT2 respectively corresponding to a plurality of first pad parts PD1 may be precisely formed using the laser etching process.

For another example, the second contact hole CNT2 may be formed by removing the lower part of the first substrate SUB1 through a dry etching process. In the display device 10, the second contact hole CNT2 corresponding to at least some of a plurality of first pad parts PD1 may be formed using the dry etching process. The second contact hole CNT2 may be etched using a process gas and high-frequency power that meet etching characteristics of the first substrate SUB1. The second contact hole CNT2 may be etched by physical or chemical reaction of electrons or ions generated in a plasma state of the process gas with the first substrate SUB1.

Figure 40:
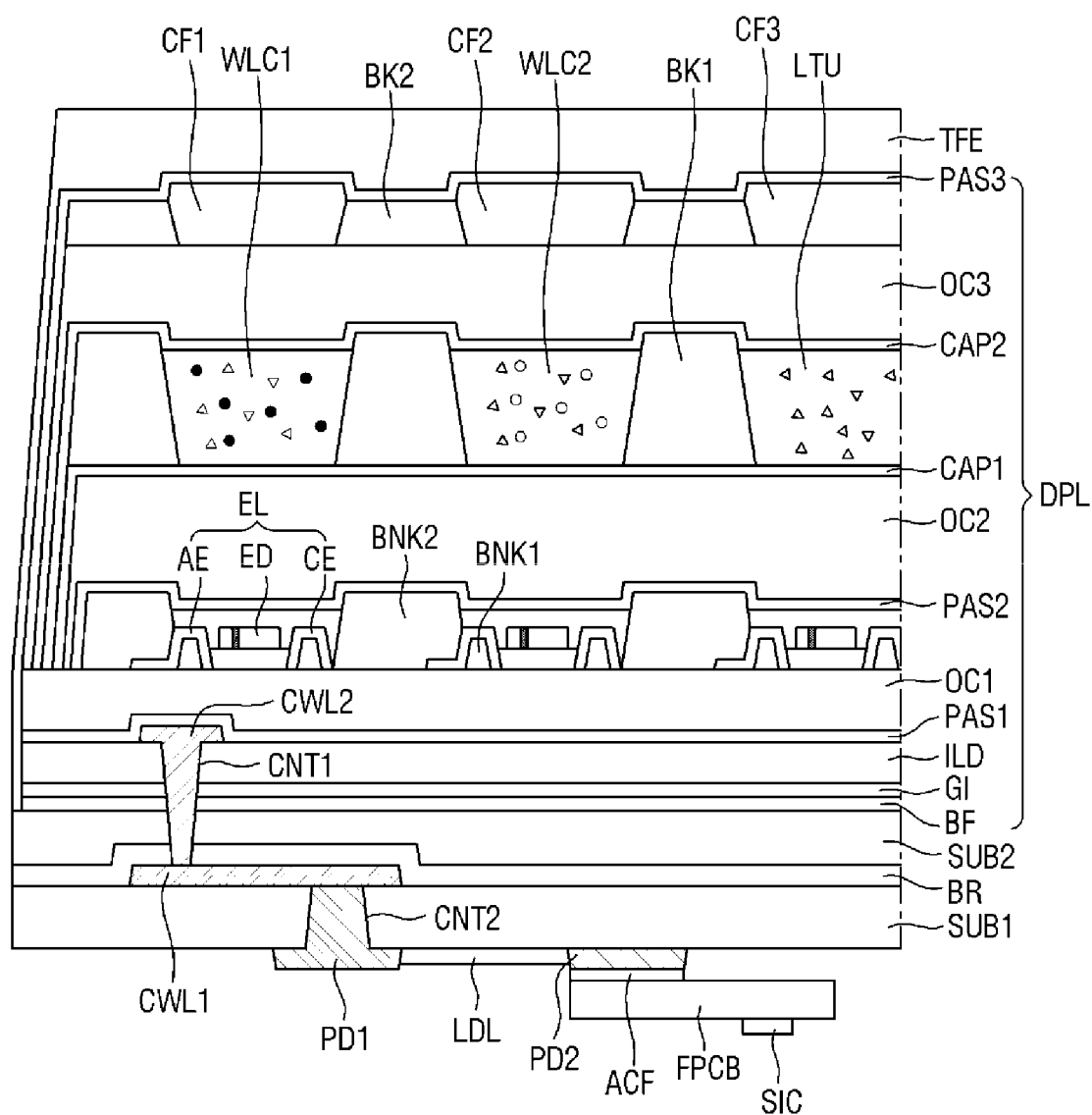

In FIG. 40, the first pad part PD1 may be disposed on the lower surface of the first substrate SUB1 and may be connected to the first connection line MLA exposed through the second contact hole CNT2.

A second pad part PD2 may be disposed on the lower surface of the first substrate SUB1 and spaced apart from the first pad part PD1. The second pad part PD2 may be connected to the first pad part PD1 through a lead line LDL. The second pad part PD2 may receive various voltages or signals from a flexible film FPCB and supply the voltages or signals to the first pad part PD1, the first connection line CWL1, and the second connection line CWL2.

Figure 41:
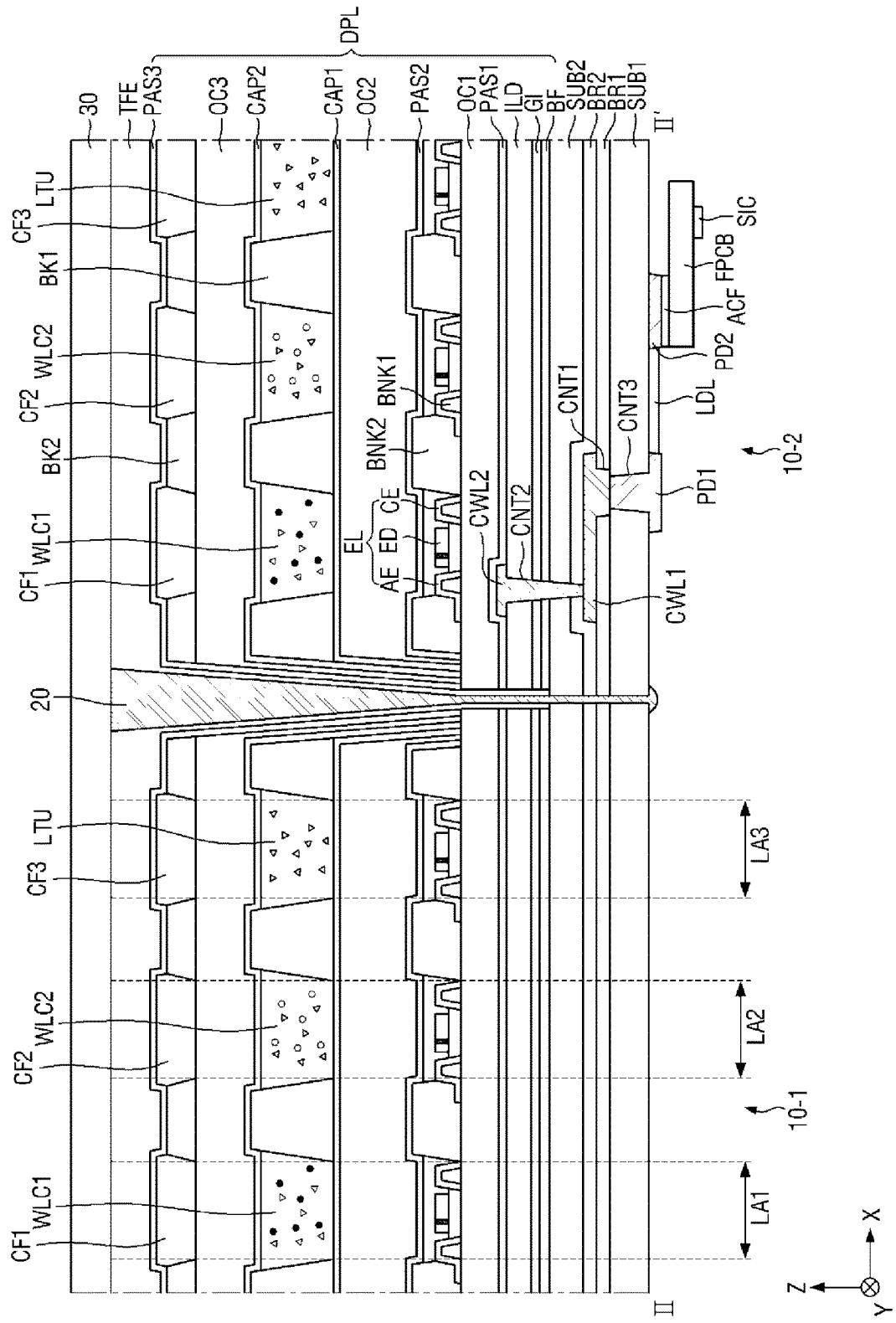
FIG. 41 is a cross-sectional view of an example taken along line II-II' of FIG. 5.

FIG. 411 is a cross-sectional view of an example taken along line IMF of FIG. 5, A tiled display device TD of FIG. 41 is different from the tiled display device TD of FIG. 6 in that it further includes a second barrier layer BR2. Thus, a description of the same elements as those described above will be given briefly or omitted.

Referring to FIG. 41, the tiled display device TD may include a plurality of display devices 10, a coupling member 20, and a cover member 30.

Each of the display devices 10 may include a first substrate SUB1, a first barrier layer BR1, a first connection line MN, the second barrier layer BR2, a second substrate SUB2, a display layer DPL, an encapsulation layer TEE, a first pad part PD1, a second pad part PD2, a flexible film FPCB and a source driver SIC.

The first substrate SUB1 may be a base substrate or a base member and may be made of an insulating material such as polymer resin. For example, the first substrate SUB1 may include, but is not limited to, polyimide (PI).

The first substrate SUB1 may include a third contact hole CNT3 passing through the first substrate SUB1 from a lower surface of the first substrate SUB1. For example, the third contact hole CNT3 may pass through the first substrate SUB1 from the lower surface of the first substrate SUB1 to an upper surface of the first substrate SUB1. The third contact hole CNT3 may overlap a display area DA. The first pad part PD1 inserted into the third contact hole CNT3 may be disposed in the display area DA. Therefore, each display device may not include a separate pad part disposed at an outermost position, and a bezel area or a dead space of each display device 10 can be minimized. Since the first pad part PD1 is disposed on a lower surface of each display device 10, a gap between the display devices 10 can be further reduced compared with when a pad part is disposed at an outermost position on a substrate or when a flexible film is disposed on a side surface of the substrate.

The first barrier layer BR1 may be disposed on the first substrate SUB1. The first barrier layer BR1 may support the first connection line CWL1. The first barrier layer BR1 may be disposed between the first substrate SUB1 and the first connection line CWL1 to prevent damage to wirings during an etching process of the first substrate SUB1 and prevent an unnecessary short circuit between the wirings. The first barrier layer BR1 may include an inorganic material that can prevent penetration of air or moisture.

The first barrier layer BR1 may include a first contact hole CNT1 passing through the first barrier layer BR1 from an upper surface of the first barrier layer BR1. For example, the first contact hole CNT1 may pass through the first barrier layer BR1 from the upper surface of the first barrier layer BR1 to a lower surface of the first barrier layer BR1. The first contact hole CNT1 may be connected to the third contact hole CNT3 of the first substrate SUB1 and may overlap the display area DA. The first connection line CWL1 inserted into the first contact hole CNT1 may be disposed in the display area DA.

The first connection line CWL1 may be disposed on the first barrier layer BR1 and connected to the first pad part PD1 provided on the lower surface of the first substrate SUB1 through the first contact hole CNT1. The first connection line CWL1 may be inserted into the first contact hole CNT1 and connected to the first pad part PD1 inserted into the third contact hole CNT3. The first connection line CWL1 may supply an electrical signal received from the first pad part PD1 to a thin-film transistor layer TFTL through a second connection line CWL2.

For example, the area of the bottom of the first connection line CWL1 may be larger than the area of the top of the first pad part PD1. In this case, the first connection line CWL1 may function as an etching stopper in the process of forming the third contact hole CNT3, thus preventing the first substrate SUB1 or the first barrier layer BR1 from being excessively etched.

The second barrier layer BR2 may cover the first connection line CWL1 and the first barrier layer BR1. The second barrier layer BR2 may include an inorganic material that can prevent penetration of air or moisture. For example, the second barrier layer BR2 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The second substrate SUB2 may be disposed on the second barrier layer BR2. The second substrate SUB2 may planarize the top of the second barrier layer BR2. The second substrate SUB2 may be a base substrate or a base member and may be made of an insulating material such as polymer resin. For example, the second substrate SUB2 may include, but is not limited to, polyimide (PI).

The display layer DPL may be disposed on the second substrate SUB2. The display layer DPL may include a buffer layer BF, the thin-film transistor layer TFTL, a light emitting element layer EML, a wavelength conversion layer WLCL, and a color filter layer CFL illustrated in FIG. 3.

The thin-film transistor layer TFTL may further include the second connection line CWL2 disposed on an interlayer insulating film ILD. The second connection line CWL2 may be connected to the first connection line CWL1 disposed on the first barrier layer BR1 through a second contact hole CNT2. The second connection line CWL2 may be connected to a plurality of data lines to supply data voltages and may be connected to a plurality of scan lines to supply scan signals. For example, the second connection line CWL2 may be formed on the same layer and of the same material as connection electrodes CNE of thin-film transistors TFT, but the present disclosure is not limited thereto. For another example, the second connection line CWL2 may be formed on the same layer and of the same material as gate electrodes GE of the thin-film transistors TFT.

Each display device 10 including the third contact hole CNT3 provided in the first substrate SUB1, the first contact hole CNT1 provided in the first barrier layer BR1, and the second contact hole CNT2 provided in the second barrier layer BR2, the second substrate SUB2, the buffer layer BF, a gate insulating layer GI and the interlayer insulating film ILD may supply a signal of the first pad part PD1 to the thin-film transistor layer TFTL using the first connection line CWL1 and the second connection line CWL2. The second contact hole CNT2 may be spaced apart from the first contact hole CNT1 or the third contact hole CNT3. Since each display device 10 includes multiple contact holes, a depth of each of the first through third contact holes CNT1 through CNT3 can be reduced compared with when one contact hole is formed to penetrate from the interlayer insulating film ILD to the first substrate SUB1. Therefore, in each display device 10, thicknesses of the first and second connection lines CWL1 and CWL2 and the first pad part PD1 respectively inserted into the first through third contact holes CNT1 through CNT3 can be reduced.

In addition, since the tiled display device TD of FIG. 41 includes the first barrier layer BR1 supporting the first connection line CWL1 and the second barrier layer BR2 covering the first connection line CWL1, process stability of the first connection line CWL1 can be improved, and an unnecessary short circuit between wirings can be prevented.

The first pad part PD1 may be disposed on the lower surface of the first substrate SUB1 and may be connected to the first connection line CWL1 exposed through the third contact hole CNT3. The first contact hole CNT1 through which the first connection line CWL1 passes and the third contact hole CNT3 through which the first pad part PD1 passes may be connected to each other.

The second pad part PD2 may be disposed on the lower surface of the first substrate SUB1 and spaced apart from the first pad part PD1. The second pad part PD2 may be connected to the first pad part PD1 through a lead line LDL. The second pad part PD2 may receive various voltages or signals from the flexible film FPCB and supply the voltages or signals to the first pad part PD1, the first connection line CWL1, and the second connection line CWL2.

FIGS. 42, 43, 44, 45, and 46 are cross-sectional views illustrating a process of manufacturing a display device 10 of FIG. 41.

Figure 42:
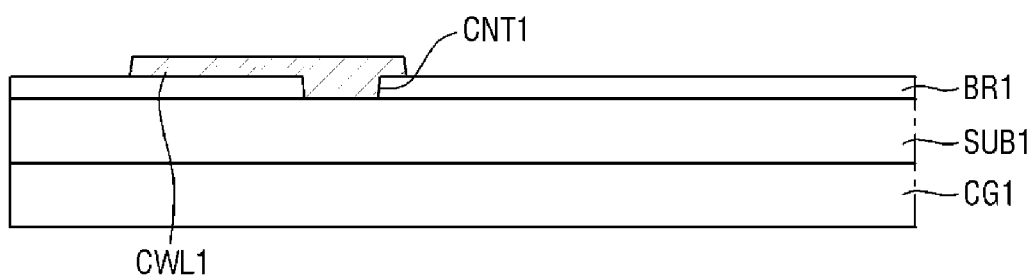
FIGS. 42, 43, 44, 45, and 46 are cross-sectional views illustrating a process of manufacturing a display device of FIG. 41.

In FIG. 42, a first substrate SUB1 may be provided on a first carrier substrate CG1. The first substrate SUB1 may include, but is not limited to, polyimide (PI). For example, the first carrier substrate CG1 may be, but is not limited to, a carrier glass. The first carrier substrate CG1 may support the first substrate SUB1 in the process of forming a display layer DPL and an encapsulation TFE on the first substrate SUB1.

A first barrier layer BR1 may be disposed on the first substrate SUB1. The first barrier layer BR1 may include an inorganic material that can prevent penetration of air or moisture. The first barrier layer BR1 may include a first contact hole CNT1 passing through the first barrier layer BR1 from an upper surface of the first barrier layer BR1. For example, the first contact hole CNT1 may pass through the first barrier layer BR1 from the upper surface of the first barrier layer BR1 to a lower surface of the first barrier layer BR1.

A first connection line CWL1 may be disposed on the first barrier layer BR1 and inserted into the first contact hole CNT1. For example, the first connection line CWL1 may be formed to fill the first contact hole CNT1 through an inkjet process, a cutting process, or a plating process.

Figure 43:
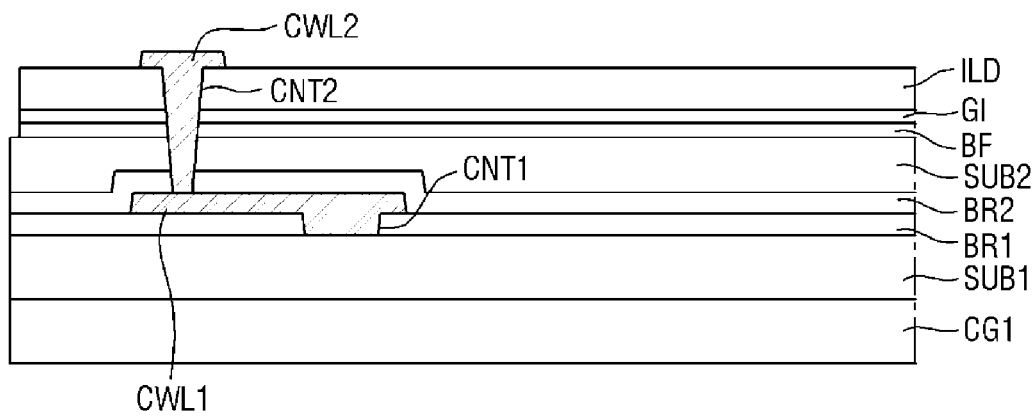

In FIG. 43, a second barrier layer BR2 may cover the first connection line CWL1 and the first barrier layer BR1. The second barrier layer BR2 may include an inorganic material that can prevent penetration of air or moisture. For example, the second barrier layer BR2 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

A second substrate SUB2 may be disposed on the second barrier layer BR2. The second substrate SUB2 may planarize the top of the second barrier layer BR2. The second substrate SUB2 may include, but is not limited to, polyimide (PI).

A buffer layer BF may be disposed on the planarized second substrate SUB2. A gate insulating layer GI and an interlayer insulating film ILD may be sequentially stacked on the buffer layer BF.

A second contact hole CNT2 may be formed to pass through the interlayer insulating film ILD, the gate insulating layer GI, the buffer layer BF, the second substrate SUB2, and the second barrier layer BR2.

A second connection line CWL2 may be disposed on the interlayer insulating film ILD and may be connected to the first connection line CWL1 disposed on the first barrier layer BR1 through the second contact hole CNT2. For example, the second connection line CWL2 may be formed on the same layer and of the same material as connection electrodes CNE of thin-film transistors TFT, but the present disclosure is not limited thereto.

For another example, the second connection line CWL2 may be formed on the same layer and of the same material as gate electrodes GE of the thin-film transistors TFT. When the second connection line CWL2 is disposed on the same layer as the gate electrodes GE, it may be disposed on the gate insulating layer GI.

Figure 44:
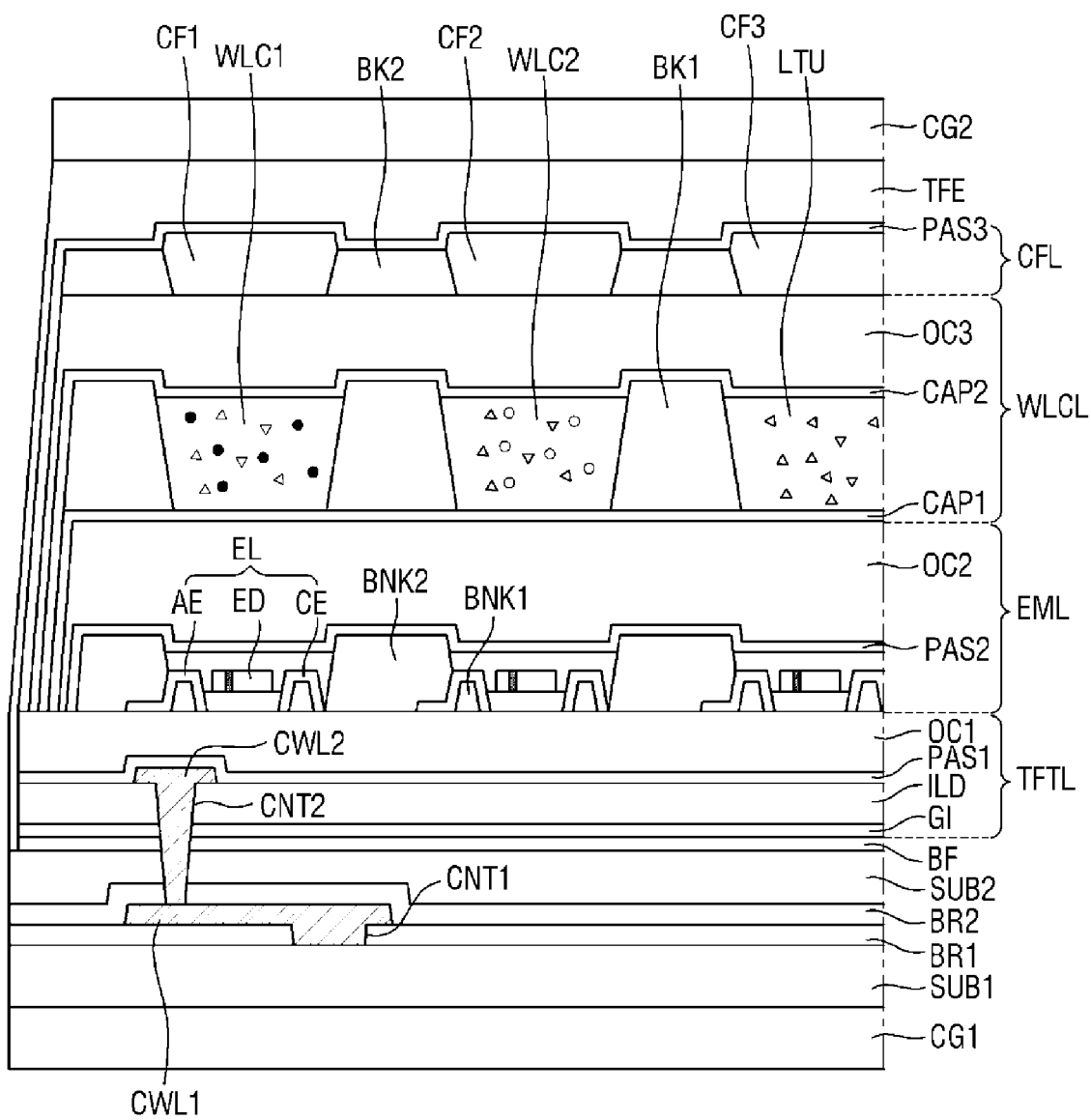

In FIG. 44, a first passivation layer PAS1 may cover the second connection line CWL2 and the interlayer insulating film ILD, and a first planarization layer OC1 may cover the first passivation layer PAS1.

A light emitting element layer EML, a wavelength conversion layer WLCL, a color filter layer CFL, and the encapsulation layer TFE may be sequentially stacked on a thin-film transistor layer TFTL.

A second carrier substrate CG2 may be disposed on the encapsulation layer TFE. For example, the second carrier substrate CG2 may be, but is not limited to, a carrier glass. The second carrier substrate CG2 may support the display device 10 in the process of forming a first pad part PD1 on a lower surface of the first substrate SUB1. After the second carrier substrate CG2 is disposed, the display device being manufactured may be inverted. Accordingly, the second carrier substrate CG2 may support the display device, and the first carrier substrate CG1 may be exposed. The first carrier substrate CG1 may be removed after the stacking of the display layer DPL and the encapsulation layer TFE is completed.

Figure 45:
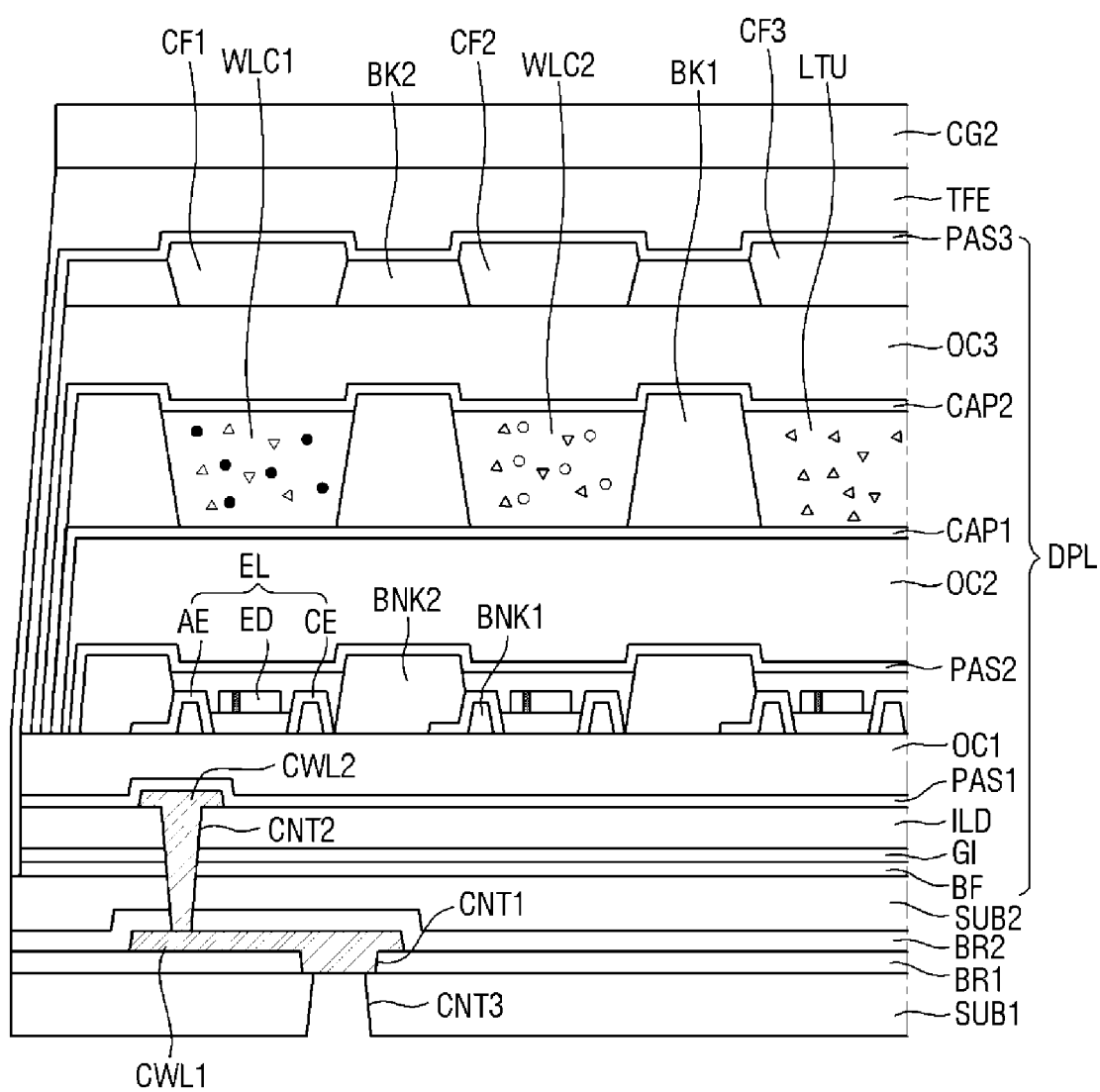

In FIG. 45, a third contact hole CNT3 may be formed to pass through the first substrate SUB1 from the lower surface of the first substrate SUB1. The first connection line CWL1 may be exposed by the third contact hole CNT3.

For example, the third contact hole CNT3 may be formed by removing a lower part of the first substrate SUB1 through a laser etching process, but the present disclosure is not limited thereto. In the display device 10, a plurality of third contact holes CNT3 respectively corresponding to a plurality of first pad parts PD1 may be precisely formed using the laser etching process.

For another example, the third contact hole CNT3 may be formed by removing the lower part of the first substrate SUB1 through a dry etching process. In the display device 10, the third contact hole CNT3 corresponding to at least some of a plurality of first pad parts PD1 may be formed using the dry etching process. The third contact hole CNT3 may be etched using a process gas and high-frequency power that meet etching characteristics of the first substrate SUB1. The third contact hole CNT3 may be etched by physical or chemical reaction of electrons or ions generated in a plasma state of the process gas with the first substrate SUB1.

For example, the area of the bottom of the first connection line CWL1 may be larger than the area of the top of the first pad part PD1. In this case, the first connection line CWL1 may function as an etching stopper in the process of forming the third contact hole CNT3, thus preventing the first substrate SUB1 or the first barrier layer BR1 from being excessively etched.

Figure 46:
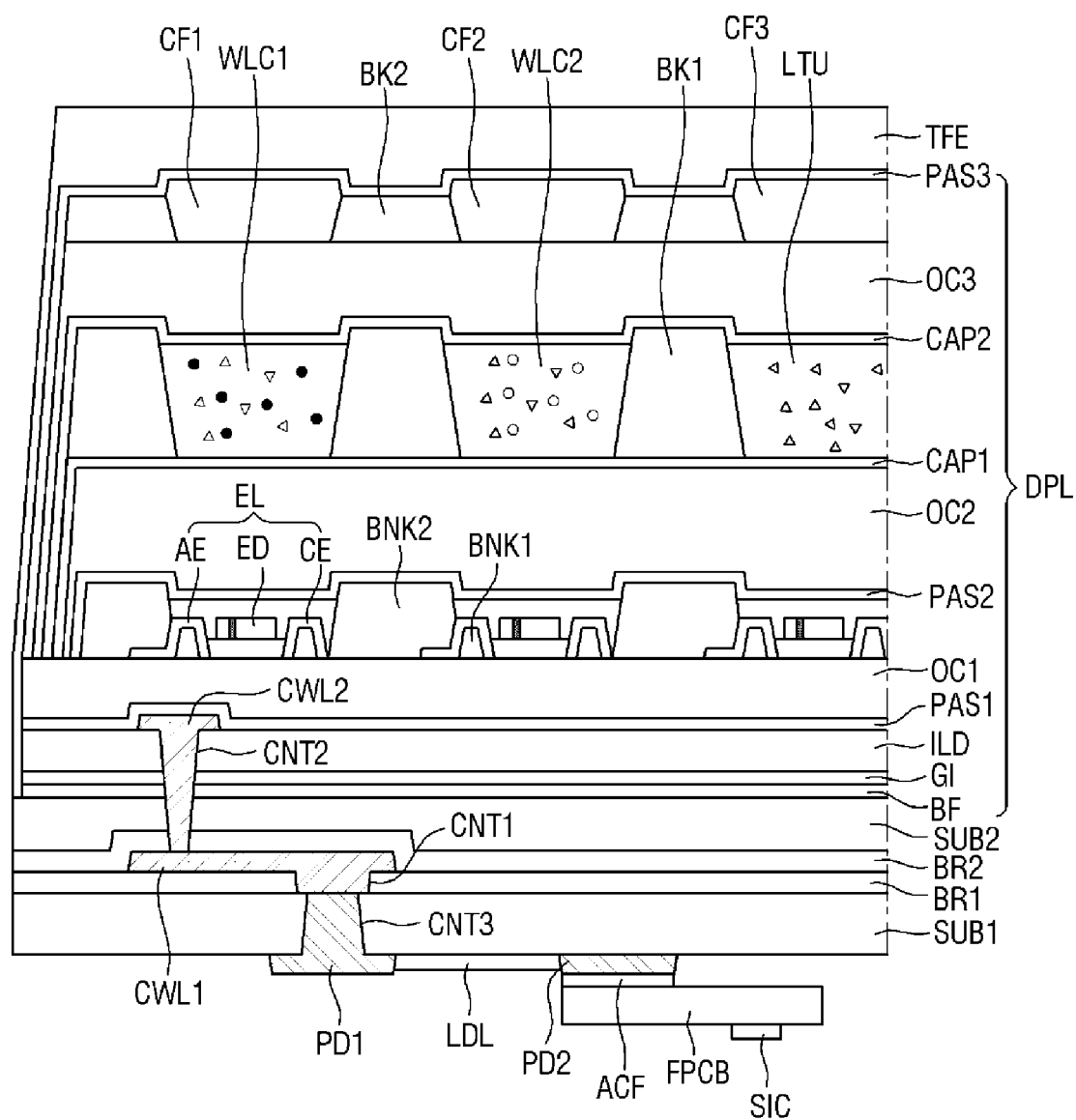

In FIG. 46, the first pad part PD1 may be disposed on the lower surface of the first substrate SUB1 and may be connected to the first connection line CWL1 exposed through the third contact hole CNT3.

A second pad part PD2 may be disposed on the lower surface of the first substrate SUB1 and spaced apart from the first pad part PD1. The second pad part PD2 may be connected to the first pad part PD1 through a lead line LDL. The second pad part PD2 may receive various voltages or signals from a flexible film FPCB and supply the voltages or signals to the first pad part PD1, the first connection line CWL1, and the second connection line CWL2.

A display device and a tiled display device including the same according to embodiments includes a substrate, a barrier layer disposed on the substrate, and a connection line disposed on the barrier layer and passing through a contact hole. Therefore, the barrier layer may serve as an insulating layer in the process of etching the substrate. Even if a contact hole provided in the substrate is wider than the contact hole of the barrier layer, the barrier layer can prevent damage to wirings and prevent an unnecessary short circuit between the wirings. Therefore, in the display device and the tiled display device including the same, a pad part provided on a lower surface of the substrate can be easily connected to the connection line.

In a display device and a tiled display device including the same according to embodiments, a connection line and a pad part are connected to each other on a lower surface of a substrate through a contact hole passing through the substrate, thereby minimizing the area of a non-display area of the display device. Therefore, the tiled display device can prevent a user from recognizing a non-display area or a boundary part between a plurality of display devices by minimizing a gap between the display devices.

However, the effects of the embodiments are not restricted to the one set forth herein. The above and other effects of the embodiments will become more apparent to one of daily skill in the art to which the embodiments pertain by referencing the claims.

What is claimed is:

1. A display device comprising:
   a first substrate, wherein a first contact hole is defined in the first substrate;
   a barrier layer disposed on the first substrate, wherein a second contact hole is defined in the barrier layer and is connected to the first contact hole;
   a first connection line disposed on the barrier layer and inserted into the second contact hole;
   a second substrate covering the first connection line and the barrier layer;
   a thin-film transistor layer disposed on the second substrate and including at least one thin-film transistor; and
   a pad part disposed on a lower surface of the first substrate and connected to the first connection line through the first contact hole,
   wherein the thin-film transistor layer further has a second connection line connected between the first connection line and the at least one thin-film transistor, and the first connection line extends in a layer between the barrier layer and the second substrate.

2. The display device of claim 1, wherein the thin-film transistor layer further includes:
   a gate insulating layer disposed on the second substrate; and
   an interlayer insulating film disposed on the gate insulating layer,
   wherein the second connection line is disposed on the interlayer insulating film and connected to the first connection line through a third contact hole passing through the interlayer insulating film, the gate insulating layer and the second substrate.

3. The display device of claim 1, wherein the first and second substrates include polyimide, and the barrier layer includes an inorganic material.

4. The display device of claim 1, further comprising:
   a flexible film disposed on the lower surface of the first substrate and connected to the pad part; and
   a source driver disposed on the flexible film and supplying a source voltage to the first connection line.

5. The display device of claim 1, wherein each of the first and second substrates includes a plurality of light emitting areas and a plurality of light blocking areas surrounding the light emitting areas,
   and further comprising:
   a light emitting element layer disposed on the thin-film transistor layer and including a light emitting element connected to the at least one thin-film transistor;
   a wavelength conversion layer disposed on the light emitting element layer and including wavelength converting parts corresponding to some of the light emitting areas and light transmitting parts corresponding to the other ones of the light emitting areas; and
   a color filter layer on the wavelength conversion layer and including a plurality of color filters corresponding to the light emitting areas, respectively.

6. A display device comprising:
   a barrier layer made of an inorganic material, wherein a first contact hole is defined in the barrier layer;

a first connection line disposed on the barrier layer and inserted into the first contact hole;
a substrate covering the first connection line and the barrier layer;
a thin-film transistor layer disposed on the substrate and including at least one thin-film transistor; and
a pad part disposed on a lower surface of the barrier layer and connected to the first connection line through the first contact hole,
wherein the thin-film transistor layer further includes a second connection line connected between the first connection line and the at least one thin-film transistor, and the first connection line extends in a layer between the barrier layer and the substrate.

7. The display device of claim 6, wherein the thin-film transistor layer further includes:
a gate insulating layer disposed on the substrate; and
an interlayer insulating film disposed on the gate insulating layer,
wherein the second connection line is disposed on the interlayer insulating film and connected to the first connection line through a second contact hole defined in the interlayer insulating film, the gate insulating layer, and the substrate.

8. A display device comprising:
a first substrate, wherein a first contact hole is defined in the first substrate;
a barrier layer disposed on one surface of the first substrate and through which the first contact hole passes;
a first connection line disposed on a surface of the barrier layer and connected to a pad part disposed on a lower surface of the first substrate opposite the one surface of the first substrate;
a second substrate covering the first connection line and the barrier layer; and
a thin-film transistor layer disposed on a surface of the second substrate and including at least one thin-film transistor,
wherein the pad part is connected to the first connection line through the first contact hole, and
wherein the thin-film transistor layer further includes a second connection line connected between the first connection line and the at least one thin-film transistor, and the first connection line extends in a layer between the barrier layer and the second substrate.

9. The display device of claim 8, wherein the thin-film transistor layer further includes:
a gate insulating layer disposed on the surface of the second substrate; and
an interlayer insulating film disposed on a surface of the gate insulating layer,
wherein the second connection line is disposed on a surface of the interlayer insulating film and connected to the first connection line through a second contact hole defined in the interlayer insulating film, the gate insulating layer, and the second substrate.

10. The display device of claim 8, wherein a third contact hole is defined in the first substrate and connected to the first contact hole, and
the pad part is connected to the first connection line through the third contact hole.

11. The display device of claim 8, wherein the first connection line is exposed on the one surface of the first substrate through the first contact hole and connected to the pad part.

12. A display device comprising:
a first substrate, wherein a first contact hole is defined in the first substrate;
a first barrier layer disposed on the first substrate, wherein a second contact hole is defined in the first barrier layer and connected to the first contact hole;
a first connection line disposed on the first barrier layer and inserted into the second contact hole;
a second barrier layer covering the first connection line and the first barrier layer;
a thin-film transistor layer disposed on the second barrier layer and comprising at least one thin-film transistor; and
a pad part disposed on a lower surface of the first substrate and connected to the first connection line through the first contact hole,
wherein the thin-film transistor layer further includes a second connection line connected between the first connection line and the at least one thin-film transistor, and the first connection line extends in a layer between the first barrier layer and the second barrier layer.

13. The display device of claim 12, wherein the thin-film transistor layer further includes:
a gate insulating layer on the second barrier layer; and
an interlayer insulating film on the gate insulating layer,
wherein the second connection line is disposed on the interlayer insulating film and connected to the first connection line through a third contact hole defined in the interlayer insulating film, the gate insulating layer, and the second barrier layer.

14. The display device of claim 12, wherein the first substrate includes polyimide, and the first and second barrier layers include an inorganic material.

15. The display device of claim 12, further comprising:
a flexible film disposed on the lower surface of the first substrate and connected to the pad part; and
a source driver disposed on the flexible film and supplying a source voltage to the first connection line.

16. A display device comprising:
a first barrier layer made of an inorganic material, wherein a first contact hole is defined in the first barrier layer;
a first connection line disposed on the first barrier layer and inserted into the first contact hole;
a second barrier layer covering the first connection line and the first barrier layer; and
a thin-film transistor layer disposed on the second barrier layer and comprising at least one thin-film transistor; and
a pad part disposed on a lower surface of the first barrier layer and connected to the first connection line through the first contact hole,
wherein the thin-film transistor layer further includes a second connection line connected between the first connection line and the at least one thin-film transistor, and the first connection line extends in a layer between the first barrier layer and the second barrier layer.

17. The display device of claim 16, wherein the thin-film transistor layer further includes:
a gate insulating layer disposed on the second barrier layer; and
an interlayer insulating film disposed on the gate insulating layer,
wherein the second connection line is disposed on the interlayer insulating film and connected to the first connection line through a second contact hole defined in the interlayer insulating film, the gate insulating layer, and the second barrier layer.

18. A display device comprising:
a first substrate, wherein a first contact hole is defined in the first substrate;
a first connection line disposed on the first substrate;
a barrier layer covering the first connection line and the first substrate;
a second substrate disposed on the barrier layer and planarizing the top of the barrier layer;
a thin-film transistor layer disposed on the second substrate and comprising at least one thin-film transistor; and
a pad part disposed on a lower surface of the first substrate and connected to the first connection line through the first contact hole,
wherein the thin-film transistor layer further includes a second connection line connected between the first connection line and the at least one thin-film transistor, and the first connection line extends in a layer between the first substrate and the barrier layer.

19. The display device of claim 18, wherein the thin-film transistor layer further includes:
a gate insulating layer disposed on the second substrate; and
an interlayer insulating film disposed on the gate insulating layer,
wherein the second connection line is disposed on the interlayer insulating film and connected to the first connection line through a second contact hole defined in the interlayer insulating film, the gate insulating layer, the second substrate, and the barrier layer.

20. The display device of claim 18, further comprising:
a flexible film disposed on the lower surface of the first substrate and connected to the pad part; and
a source driver disposed on the flexible film and supplying a source voltage to the first connection line.

21. A display device comprising:
a first substrate, wherein a first contact hole is defined in the first substrate;
a first barrier layer disposed on the first substrate and comprising a second contact hole connected to the first contact hole;
a first connection line disposed on the first barrier layer and inserted into the second contact hole;
a second barrier layer covering the first connection line and the first barrier layer;
a second substrate disposed on the second barrier layer and planarizing the top of the second barrier layer; and
a thin-film transistor layer disposed on the second substrate and comprising at least one thin-film transistor,
wherein the thin-film transistor layer further includes a second connection line connected between the first connection line and the at least one thin-film transistor.

22. The display device of claim 21, wherein the thin-film transistor layer further includes:
a gate insulating layer disposed on the second substrate; and
an interlayer insulating film disposed on the gate insulating layer,
wherein the second connection line is disposed on the interlayer insulating film and connected to the first connection line through a third contact hole defined in the interlayer insulating film, the gate insulating layer, the second substrate, and the second barrier layer.

23. The display device of claim 21, further comprising:
a pad part disposed on a lower surface of the first substrate and connected to the first connection line through the first contact hole;
a flexible film disposed on the lower surface of the first substrate and connected to the pad part; and
a source driver disposed on the flexible film and supplying a source voltage to the first connection line.

24. A tiled display device comprising:
a plurality of display devices, each including a display area having a plurality of pixels and a non-display area surrounding the display area; and
a coupling member coupling the display devices together,
wherein each of the display devices includes:
a first substrate wherein a first contact hole is defined in the first substrate;
a barrier layer disposed on the first substrate, wherein a second contact hole is defined in the barrier layer and connected to the first contact hole;
a first connection line disposed on the barrier layer and inserted into the second contact hole;
a second substrate covering the first connection line and the barrier layer;
a thin-film transistor layer disposed on the second substrate and including at least one thin-film transistor; and
a pad part disposed on a lower surface of the first substrate and connected to the first connection line through the first contact hole,
wherein the thin-film transistor layer further includes a second connection line connected between the first connection line and the at least one thin-film transistor, and the first connection line extends in a layer between the barrier layer and the second substrate.

* * * * *